US012679909B2

(12) United States Patent
Robb et al.

(10) Patent No.: US 12,679,909 B2
(45) Date of Patent: Jul. 14, 2026

(54) METHOD FOR MULTICOLOR LITHOGRAPHY USING MECHANICAL FORCE

(71) Applicant: California Institute of Technology, Pasadena, CA (US)

(72) Inventors: Maxwell J. Robb, Altadena, CA (US); Anna Overholts, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 615 days.

(21) Appl. No.: 18/193,586

(22) Filed: Mar. 30, 2023

(65) Prior Publication Data

US 2023/0312779 A1 Oct. 5, 2023

Related U.S. Application Data

(60) Provisional application No. 63/325,282, filed on Mar. 30, 2022.

(51) Int. Cl.
*C08F 293/00* (2006.01)
*C08F 20/36* (2006.01)
(Continued)

(52) U.S. Cl.
CPC ............ *C08F 20/36* (2013.01); *C08F 293/00* (2013.01); *C09D 133/14* (2013.01);
(Continued)

(58) Field of Classification Search
CPC ...... C08F 20/36; C08F 293/00; C09D 133/04; G03F 7/0002; G03F 7/0035; G03F 7/325
See application file for complete search history.

(56) References Cited

U.S. PATENT DOCUMENTS 11,584,752 B2 2/2023 Robb et al.
11,820,926 B1 * 11/2023 Stokes .................. C08G 18/69
(Continued)

FOREIGN PATENT DOCUMENTS

WO 2023192962 A1 10/2023

OTHER PUBLICATIONS

International Preliminary Report on Patentability received for International Application PCT/US2023/065174, Report issued Sep. 24, 2024, Mailed Oct. 10, 2024, 5 pgs.
(Continued)

*Primary Examiner* — Michael L Leonard
(74) *Attorney, Agent, or Firm* — KPPB LLP

(57) ABSTRACT

A macromolecular mechanophore platform that undergoes a mechanically gated chromogenic reaction in the presence of an extrinsic small molecule developing reagent is described, along with methods of synthesis and use thereof in different scenarios. The platform comprises a hetero-Diels Alder adduct embedded into a polymer, wherein the hetero-Diels Alder adduct masks an activated furan, and wherein the activated furan is released from the platform upon application of mechanical force, to react with the developing reagent comprising a secondary amine of choice to produce colored species with photoswitch capabilities. The platform can be used in solution or in solid state, and different colors can be obtained for the same platform, since the color of the generated product is determined by the choice of the developing reagent. Incorporating the platform into polymeric materials enables multicolor mechanical lithography by sequential application of mechanical force and different developing reagents.

24 Claims, 26 Drawing Sheets
(22 of 26 Drawing Sheet(s) Filed in Color)

(51) Int. Cl.
*C09D 133/14* (2006.01)
*G03F 7/00* (2006.01)
*G03F 7/32* (2006.01)

(52) U.S. Cl.
CPC .......... *G03F 7/0002* (2013.01); *G03F 7/0035* (2013.01); *G03F 7/325* (2013.01)

(56) References Cited

U.S. PATENT DOCUMENTS

2021/0070741 A1 3/2021 Robb et al.
2022/0073534 A1* 3/2022 Robb .................. C07D 307/42

OTHER PUBLICATIONS

International Search Report and Written Opinion received for International Application No. PCT/US2023/065174, Search completed Jul. 20, 2023, Mailed Jul. 20, 2023, 8 pgs.
Akbulatov et al., "Critical review of experimental polymer mechanochemistry and its interpretational frameworks", ChemPhysChen, vol. 18, No. 11, Jun. 2, 2017, pp. 1422-1450, doi: 10.1002/cphc.201601354.
Alouane et al., "Self-Immolative Spacers: Kinetic Aspects, Structure-Property Relationships, and Applications", Angewandte Chemie International Edition, vol. 54, No. 26, Jun. 22, 2015, first published Jun. 5, 2015, pp. 7492-7509, doi: 10.1002/anie.201500088.
Balamurugan et al., "A Visible Light Responsive On-Off Polymeric Photoswitch for the Colorimetric Detection of Nerve Agent Mimics in Solution and in the Vapor Phase", Macromolecules, vol. 49, No. 7, Mar. 23, 2016, pp. 2568-2574, doi: 10.1021/acs.macromol.6b00309.
Barber et al., "A modular approach to mechanically gated photoswitching with color-tunable molecular force probes", Chemical Science, vol. 12, No. 35, 2021, pp. 11703-11709, doi: 10.1039/D1SC02890A.
Berkowski et al., "Ultrasound-Induced Site-Specific Cleavage of Azo-Functionalized Poly(ethylene glycol)", Macromolecules, vol. 38, 2005, pp. 8975-8978, doi: 10.1021/ma051394n.
Beyer, "The mechanical strength of a covalent bond calculated by density functional theory", Journal of Chemical Physics, vol. 112, No. 17, May 1, 2002, pp. 7307-7312, doi: 10.1063/1.481330.
Beyer et al., "Mechanochemistry: The Mechanical Activation of Covalent Bonds", Chemical Reviews, vol. 105, No. 8, Jul. 19, 2005, pp. 2921-2948, doi: 10.1021/cr030697h.
Boutelle et al., "Substituent Effects on the Reversibility of Furan-Maleimide Cycloadditions", The Journal of Organic Chemistry, vol. 76, No. 19, Aug. 26, 2011, pp. 7994-8002, doi: 10.1021/jo201606z.
Caruso et al., "Mechanically-Induced Chemical Changes in Polymeric Materials", Chemical Reviews, vol. 109, No. 11, Oct. 14, 2009, pp. 5755-5798, doi: 10.1021/cr9001353.
Chen et al., "Light- and Chemical-Stimuli-Induced Isomerization of Donor-Acceptor Stenhouse Adducts", ChemPhotoChem, vol. 5, No. 6, 2021, pp. 559-564, doi: 10.1002/cptc.202100004.
Chen et al., "Mechanically induced chemiluminescene from polymers incorporating a 1,2 dioxetane unit in the main chain", Nature Chemistry, vol. 4, Jul. 2012, pp. 559-562, doi: 10.1038/NCHEM.1358.
Chen et al., "Mechanochemical tools for polymer materials", Chemical Society Reviews, vol. 50, No. 6, 2021, pp. 4100-4140, doi: 10.1039/D0CS00940G.
Chen et al., "Mechanochemical unzipping of insulating polyladderene to semiconducting polyacetylene", Science, vol. 357, No. 6350, Aug. 4, 2017, pp. 475-479, doi: 10.1126/science.aan2797.
Chen et al., "Stable Activated Furan and Donor-Acceptor Stenhouse Adduct Polymer Conjugates as Chemical and Thermal Sensors", Macromolecules, vol. 52, No. 11, May 23, 2019, pp. 4370-4375, doi: 10.1021/acs.macromol.9b00533.
Clerc et al., "Donor-Acceptor Stenhouse Adduct-Polydimethylsiloxane-Conjugates for Enhanced Photoswitching in Bulk Polymers", Macromolecular Rapid Communications, vol. 43, No. 15, Article 2200120, Aug. 2022, 13 pgs., doi: 10.1002/marc.202200120.
Clerc et al., "Promoting the Furan Ring-Opening Reaction to Access New Donor-Acceptor Stenhouse Adducts with Hexafluoroisopropanol", Angewandte Chemie International Edition, vol. 60, No. 18, Apr. 26, 2021, pp. 10219-10227, doi: 10.1002/anie.202100115.
Cohen et al., "Excited State Proton-Transfer Reactions of Coumarin 4 in Protic Solvents", The Journal of Physical Chemistry A, vol. 105, No. 30, Jul. 7, 2001, pp. 7157-7164, doi: 10.1021/jp010576q.
Davis et al., "Force-induced activation of covalent bonds in mechanoresponsive polymeric materials", Nature, vol. 459, No. 7243, May 7, 2009, pp. 68-72, doi: 10.1038/nature07970.
Deng et al., "A Novel Way To Synthesize Star Polymers in One Pot by ATRP of N-[2-(2-Bromoisobutyryloxy)ethyl]maleimide and Styrene", Macromolecules, vol. 37, No. 1, Dec. 13, 2003, pp. 18-26, doi: 10.1021/ma034542n.
Di Giannantonio et al., "Triggered Metal Ion Release and Oxidation: Ferrocene as a Mechanophore in Polymers", Angewandte Chemie International Edition English, vol. 57, No. 35, Aug. 27, 2018, pp. 11445-11450, doi: 10.1002/anie.201803524.
Diaz et al., "Versatile and Highly Selective Colorimetric Sensor for the Detection of Amines", Chemistry—A European Journal, vol. 23, No. 15, Mar. 13, 2017, pp. 3562-3566, doi: 10.1002/chem.201700368.
Diesendruck et al., "Mechanically triggered heterolytic unzipping of a low-ceiling-temperature polymer", Nature Chemistry, vol. 6, Jul. 2014, pp. 623-628, doi: 10.1038/nchem.1938.
Diesendruck et al., "Proton-Coupled Mechanochemical Transduction: A Mechanogenerated Acid", Journal of the American Chemical Society, vol. 134, Jul. 9, 2012, pp. 12446-12449, doi: 10.1021/ja305645x.
Duan et al., "An Investigation of the Selective Chain Scission at Centered Diels-Alder Mechanophore under Ultrasonication", Macromolecules, vol. 50, No. 4, Feb. 9, 2017, pp. 1353-1361, doi: 10.1021/acs.macromol.6b0237.
Esser-Kahn et al., "Triggered Release from Polymer Capsules", Macromolecules, vol. 44, No. 14, Jul. 6, 2011, pp. 5539-5553, doi: 10.1021/ma201014n.
Fan et al., "Thermo-responsive self-immolative nanoassemblies: direct and indirect triggering", Chemical Communications, vol. 53, No. 89, Oct. 6, 2017, pp. 12068-12071, doi: 10.1039/C7CC06410A.
Foster et al., "Irreversible endo-Selective Diels-Alder Reactions of Substituted Alkoxyfurans: A General Synthesis of endo-Cantharimides", Chemistry—A European Journal, vol. 21, No. 16, Apr. 13, 2015, pp. 6107-6114, doi: 10.1002/chem.201406286.
Ghanem et al., "The role of polymer mechanochemistry in responsive materials and additive manufacturing", Nature Reviews Materials, vol. 6, Jan. 2021, pp. 84-98, doi: 10.1038/s41578-020-00249-w.
Gossweiler et al., "Mechanochemical Activation of Covalent Bonds in Polymers with Full and Repeatable Macroscopic Shape Recovery", ACS Macro Letters, vol. 3, No. 3, Feb. 12, 2014, pp. 216-219, doi: 10.1021/mz500031q.
Gostl et al., "Controlling Covalent Connection and Disconnection with Light", Angewandte Chemie International Edition, vol. 53, No. 33, Aug. 11, 2014, pp. 8784-8787, doi: 10.1002/anie.201310626.
Gostl et al., "π-extended anthracenes as sensitive probes for mechanical stress", Chemical Science, vol. 7, No. 1, 2016, pp. 370-375, doi: 10.1039/c5sc03297k.
Grady et al., "Shockwave Loading of Mechanochemically Active Polymer Coatings", ACS Applied Materials & Interfaces, vol. 6, No. 8, Apr. 23, 2014, pp. 5350-5355, doi: 10.1021/am406028q.
Groote et al., "Mechanocatalysis: forcing latent catalysts into action", Polymer Chemistry, vol. 4, No. 18, 2013, pp. 4846-4859, doi: 10.1039/C3PY00071K.
Hay et al., "Substituent effects on the kinetics of reductively-initiated fragmentation of nitrobenzyl carbamates designed as triggers for bioreductive prodrugs", Journal of the Chemical Society Perkin Transactions, vol. 119, No. 19, Jan. 1999, pp. 2759-2770, doi: 10.1039/a904067f.
Helmy et al., "Design and Synthesis of Donor-Acceptor Stenhouse Adducts: A Visible Light Photoswitch Derived from Furfural", The

(56) References Cited

OTHER PUBLICATIONS

Journal of Organic Chemistry, vol. 79, No. 23, Nov. 12, 2014, pp. 11316-11329, doi: 10.1021/jo502206g.
Helmy et al., "Photoswitching Using Visible Light: A New Class of Organic Photochromic Molecules", Journal of the American Chemical, vol. 136, No. 23, May 21, 2014, pp. 8169-8172, doi: 10.1021/ja503016b.
Hemmer et al., "Controlling Dark Equilibria and Enhancing Donor-Acceptor Stenhouse Adduct Photoswitching Properties through Carbon Acid Design", Journal of the American Chemical, vol. 140, No. 33, Aug. 3, 2018, pp. 10425-10429, doi: 10.1021/jacs.8b06067.
Hemmer et al., "Tunable Visible and Near Infrared Photoswitches", Journal of the American Chemical, vol. 138, No. 42, Oct. 4, 2016, pp. 13960-13966, doi: 10.1021/jacs.6b07434.
Heo et al., "Self-Healing Polyurethanes with Shape Recovery", Advanced Function Materials, vol. 24, No. 33, Sep. 3, 2014, pp. 5261-5268, doi: 10.1002/adfm.201400299.
Hickenboth et al., "Biasing reaction pathways with mechanical force", Nature, vol. 446, No. 7134, Mar. 22, 2007, pp. 423-427, doi: 10.1038/nature05681.
Hu et al., "Mechanically Triggered Release of Functionally Diverse Molecular Payloads from Masked 2-Furylcarbinol Derivatives", ACS Central Science, vol. 7, 2021, pp. 1216-1224, doi: 10.1021/acscentsci.1c00460.
Hu et al., "Mechanically Triggered Small Molecule Release from a Masked Furfuryl Carbonate", Journal of the American Chemical Society, vol. 141, Sep. 13, 2019, pp. 15018-15023, doi: 10.1021/jacs.9b08663.
Hu et al., "Mechanochemical Regulation of a Photochemical Reaction", Journal of the American Chemical Society, vol. 140, No. 43, Oct. 31, 2018, pp. 14073-14077, doi: 10.1021/jacs.8b09628.
Huo et al., "Mechanochemical bond scission for the activation of drugs", Nature Chemistry, vol. 13, Feb. 2021, pp. 131-139, doi: 10.1038/s41557-020-00624-8.
Imato et al., "Mechanophores with a Reversible Radical System and Freezing-Induced Mechanochemistry in Polymer Solutions and Gels", Angewandte Chemie International Edition, vol. 54, No. 21, May 18, 2015, pp. 6168-6172, doi: 10.1002/anie.201412413.
Irie et al., "Blocked Photochromism of Diarylethenes", Journal of the American Chemical Society, vol. 114, No. 22, Oct. 1, 1992, pp. 8715-8716, doi: 10.1021/ja00048a063.
Irie et al., "Photochromism of Diarylethene Molecules and Crystals: Memories, Switches, and Actuators", Chemical Reviews, vol. 114, No. 24, Dec. 16, 2014, pp. 12174-12277, doi: 10.1021/cr500249p.
Jayathilaka et al., "Force-mediated molecule release from double network hydrogels", Chemical Communications, vol. 57, No. 68, Sep. 4, 2021, pp. 8484-8487, doi: 10.1039/d1cc02726c.
Kawai et al., "Photochemical pKa-Modulation and Gated Photochromic Properties of a Novel Diarylethene Switch", European Journal of Organic Chemistry, vol. 1999, No. 9, Sep. 1999, pp. 2359-2366, doi: 10.1002/(SICI)1099-0690(Sep. 1999)1999:9<2359::AID-EJOC2359>3.0.CO;2-%23.
Kean et al., "A coumarin dimer probe of mechanochemical scission efficiency in the sonochemical activation of chain-centered mechanophore polymers", Chemical Communications, vol. 51, No. 44, Apr. 29, 2015, pp. 9157-9160, doi: 10.1039/C5CC01836F.
Kida et al., "The photoregulation of a mechanochemical polymer scission", Nature Communications, vol. 9, Article 3504, 2018, 6 pgs., doi: 10.1038/s41467-018-05996-7.
Kim et al., "Mechanical Reactivity of Two Different Spiropyran Mechanophores in Polydimethylsiloxane", Macromolecules, vol. 51, No. 22, Nov. 8, 2018, pp. 9177-9183, doi: 10.1021/acs.macromol.8b01919.
Kim et al., "High-intensity focused ultrasound-induced mechanochemical transduction in synthetic elastomers", Proceedings of the National Academy of Sciences, vol. 116, 2019, pp. 10214-10222, doi: 10.1073/pnas.1901047116.
Kingsbury et al., "Shear activation of mechanophore-crosslinked polymers", Journal of Materials Chemistry, vol. 21, No. 23, 2011, pp. 8381-8388, doi: 10.1039/C0JM04015K.
Klein et al., "Validation of the CoGEF Method as a Predictive Tool for Polymer Mechanochemistry", Journal of the American Chemical Society, vol. 142, No. 38, Sep. 9, 2020, pp. 16364-16381, doi: 10.1021/jacs.0c06868.
Kobatake et al., "Acid-induced photochromic system switching of diarylethene derivatives between P- and T-types", Chemical Communications, Feb. 2007, pp. 1698-1700, doi: 10.1039/b700177k.
Konda et al., "Molecular Catch Bonds and the Anti-Hammond Effect in Polymer Mechanochemistry", Journal of the American Chemical Society, vol. 135, No. 34, Aug. 2, 2013, pp. 12722-12729, doi: 10.1021/ja4051108.
Kryger et al., "Structure-Mechanochemical Activity Relationships for Cyclobutane Mechanophores", Journal of the American Chemical Society, vol. 133, No. 46, Oct. 27, 2011, pp. 18992-18998, doi: 10.1021/ja2086728.
Kuhni et al., "Gated Photochromism of 1,2-Diarylethenes", Organic Letters, vol. 9, No. 10, Apr. 21, 2007, pp. 1919-1922, doi: 10.1021/ol070339r.
Larsen et al., "Flex-Activated" Mechanophores: Using Polymer Mechanochemistry To Direct Bond Bending Activation, Journal of the American Chemical Society, vol. 135, No. 22, May 20, 2013, pp. 8189-8192, doi: 10.1021/ja403757p.
Larsen et al., "Successive Mechanochemical Activation and Small Molecule Release in an Elastomeric Material", Journal of the American Chemical Society, vol. 136, No. 4, Jan. 13, 2014, pp. 1276-1279, doi: 10.1021/ja411891x.
Lee et al., "Controlled Drug Delivery from Polymers by Mechanical Signals", Advanced Materials, vol. 13, No. 11, Jun. 5, 2001, pp. 837-839, doi: 10.1002/1521-4095(Jun. 2001)13:11<837::AID-ADMA837>3.0.CO;2-D.
Lee et al., "Tunable Photothermal Actuation Enabled by Photoswitching of Donor-Acceptor Stenhouse Adducts", ACS Applied Materials & Interfaces, vol. 12, No. 48, Nov. 19, 2020, pp. 54075-54082, doi: 10.1021/acsami.0c15116.
Lemieux et al., "Reactivity-Gated Photochromism of 1,2-Dithienylethenes for Potential Use in Dosimetry Applications", Organic Letters, vol. 7, No. 14, Jun. 14, 2005, pp. 2969-2972, doi: 10.1021/ol050971p.
Lemieux et al., "Selective and Sequential Photorelease Using Molecular Switches", Angewandte Chemie International Edition, vol. 45, No. 41, Oct. 20, 2006, pp. 6820-6824, doi: 10.1002/anie.200601584.
Lerch et al., "The (photo)chemistry of Stenhouse photoswitches: guiding principles and system design", Chemical Society Reviews, vol. 47, No. 6, Mar. 21, 2018, pp. 1910-1937, doi: 10.1039/c7cs00772h.
Li et al., "Mechanophore Activation at Heterointerfaces", Journal of the American Chemical Society, vol. 136, No. 45, Oct. 31, 2014, pp. 15925-15928, doi: 10.1021/ja509949d.
Li et al., "Polymer Mechanochemistry: From Destructive to Productive", Accounts of Chemical Research, vol. 48, No. 8, Jul. 15, 2015, pp. 2181-2190, doi: 10.1021/acs.accounts.5b00184.
Lin et al., "A Latent Mechanoacid for Time-Stamped Mechanochromism and Chemical Signaling in Polymeric Materials", Journal of the American Chemical Society, vol. 142, No. 1, Dec. 25, 2019, pp. 99-103, doi: 10.1021/jacs.9b12861.
Lin et al., "Regiochemical Effects on Mechanophore Activation in Bulk Materials", Journal of the American Chemical, vol. 140, No. 46, Nov. 7, 2018, pp. 15969-15975, doi: 10.1021/jacs.8b10376.
Lui et al., "Unusual concentration dependence of the photoisomerization reaction in donor-acceptor Stenhouse adducts", Photochemical & Photobiological Sciences, vol. 18, No. 6, 2019, pp. 1587-1595, doi: 10.1039/C9PP00130A.
May et al., "Is Molecular Weight or Degree of Polymerization a Better Descriptor of Ultrasound-Induced Mechanochemical Transduction?", ACS Macro Letters, vol. 5, No. 2, Jan. 17, 2016, pp. 177-180, doi: 10.1021/acsmacrolett.5b00855.
Mcfadden et al., "Force-Dependent Multicolor Mechanochromism from a Single Mechanophore", Journal of the American Chemical Society, vol. 141, No. 29, Jul. 8, 2019, pp. 11388-11392, doi: 10.1021/jacs.9b05280.

(56) References Cited

OTHER PUBLICATIONS

Mei et al., "Mechanochemical Lithography", Journal of the American Chemical, vol. 144, No. 22, May 30, 2022, pp. 9949-9958, doi: 10.1021/jacs.2c02883.
Michael et al., "A Mechanochemically Triggered "Click" Catalyst", Angewandte Chemie International Edition, vol. 54, No. 47, Nov. 16, 2015, pp. 13918-13922, doi: 10.1002/anie.201505678.
Mosey et al., "Versatile approach to α-alkoxy carbamate synthesis and stimulus-responsive alcohol release", Organic & Molecular Chemistry, vol. 10, No. 39, Aug. 2012, pp. 7980-7985, doi: 10.1039/c2ob26571k.
Muller, "Practical suggestions for better crystal structures", Crystallography Reviews, vol. 15, No. 1, Jan.-Mar. 2009, pp. 57-83, doi: 10.1080/08893110802547240.
Nguyen et al., "Surface-Dependent Kinetics of Cu(0)-Wire-Catalyzed Single-Electron Transfer Living Radical Polymerization of Methyl Acrylate in DMSO at 25° C.", Macromolecules, vol. 42, No. 7, Mar. 17, 2009, pp. 2379-2386, doi: 10.1021/ma8028562.
Nichol et al., "Multi-stimuli responsive trigger for temporally controlled depolymerization of self-immolative polymers", Polymer Chemistry, vol. 10, No. 36, Sep. 2019, pp. 4914-4919, doi: 10.1039/C9PY00301K.
Ohsumi et al., "Chemical control of the photochromic reactivity of diarylethene derivatives", Chemical Communications, Jul. 2005, pp. 3921-3923, doi: 10.1039/n506801k.
Overholts et al., "Mechanically Gated Formation of Donor-Acceptor Stenhouse Adducts Enabling Mechanochemical Multicolor Soft Lithography", Nature Chemistry, vol. 15, No. 3, Jan. 23, 2023, pp. 332-338, doi: 10.1038/s41557-022-01126-5.
Palasz et al., "Knoevenagel condensation of cyclic ketones with benzoylacetonitrile and N, N'-dimethylbarbituric acid. Application of sterically hindered condensation products in the synthesis of spiro and dispiropyrans by hetero-Diels—Alder reactions", Tetrahedron, vol. 67, No. 7, Feb. 18, 2021, pp. 1422-1431, doi: 10.1016/j.tet.2010.12.053.
Patrick et al., "Polymers with autonomous life-cycle control", Nature, vol. 540, Dec. 15, 2016, pp. 363-370, doi: 10.1038/nature21002.
Peterson et al., "1,2-oxazine linker as a thermal trigger for self-immolative polymers", Polymer, vol. 55, No. 23, Nov. 5, 2014, pp. 5980-5985, doi: 10.1016/j.polymer.2014.09.048.
Peterson et al., "3D-Printed Mechanochromic Materials", ACS Applied Materials and Interfaces, vol. 7, No. 1, Dec. 5, 2014, pp. 577-583, doi: 10.1021/am506745m.
Peterson et al., "Kinetic Analysis of Mechanochemical Chain Scission of Linear Poly(phthalaldehyde)", Macromolecular Rapid Communications, vol. 35, No. 18, Sep. 2014, pp. 1611-1614, doi: 10.1002/marc.201400271.
Piermattei et al., "Activating catalysts with mechanical force", Nature Chemistry, vol. 1, No. 2, May 2009, pp. 133-137, doi: 10.1038/nchem.167.
Poelma et al., "Controlled Drug Release to Cancer Cells from Modular One Photon Visible Light-Responsive Micellar System", Chemical Communications, vol. 52, No. 69, 2016, pp. 10525-10528, doi: 10.1039/C6CC04127B.
Ramirez et al., "Mechanochemical strengthening of a synthetic polymer in response to typically destructive shear forces", Nature Chemistry, vol. 5, Sep. 2013, pp. 757-761, doi: 10.1038/NCHEM.1720.
Robb et al., "A Retro-Staudinger Cycloaddition: Mechanochemical Cycloelimination of a β-Lactam Mechanophore", Journal of the American Chemical Society, vol. 137, No. 34, Sep. 2, 2015, pp. 10946-10949, doi: 10.1021/jacs.5b07345.
Robb et al., "Regioisomer-Specific Mechanochromism of Naphthopyran in Polymeric Materials", Journal of the American Chemical Society, vol. 138, No. 38, Sep. 12, 2016, pp. 12328-12331, doi: 10.1021/jacs.6b07610.
Ronn et al., "An Expedient Route to 3-Methoxy-2-furaldehyde", Synlett, vol. 23, No. 1, 2012, pp. 134-136, doi: 10.1055/s-0031-1290103.
Roth et al., "Dendritic, Oligomeric, and Polymeric Self-Immolative Molecular Amplification", Chemical Reviews, vol. 116, No. 3, Sep. 10, 2015, pp. 1309-1352, doi: 10.1021/acs.chemrev.5b00372.
Schmid et al., "A Self-Immolative Spacer That Enables Tunable Controlled Release of Phenols under Neutral Conditions", The Journal of Organic Chemistry, vol. 77, No. 9, Apr. 11, 2012, pp. 4363-4374, doi: 10.1021/jo300400q.
Sha et al., "Quantitative and Mechanistic Mechanochemistry in Ferrocene Dissociation", ACS Macro Letters, vol. 7, No. 10, Sep. 14, 2018, pp. 1174-1179, doi: 10.1021/acsmacrolett.8b00625.
Sheldrick, "Phase Annealing in SHELX-90: Direct Methods for Larger Structures", Acta Crystallographica, vol. A46, 1990, pp. 467-473, doi: 10.1107/S0108767390000277.
Sheldrick, "SHELXT—Integrated space-group and crystal structure determination", Acta Crystallographica, vol. A71, No. 1, Jan. 2015, pp. 3-8, doi: 10.1107/S2053273314026370.
Shi et al., "Mechanochemical activation of disulfide-based multifunctional polymers for theranostic drug release", Chemical Science, vol. 12, No. 5, 2021, pp. 1668-1674, doi: 10.1039/d0sc06054b.
Shi et al., "The Mechanochemical Release of Naphthalimide Fluorophores from β-Carbonate and β-Carbamate Disulfide-Centered Polymers", CCS Chemistry, vol. 3, No. 11, Aug. 13, 2021, pp. 2333-2344, doi: 10.31635/ccschem.021.202101147.
Shi et al., "Toward Drug Release Using Polymer Mechanochemical Disulfide Scission", The Journal of the American Chemical Society, vol. 142, No. 34, Aug. 17, 2020, pp. 14725-14732, doi: 10.1021/jacs.0c07077.
Sroda et al., "Donor-acceptor Stenhouse adducts: Exploring the effects of ionic character", Chemistry—A European Journal, vol. 27, No. 12, 2020, pp. 4183-4190, doi: 10.1002/chem.202005110.
Stevenson et al., "Controlling Reactivity by Geometry in Retro-Diels—Alder Reactions under Tension", Journal of the American Chemical Society, vol. 139, No. 46, Oct. 31, 2017, pp. 16768-16771, doi: 10.1021/jacs.7b08895.
Sulkanen et al., "Spatially Selective and Density-Controlled Activation of Interfacial Mechanophores", Journal of the American Chemical Society, vol. 141, No. 9, Feb. 12, 2019, pp. 4080-4085, doi: 10.1021/jacs.8b10257.
Sung et al., "Interfacial Mechanophore Activation Using Laser-Induced Stress Waves", Journal of the American Chemical Society, vol. 140, No. 15, Mar. 29, 2018, pp. 5000-5003, doi: 10.1021/jacs.8b01427.
Swager, "Sensor Technologies Empowered by Materials and Molecular Innovations", Agnewandte Chemie International Edition, vol. 57, No. 16, Apr. 9, 2018, pp. 4248-4257, doi: 10.1002/anie.201711611.
Toohey et al., "Self-healing materials with microvascular networks", Nature Materials, vol. 6, Aug. 2007, pp. 581-585, doi: 10.1038/nmat1934.
Versaw et al., "Designing naphthopyran mechanophores with tunable mechanochromic behavior", Chemical Science, vol. 11, No. 17, 2020, pp. 4525-4530, doi: 10.1039/D0SC01359E.
Versaw et al., "Harnessing the Power of Force: Development of Mechanophores for Molecular Release", Journal of the American Chemical, vol. 143, 2021, pp. 21461-21473, doi: 10.1021/jacs.1c11868.
Wang et al., "A Novel Mechanochromic and Photochromic Polymer Film: When Rhodamine Joins Polyurethane", Advanced Materials, vol. 27, No. 41, Nov. 4, 2015, pp. 6469-6474, doi: 10.1002/adma.201503424.
Wang et al., "Mechanical gating of a mechanochemical reaction cascade", Nature Communications, vol. 7, Article 13433, Nov. 16, 2016, 8 pgs., doi: 10.1038/ncomms13433.
Wang et al., "Mechanochemical Strengthening of a Multi-mechanophore Benzocyclobutene Polymer", ACS Macro Letters, vol. 4, No. 8, Jul. 20, 2015, pp. 834-837, doi: 10.1021/acsmacrolett.5b00440.
Wang et al., "Single-Molecule Observation of a Mechanically Activated Cis-to-Trans Cyclopropane Isomerization", Journal of the American Chemical Society, vol. 138, No. 33, Aug. 8, 2016, pp. 10410-10412, doi: 10.1021/jacs.6b0645.

(56) References Cited

OTHER PUBLICATIONS

Warford et al., "From Slow to Fast—the User Controls the Rate of the Release of Molecules From Masked Forms Using a Photoswitch and Different Types of Light", Chemical Communications, vol. 51, No. 32, Mar. 2015, pp. 7039-7042, doi: 10.1039/C5CC00218D.

White et al., "Autonomic healing of polymer composites", Nature, vol. 409, No. 6822, Feb. 15, 2001, pp. 794-797, doi: 10.1038/35057232.

Wollenhaupt et al., "Should the Woodward-Hoffmann Rules be Applied to Mechanochemical Reactions?", ChemPhysChem, vol. 16, No. 8, Jun. 8, 2015, pp. 1593-1597, doi: 10.1002/cphc.201500362.

Wu et al., "Molecular Stress Relief through a Force-Induced Irreversible Extension in Polymer Contour Length", Journal of the American Chemical Society, vol. 132, No. 45, Oct. 26, 2010, pp. 15936-15938, doi: 10.1021/ja108429h.

Xia et al., "Soft Lithography", Angewandte Chemie International Edition, vol. 37, No. 5, Mar. 16, 1998, pp. 550-575, doi: 10.1002/(SICI)1521-3773(Mar. 16, 1998)37:5<550::AID-ANIE550>3.0.CO;2-G.

Yang et al., "Benzoladderene Mechanophores: Synthesis, Polymerization, and Mechanochemical Transformation", Journal of the American Chemical Society, vol. 141, No. 16, Apr. 10, 2019, pp. 6479-6483, doi: 10.1021/jacs.9b01736.

Yokoyama et al., "Photochromism of a Protonated 5-Dimethylaminoindolylfulgide: a Model of a Non-destructive Readout for a Photon Mode Optical Memory", Journal of Chemical Society Chemical Communications, 1991, pp. 1722-1724, doi: 10.1039/C39910001722.

Zanetti et al., "α-Furfuryl Bromide (2-Bromomethylfuran)", Journal of the American Chemical Society, vol. 61, No. 8, Aug. 1, 1939, pp. 2249-2251, doi: 10.1021/ja01877a506.

Zhang et al., "Mechanical Force-Triggered Drug Delivery", Chemical Reviews, vol. 116, No. 19, Sep. 29, 2016, pp. 12536-12563, doi: 10.1021/acs.chemrev.6b00369.

Zhang et al., "Mechanical Susceptibility of a Rotaxane", Journal of the American Chemical Society, vol. 141, No. 40, Sep. 6, 2019, pp. 15879-15883, doi: 10.1021/jacs.9b06960.

Zhang et al., "Mechanochromism and Mechanical-Force-Triggered Cross-Linking from a Single Reactive Moiety Incorporated into Polymer Chains", Angewandte Chemie International Edition, vol. 55, No. 9, Jan. 25, 2016, pp. 3040-3044, doi: 10.1002/anie.201510171.

* cited by examiner

Ref-1

DASA-1

DASA-2

DASA-3

(±)-5a R =

(±)-5b R =

FIG. 9
Stamp
(Force)
Amine 1
1.
2. Amine 2
1.
2. Amine 3

FIG. 14
5 mm
Wetted with HFIP
Dried
0 h
2 h
5 h
8 h
20 h
Wetted with HFIP
Dried

METHOD FOR MULTICOLOR LITHOGRAPHY USING MECHANICAL FORCE

CROSS-REFERENCE TO RELATED APPLICATIONS

The present application claims priority under 35 U.S.C. 119(e) to U.S. Provisional Application No. 63/325,282, filed Mar. 30, 2022, the disclosure of which is incorporated herein by reference in its entirety.

FIELD OF THE INVENTION

The current disclosure is directed to a macromolecular mechanophore platform with a multi-color chromogenic response following a mechanical force actuation and application of a developing agent of choice, and methods for the synthesis and use thereof.

BACKGROUND OF THE INVENTION

Stress-sensitive molecules called mechanophores are designed to undergo productive chemical transformations in response to mechanical force and can be useful for sensing and patterning. Furthermore, rationally and covalently incorporating mechanophores into polymer chains or networks allows for applied mechanical force to be selectively transduced to the mechanophores' weak bonds to elicit a productive chemical transformation, as explained in, for example, Li, J., et al. Polymer Mechanochemistry: From Destructive to Productive. *Acc. Chem. Res.* 48, 2181-2190 (2015), the disclosure of which is incorporated herein by reference). More specifically, application of mechanical force to typical macromolecular materials leads to their degradation by rupturing covalent bonds in the backbones of the polymers. As such, covalent polymer mechanochemistry has enabled many exciting opportunities for the design of force-responsive polymeric materials (see, for examples: Caruso, M. M. et al. Mechanically-Induced Chemical Changes in Polymeric Materials. *Chem. Rev.* 109, 5755-5798 (2009); and Beyer, M. K. & Clausen-Schaumann, H. Mechanochemistry: The Mechanical Activation of Covalent Bonds. *Chem. Rev.* 105, 2921-2948 (2005), the disclosures of which are incorporated herein by reference). Notably, mechanical force is a ubiquitous and versatile stimulus that can be applied using a variety of methods including solution-phase ultrasonication (see, for example, Berkowski, K. L., et al. Ultrasound-Induced Site-Specific Cleavage of Azo-Functionalized Poly(ethylene glycol). *Macromolecules* 38, 8975-8978 (2005), the disclosure of which is incorporated herein by reference); focused ultrasound (as described, for example, in Kim, G. et al. High-intensity focused ultrasound-induced mechanochemical transduction in synthetic elastomers. *PNAS* 116, 10214-10222 (2019), the disclosure of which is incorporated herein by reference); and tension, compression, or shear in solid polymeric materials (see, for examples: Davis, D. A. et al. Force-induced activation of covalent bonds in mechanoresponsive polymeric materials. *Nature* 459, 68-72 (2009); Gossweiler, G. R. et al. Mechanochemical Activation of Covalent Bonds in Polymers with Full and Repeatable Macroscopic Shape Recovery. *ACS Macro Lett.* 3, 216-219 (2014); and Kingsbury, C. M. et al. Shear activation of mechanophore-crosslinked polymers. J. Mater. Chem. 21, 8381-8388 (2011), the disclosures of which are incorporated herein by reference). In addition, the spatiotemporal control afforded by many mechanochemical activation techniques makes mechanical force an attractive stimulus for a wide range of materials applications including the release of small molecules (see, for example: Versaw, B. A., et al. Harnessing the Power of Force: Development of Mechanophores for Molecular Release. *J. Am. Chem. Soc.* 143, 21461-21473 (2021), the disclosure of which is incorporated herein by reference), structural transformations such as changes in conductivity (as described, for example, in Chen, Z. et al. Mechanochemical unzipping of insulating polyladderene to semiconducting polyacetylene. *Science* 357, 475-479 (2017), the disclosure of which is incorporated herein by reference) or crosslinking (see, for example, Ramirez, A. L. B. et al. Mechanochemical strengthening of a synthetic polymer in response to typically destructive shear forces. *Nat Chem* 5, 757-761 (2013), the disclosure of which is incorporated herein by reference), and changes in color or luminescence, among many others (see, for example, Ghanem, M. A. et al. The role of polymer mechanochemistry in responsive materials and additive manufacturing. *Nat. Rev. Mater.* 6, 84-98 (2020), the disclosure of which is incorporated herein by reference).

Furthermore, mechanochromism is one of the most widely developed areas in the quickly emerging field of polymer mechanochemistry, wherein the design of mechanochromic (i.e., color-changing) materials has garnered significant interest for applications such as, for example, force sensing. As such, a variety of mechanochromic mechanophores with a range of structures and reactivities has been developed and studied. However, few of the mechanochromic mechanophores studied to date retain their colored state for long periods of time after stress relaxation. In addition, generation of multiple colors from a single mechanophore remains elusive. More specifically, modulating the photophysical properties of the mechanically generated dyes generally requires discrete derivatives to be prepared independently. Nevertheless, both of these features—the longevity of coloration and access to multiple colors from a single moiety—are highly desirable for creating mechanochromic materials for many applications, including, for example, multicolor mechanical soft lithography.

SUMMARY OF THE INVENTION

Various embodiments are directed to a mechanophore platform including a macromolecular mechanophore platform including:

a Diels-Alder adduct of a dienophile and a furan, wherein the furan includes a furfurylidene scaffold further including an activating group A according to:

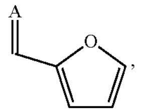

wherein the activating group A is an electron withdrawing acceptor moiety, such that the furan is characterized by an ability to react with a secondary amine to form an adduct including a conjugated triene scaffold according to:

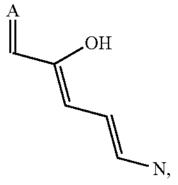

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile.

In various such embodiments, the dienophile is an electron-rich alkene, including is a vinyl ether.

In still various such embodiments, the activating group A includes a moiety selected from the group consisting of: barbituric acid, Meldrum's acid, isoxazolone, pyrazolidinedione, indanedione, pyrazolone, hydroxypyridone, and any derivative thereof.

In still yet various such embodiments, the activating group A includes $CF_3$-pyrazolone.

In various such embodiments, the polymer includes a polymeric network of chains.

In still various such embodiments, the polymer is selected from the group consisting of: polyacrylate, including poly (methyl acrylate); polymethacrylate, including poly(methyl methacrylate); polysiloxane, including polydimethylsiloxane; polyether, including poly(ethylene glycol); polyurethane; polyacrylamide; polyamide; polyester; and any combination thereof.

Various other embodiments are directed to a method for mechanochemically gating a solution coloration including:

providing a first solution including a macromolecular mechanophore platform including:

a Diels-Alder adduct of a dienophile and a furan, wherein the furan includes a furfurylidene scaffold further including an activating group A according to:

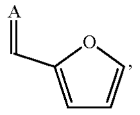

wherein the activating group A is an electron withdrawing acceptor moiety, such that the furan is characterized by an ability to react with a secondary amine to form an adduct including a conjugated triene scaffold according to:

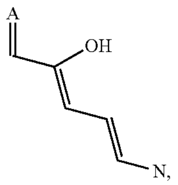

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile;

providing a developing solution including a secondary amine;

applying the mechanical force to the macromolecular mechanophore platform for a duration of time; and adding the developing solution to the first solution to produce a second solution characterized by a color, wherein the color is determined by the secondary amine's identity In various such embodiments, applying the mechanical force is using ultrasound.

In still various such embodiments, the developing solution further includes HFIP.

In yet various such embodiments, the dienophile is an electron-rich alkene.

In yet still various such embodiments, the dienophile is a vinyl ether.

In still various such embodiments, the activating group A includes a moiety selected from the group consisting of: barbituric acid, Meldrum's acid, isoxazolone, pyrazolidinedione, indanedione, pyrazolone, hydroxypyridone, and any derivative thereof.

In yet still various such embodiments, the activating group A includes $CF_3$-pyrazolone.

Still various other embodiments are directed to a method for mechanochemical multicolor soft lithography including:

providing an object to be enhanced with a pattern characterized by a color, the object including a polymer, wherein the polymer further includes a macromolecular mechanophore platform including:

a Diels-Alder adduct of a dienophile and a furan, wherein the furan includes a furfurylidene scaffold further including an activating group A according to

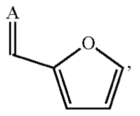

wherein the activating group A is an electron withdrawing acceptor moiety, such that the furan is characterized by an ability to react with a secondary amine to form an adduct including a conjugated triene scaffold according to:

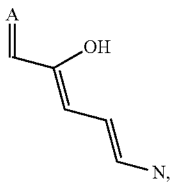

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile providing a developing solution including a secondary amine;

applying the mechanical force to the object in a spatially specific manner according to the pattern for a duration of time; and exposing the object to the developing solution to produce the pattern of the color throughout the object, wherein the color is determined by the secondary amine's identity.

In various such embodiments, the pattern includes a plurality of sub-patterns, each sub-pattern characterized by a different sub-pattern color, and wherein steps of applying the mechanical force to the object and exposing the object to the developing solution are sequentially repeated for each sub-pattern of the plurality of sub-patterns until the pattern is complete.

In yet various such embodiments, the object is an elastomeric film.

In yet still various such embodiments, applying the mechanical force includes deforming the polymer.

In still various such embodiments, the mechanical force is a force selected from the group consisting of: tension, compression, shearing, stretching, grinding, and any combination thereof.

In yet still various such embodiments, applying the mechanical force to the object in the spatially specific manner includes utilizing a stamp including the pattern.

In yet various such embodiments, the polymer includes a polymeric network of chains.

In still various such embodiments, the polymer is selected from the group consisting of: polyacrylate, including poly (methyl acrylate); polymethacrylate, including poly(methyl methacrylate); polysiloxane, including polydimethylsiloxane; polyether, including poly(ethylene glycol); polyurethane; polyacrylamide; polyamide; polyester; and any combination thereof.

In various such embodiments, the polymer is a cross-linked polydimethylsiloxane.

Yet various other embodiments are directed to a kit for mechanochemical multicolor soft lithography including:

an object to be enhanced with a pattern characterized by a color, the object including a polymer, wherein the polymer further includes a macromolecular mechanophore platform including:

a Diels-Alder adduct of a dienophile and a furan, wherein the furan includes a furfurylidene scaffold further including an activating group A according to:

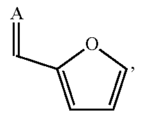

wherein the activating group A is an electron withdrawing acceptor moiety, such that the furan is characterized by an ability to react with a secondary amine to form an adduct including conjugated triene scaffold according to:

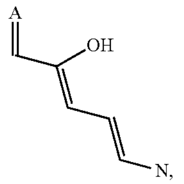

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile; and a developing solution including a secondary amine;

such that applying the mechanical force to the object in a spatially specific manner according to the pattern for a duration of time; and exposing the object to the developing solution affords the pattern of the color throughout the object, wherein the color is determined by the secondary amine's identity.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other features and advantages of the present invention will be better understood by reference to the following detailed description when considered in conjunction with the accompanying data and figures, wherein:

FIG. 1B shows mechanical force unmasking of a diarylethene photoswitch via a formal retro-[4+2] cycloaddition reaction, which, in turn, gates the photoisomerization reaction that produces the colored ring-closed form, according to prior art.

FIG. 7B provides UV-vis spectroscopy data (obtained in THF, 5 mg/mL, 30 mM BHT) characterizing ultrasound-induced mechanochemical activation of PMA-1 (left) and compares it to PMA-Control (right), wherein the data shows that ultrasonication of PMA-1 generates a new absorption signal with a peak at 375 nm, that increases with sonication time and matches that of the small molecule analog of activated furan Ref-1, while no new absorption peaks are observed upon ultrasonication of PMA-Control; FIG. 7C provides gel permeation chromatography (GPC) data (refractive index response) illustrating the time-dependent evolution of molecular weight upon ultrasonication (5 mg/mL in THF, 30 mM BHT) of PMA-1 (left) and PMA-Control (right), wherein the curves are normalized by peak area; FIG. 7D provides UV-Vis absorption spectra of PMA-1, PMA-Control, Ref-1, and a blank solution after 60 min of ultrasonication, and also provides photographs of the solutions of PMA-Control and PMA-1 after the same ultrasonication; FIG. 7E illustrates the mechanical force induced transformation of the macromolecular mechanophore platform into the activated furan and vinyl ether moieties by providing and comparing $^1H$ NMR spectra (400 MHz, $CDCl_3$) of PMA-1 before and after 1 h of ultrasonication (top and second from top spectra, respectively), Ref-1 (third from top spectrum), and ethylene glycol vinyl ether (bottom spectrum), wherein the new peaks in the spectrum of the sonicated PMA-1 are consistent with the expected formal retro-[4+2] cycloaddition reaction to form the activated furan and vinyl ether moieties; and FIGS. 7F through 711 provide UV-Vis absorption spectra of PMA-1, PMA-Control, respective small molecule reference analogs of the activated furan-secondary amine adducts, and a blank solution after 60 min of ultrasonication, wherein all samples were collected from the ultrasonication solution, concentrated, and then redissolved in 4:1 DCM/HFIP prior to addition of the indicated secondary amine, and wherein the spectra of PMA-1 after ultrasound-induced mechanical activation and secondary amine addition match those of the corresponding small molecule reference analogs, while similar treatment of PMA-Control does not lead to any color changes, and also provide photographs of the solutions of PMA-Control and PMA-1 after addition of the corresponding secondary amine; while FIG. 7I additionally provides absorption spectra of the small molecule reference analogs (as labeled) obtained at 26 μmol in 4:1 DCM/HFIP with 30 mM BHT—conditions chosen to be comparable to those in the ultrasonication experiments, all in accordance with embodiments of the invention.

FIGS. 8A through 8H illustrate mechanochromic function of the macromolecular mechanophore platform in solid state, wherein FIG. 8A illustrates, with schematics and photographs, that tension applied to a strip of elastomeric polydimethylsiloxane (PDMS) material incorporating the macromolecular mechanophore platform—PDMS-1 (2.5 wt % of mechanophore crosslinker (±)-5a)—followed by immersion into a solution of 4-methoxy-N-methylaniline (7 mM in 9:1 DCM/HFIP, 90 s), generates a coloration (blue-green, in this particular example) in the gauge region of the material, corresponding to a colored, triene scaffold photoswitch, which, in turn, undergoes reversible photoisomerization to the colorless ring-closed form upon irradiation with visible light for 30 s (top); and also shows that the same treatment applied to a strip of elastomeric polydimethylsiloxane (PDMS) material incorporating the mechanically inert analog of the macromolecular mechanophore platform—PDMS-Control (2.5 wt % of monofunctional mechanophore (±)-5b)—produces no coloration (bottom); FIG. 8B schematically shows bis-functional crosslinker (±)-5a comprising the hetero-Diels Alder adduct and its mono-functional analog (±)-5b; while FIG. 8C schematically illustrates the covalent incorporation of (±)-5a and (±)-5b into PDMS (2.5 wt %) via hydrosilylation to produce mechanochemically active elastomeric material PDMS-1 and its mechanically inert analog PDMS-Control, respectively; FIG. 8D provides photographs of a mechanically-activated and secondary amine-treated (4-methoxy-N-methylaniline, 7 mM in 9:1 DCM/HFIP) PDMS-1 film, wherein the blue-green coloration in the gauge region of the film disappears upon exposure to visible light irradiation for 30 s, and then re-appears upon cessation of irradiation under ambient conditions; FIGS. 8E and 8F further illustrate, with schematics and photographs, experiments wherein a film of PDMS-1 was mechanochemically activated by either tensile activation (FIG. 8E) or compression (FIG. 8F) and subsequently immersed in a solution of indoline (0.5 vol % in 9:1 DCM/HFIP, 90 s) (FIG. 8E) or diethylamine (0.5 vol % in DCM, 90 s) (FIG. 8F) to achieve distinct and prominent coloration of the film in the gauge or compressed, respectively, region of the film; and wherein further exposure of the corresponding films to visible light irradiation for 30 s induced photoswitching to the colorless species (i.e., ring closing of the conjugated triene scaffold), while cessation of irradiation resulted in the rapid regeneration of the colored conjugated triene under ambient conditions; FIG. 8G further illustrates, with schematics and photographs, experiments with the same PDMS-1 film, wherein the film was cut into two portions after compression, and each portion was next immersed in a solution of 4-methoxy-N-methylaniline for 90 s with either DCM or 9:1 DCM/FIP as the solvent; and FIG. 8H provides schematics and photographs for experiments with a PDMS-1 film, wherein mechanochemical activation of the film with localized compression via stamping was followed by exposure of the film to diethylamine vapor for 7 min, which produced purple coloration in the force-activated region of the film, all in accordance with embodiments of the invention.

DETAILED DISCLOSURE

The embodiments of the invention described herein are not intended to be exhaustive or to limit the invention to precise forms disclosed. Rather, the embodiments selected for description have been chosen to enable one skilled in the art to practice the invention.

Turning to the drawings, schemes, and data, embodiments of a macromolecular mechanophore platform with a multicolor chromogenic response following a mechanical force actuation and application of a developing agent of choice, and methods for the synthesis and use thereof are provided. In many embodiments, the macromolecular mechanophore platform comprises a Diels-Alder adduct further comprising and masking an activated furan capable of reacting with secondary amines to produce robust colored species with a conjugated triene scaffold upon its mechanical-force-activated production from the Diels-Alder adduct. In many embodiments the colored species with a conjugated triene scaffold are amenable to photoswitching. In many embodiments, the Diels-Alder adduct of the macromolecular mechanophore platform is embedded into a polymer, wherein the polymer may comprise two single chains covalently attached to the Diels-Alder adduct such that the Diels-Alder adduct is the center of the overall construct, or it may comprise a complex polymer chain network, including crosslinked polymer networks covalently incorporating the Diels-Alder adduct. In many embodiments, the polymer serves to efficiently and effectively transmit mechanical force to the Diels-Alder adduct to promote its activation and the production of the unmasked activated furan. In many embodiments, the mechanical force is provided by ultrasonication. In many other embodiments, the mechanical force is provided by any other means, including, but not limited to: tension, compression, shearing, stretching, grinding, and any combination thereof. In many embodiments, the macromolecular mechanophore platform enables mechanochemical multicolor soft lithography, wherein an iterative process comprising steps of 1) spatially specific application of force, followed by 2) exposure to a chromogenic developing reagent comprising a secondary amine of choice, affords predetermined, complex, multi-color patterns from a single material within a single object and or surface.

Figure 1A:
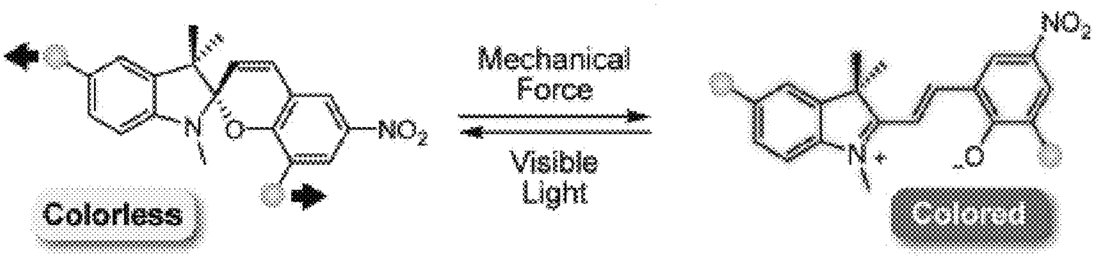
FIGS. 1A and 1B illustrate the evolution in design of mechanochromic mechanophores, wherein FIG. 1A schematically illustrates the reaction of a prototypical spiropyran mechanophore under mechanical force to generate a colored merocyanine dye.

Mechanochromic mechanophores have been widely developed as molecular force probes, empowering the visualization of critical stress and/or strain in materials (as discussed, for example, in Chen, Y., et al. Mechanochemical tools for polymer materials. *Chem. Soc. Rev.* 50, 4100-4140 (2021), the disclosure of which is incorporated herein by reference). Furthermore, the many beneficial attributes of covalent polymer mechanochemistry in general, including the ubiquity and versatility of mechanical force as the relied upon stimulus, also make force-induced color changes in polymeric materials appealing for patterning and encryption. For example, pioneering research by Davis et al. demonstrated the force-induced ring-opening reaction of spiropyran in polymeric materials activated under tension and compression to generate a highly colored merocyanine dye (FIG. 1A). However, while many different mechanochromic mechanophores with a range of structures and reactivity have now been developed, modulating the photophysical properties of such dyes typically requires distinct derivatives to be synthesized independently, which is a general limitation of this class of compounds.

Figure 1B:
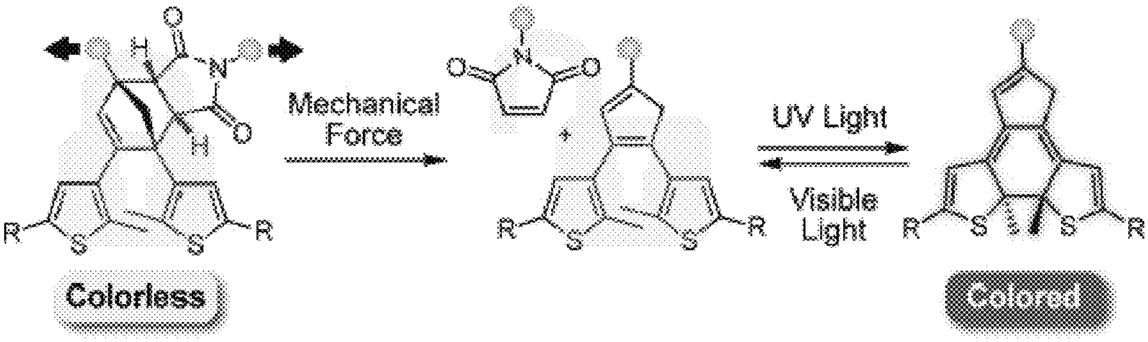

FIG. 1B illustrates another example of a mechanochromic mechanophore and a different approach to mechanochromic functionality (as provided by Hu, X., et al. Mechanochemical Regulation of a Photochemical Reaction. *J. Am. Chem. Soc.* 140, 14073-14077 (2018); and Barber, R. W. & Robb, M. J. A modular approach to mechanically gated photoswitching with color-tunable molecular force probes. *Chem. Sci.* 12, 11703-11709 (2021), the disclosures of which are incorporated herein by reference). In this example, mechanochemically gated photoswitching overcomes disadvantages of reversibility and a lack of mechanochemical specificity encountered with typical mechanochromic mechanophores, by using mechanical force to first unmask a latent photoswitch, which is then converted to a colored species via a photoisomerization reaction (FIG. 1B). One particularly enticing feature of this general molecular design strategy is the decoupling of mechanochemical activation of the mechanophore from the ultimate functional response, which provides a high degree of modularity to the system. Nevertheless, while the absorption properties of such dyes can be modified by late-stage diversification of the mechanophore, several synthetic manipulations are still required to prepare each distinct polymeric mechanophore. Moreover, the differential mechanochemical activation of mechanophores with intrinsically different reactivity has proved challenging in the solid state (as discussed, for example, in: Kim, T. A., et al. Mechanical Reactivity of Two Different Spiropyran Mechanophores in Polydimethylsiloxane. *Macromolecules* 51, 9177-9183 (2018); and Lin, Y., et al. Regiochemical Effects on Mechanophore Activation in Bulk Materials. *J. Am. Chem. Soc.* 140, 15969-15975 (2018), the disclosures of which are incorporated herein by reference).

On the other hand, Donor-Acceptor Stenhouse Adducts (DASAs) are a recently established class of highly modular, optically tunable dyes and robust visible-light photoswitches (such as described, for example, in Helmy, S. et al. Photoswitching Using Visible Light: A New Class of Organic Photochromic Molecules. *J. Am. Chem. Soc.* 136, 8169-8172 (2014), the disclosure of which is incorporated herein by reference). Since being introduced by Read de Alaniz and coworkers in 2014, DASAs have been widely developed and used in a variety of applications including sensing (for examples, see: Balamurugan, A. & Lee, H. A Visible Light Responsive On-Off Polymeric Photoswitch for the Colorimetric Detection of Nerve Agent Mimics in Solution and in the Vapor Phase. *Macromolecules* 49, 2568-2574 (2016); Diaz, Y. J. et al. A Versatile and Highly Selective Colorimetric Sensor for the Detection of Amines. *Chemistry—A European Journal* 23, 3562-3566 (2017); and Chen, Q. et al. Stable Activated Furan and Donor-Acceptor Stenhouse Adduct Polymer Conjugates as Chemical and Thermal Sensors. *Macromolecules* 52, 4370-4375 (2019), the disclosures of which are incorporated herein by reference), drug release (as described, for example, in Poelma, S. O. et al. Controlled drug release to cancer cells from modular one-photon visible light-responsive micellar system. *Chem. Commun.* 52, 10525-10528 (2016), the disclosure of which is incorporated herein by reference), and photoactuation (see, for example, Lee, J. et al. Tunable Photothermal Actuation Enabled by Photoswitching of Donor-Acceptor Stenhouse Adducts. *ACS Appl. Mater. Interfaces* 12, 54075-54082 (2020), the disclosure of which is incorporated herein by reference). Furthermore, the synthetic accessibility and simple diversification of DASAs, coupled with excellent photophysical properties, have driven their rapid adoption (as discussed in Helmy, S., et al. Design and Synthesis of Donor-Acceptor Stenhouse Adducts: A Visible Light Photoswitch Derived from Furfural. *J. Org. Chem.* 79, 11316-11329 (2014), the disclosure of which is incorporated herein by reference). More specifically, DASAs are derived from simple activated furan precursors that react with secondary amines to produce an intensely colored molecules/dyes comprising an extended conjugated triene donor-acceptor molecular scaffold having high absorptivity. Importantly, the color, stability, and photoswitching behavior of DASAs are all strongly influenced by the identity of their secondary amine component, in addition to the electron-withdrawing acceptor group of their activated furan precursor (see, for examples: Hemmer, J. R. et al. Controlling Dark Equilibria and Enhancing Donor-Acceptor Stenhouse Adduct Photoswitching Properties through Carbon Acid Design. *J. Am. Chem. Soc.* 140, 10425-10429 (2018); and Lerch, M. M., et al. The (photo) chemistry of Stenhouse photoswitches: guiding principles and system design. *Chem. Soc. Rev.* 47, 1910-1937 (2018), the disclosures of which are incorporated herein by reference).

Figure 2:
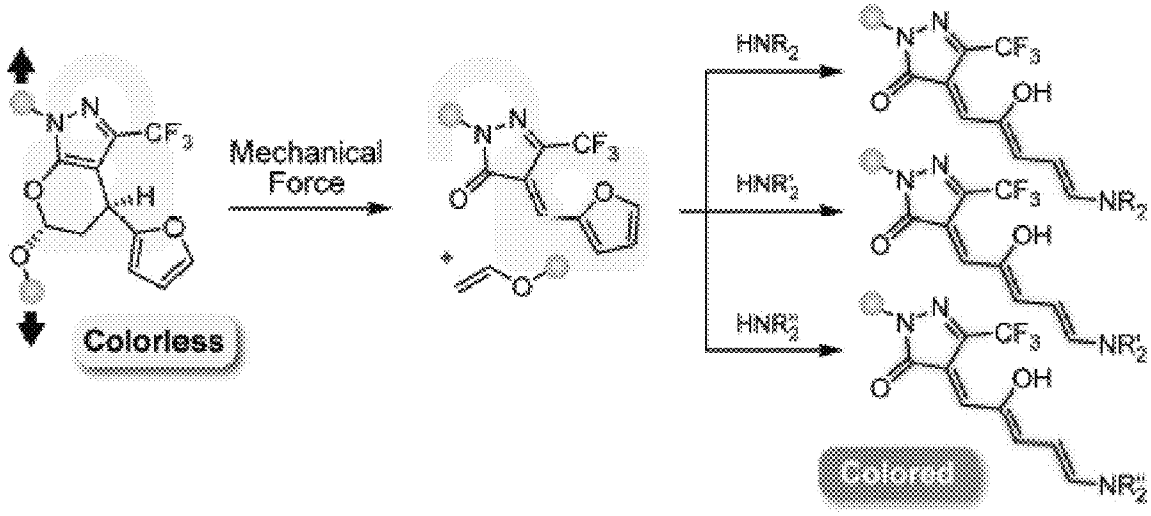
FIG. 2 schematically illustrates a macromolecular mechanophore platform consisting of a Diels-Alder adduct embedded in a polymer that can be mechanically triggered to undergo a formal retro-[4+2] cycloaddition reaction to reveal an activated furan, which can, in turn, react with secondary amines to form species of different colors, based on the identities of the secondary amines, in accordance with embodiments of the invention.

This application is directed to embodiments of a macromolecular mechanophore platform with mechanochemical multicolor chromogenic response capabilities, and methods of synthesis and use thereof. In particular, the application is directed to embodiments of the macromolecular mechanophore platform comprising a mechanochemically active, Diels-Alder adduct embedded into a polymeric chain or another polymeric network, such that the Diels-Alder adduct undergoes a formal retro-[4+2] cycloaddition reaction (i.e., a formal retro-Diels-Alder reaction) under mechanical force to reveal an otherwise masked, activated furan, wherein, in turn, the activated furan is capable of reacting with secondary amines to produce adduct products comprising an extended conjugated triene donor-acceptor molecular scaffold. Accordingly, in many embodiments, upon its mechanically induced generation from the macromolecular mechanophore platform, the activated furan is readily available to react with various secondary amines to generate a wide variety of highly colored and functionally diverse adduct products. As such, in many embodiments, some of which are illustrated in FIG. 2, the macromolecular mechanophore platform affords a chromogenic response in two straightforward steps: mechanochemical activation of the Diels-Alder adduct moiety to produce the activated furan, followed by addition of a secondary amine of choice to produce the desired chromogenic reaction (based on the choice of the secondary amine), such that distinctly colored adduct products can be obtained from a single macromolecular mechanophore platform. In many embodiments, the Diels-Alder adduct is a hetero-Diels-Alder adduct. In some embodiments, the mechanochemical activation is achieved in solution using, for example, ultrasonication. However, in some other embodiments, the mechanochemical activation is achieved in solid phase (such as, for example, within a polymeric material) using any suitable mechanical means, including (but not limited to): tension, compression, shearing, stretching, grinding, and any combination thereof. In many embodiments, the mechanophore platform allows for mechanochemical multicolor soft lithography, wherein the iterative application of mechanical force and a developing agent comprising a secondary amine of choice is used to print a complex multicolor image in a polymeric material. In many embodiments, the polymeric material is an elastomer. In many embodiments, the polymeric material comprises polydimethylsiloxane (PDMS).

In many embodiments, the activated furan comprises an electron deficient furfurylidene molecular scaffold further comprising an activating group, such that the activating group is electron withdrawing and electronically activates the reaction of the activated furan with secondary amines to generate an adduct product comprising an extended conjugated triene scaffold (FIG. 2, right side). In many such embodiments, the activating group is derived from a carbon acid acceptor. In many embodiments, the activating group comprises a moiety selected from the group consisting of, but not limited to: barbituric acid, Meldrum's acid, isoxazolone, pyrazolidinedione, indanedione, pyrazolone, hydroxypyridone, and any derivative thereof. In many such embodiments, the activating group comprises $CF_3$-pyrazolone as illustrated in FIG. 2. In many such embodiments, the product comprising the extended conjugated triene scaffold possess photophysical characteristics including high molar absorptivity.

In many embodiments, the secondary amine is an amine comprising two nitrogen atom-bound non-hydrogen substituents R' and R", each, independently, selected from the group consisting of (but not limited to): alkyl, heteroalkyl, cycloalkyl, heterocycloalkyl, aryl, heteroaryl, any other aromatic or heteroaromatic functional group, and any combination thereof. In some embodiments, R' and R" are the same substituent, while in some other embodiments R' and R" are different substituents. In some embodiments, the secondary amine is incorporated as a member of a cyclic moiety, such that R' and R" are also members of the same cyclic moiety, and wherein the cyclic moiety may further comprise other cyclic or multicyclic components. In some embodiments, the secondary amine is part of biomolecule, such as, for example, a protein. In many embodiments, substituents R' and R" are selected such that their size and sterics do not negatively affect, or in any way obstruct, the secondary amine's access to and reaction with the activated furan as described herein. In many embodiments, the secondary amine possesses sufficiently electron donating character to efficiently react with the activated furan as described herein.

In addition, in many embodiments, the presence of the activating group on the activated furan allows for facile incorporation (masking) of the activated furan into the mechanochemically active Diels-Alder adduct for on demand mechanical activation of the chromogenic response. More specifically, although not to be bound by any theory, it is expected that an inverse electron demand Diels-Alder or hetero-Diels-Alder reaction between, for example, wherein the activated furan comprises a $CF_3$-pyrazolone as its activating group, the α,β-unsaturated carbonyl of the $CF_3$-pyrazolone and a dienophile, such as, for example, an electron-rich alkene, would efficiently generate the desired cycloadduct (the Diels-Alder adduct) due to the electron deficiency of the activated furan (FIG. 2) (as described in, for example, Palasz, A. & Palasz, T. Knoevenagel condensation of cyclic ketones with benzoylacetonitrile and N,N'-dimethylbarbituric acid. Application of sterically hindered condensation products in the synthesis of spiro and dispiropyrans by hetero-Diels-Alder reactions. *Tetrahedron* 67, 1422-1431 (2011), the disclosure of which is incorporated herein by reference). Accordingly, in many embodiments, the dienophile is an electron-rich alkene. In some embodiments, the dienophile is an electron-rich alkene comprising one or more electron-rich aryl substituents, such as, for example, p-methoxy substituent, or, as another example, p-$NR_2$ phenyl substituent. In many embodiments, the dienophile is a terminal alkene. In many such embodiments, the dienophile is vinyl ether. Accordingly, in many embodiments, the Diels-Alder adduct is a cycloadduct comprising two moieties—an activated furan moiety and a dienophile moiety—joined together via the activating group of the activated furan.

Figure 3:
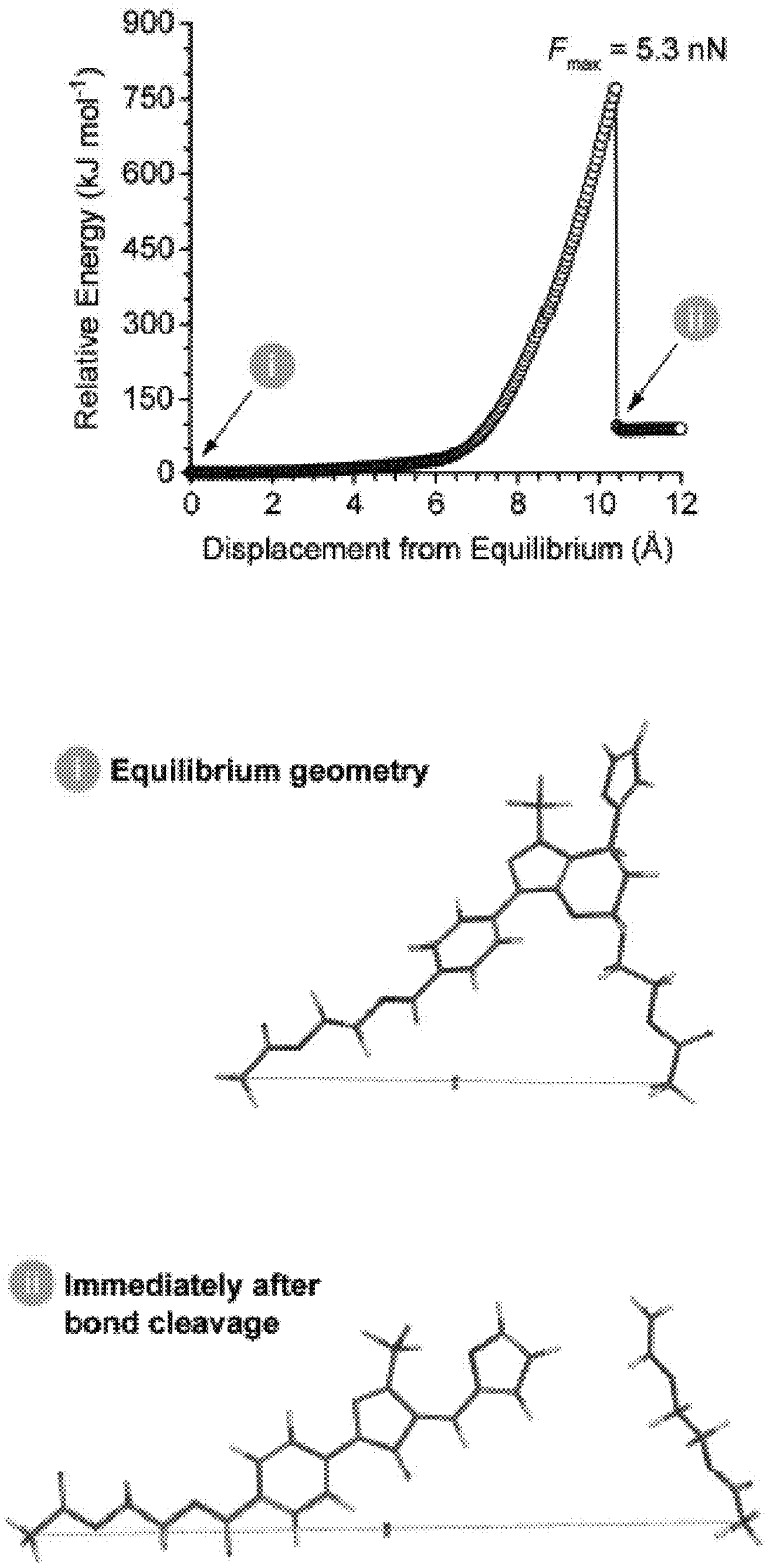
FIG. 3 provides density functional theory (DFT) calculations using the constrained geometries simulate external force (CoGEF) method that affirm the formal retro-[4+2] cycloaddition reaction upon mechanical elongation of a model of the macromolecular hetero-Diels-Alder adduct to generate the activated furan with a rupture force of 5.3 nN, wherein the calculations were performed at the B3LYP/6-31G* level of theory, in accordance with embodiments of the invention.

In many embodiments, the mechanochemically active Diels-Alder adduct is covalently linked to a polymer, such as a single polymer chain or a polymeric network, wherein the attached polymer transmits the applied mechanical force to the mechanophore for activation. In many embodiments, the regiochemistry of the polymer placement on the Diels-Alder adduct/mechanophore is paramount to determining the mechanophore's force-sensitivity. More specifically, in many embodiments, attachment of the polymer at the Diels-Alder adduct's points that are proximal to a single scissile bond directs the scission force more efficiently within the mechanophore (as discussed, for example, in Stevenson, R. & De Bo, G. Controlling Reactivity by Geometry in Retro-Diels-Alder Reactions under Tension. *J. Am. Chem. Soc.* 139, 16768-16771 (2017), the disclosure of which is incorporated herein by reference). As such, in many embodiments, the macromolecular Diels-Alder adduct designed according to the principles described herein, including proper attachment to the polymer, is electronically favored to generate the activated furan upon mechanochemical activation. For example, density functional theory (DFT) calculations using the constrained geometries simulate external force (CoGEF) method, as described, for example, in Beyer, M. K. The mechanical strength of a covalent bond calculated by density functional theory. *J. Chem. Phys.* 112, 7307-7312 (2000), the disclosure of which is incorporated herein by reference and presented in FIG. 3 predict that mechanical elongation of the hetero-Diels-Alder adduct of many embodiments results in the expected formal retro-[4+2] cycloaddition/retro-Diels-Alder reaction to reveal the activated furan with a predicted rupture force of 5.3 nN (see, for example, Klein, I. M., et al. Validation of the CoGEF Method as a Predictive Tool for Polymer Mechanochemistry. *J. Am. Chem. Soc.* 142, 16364-16381 (2020), the disclosure of which is incorporated herein by reference). Notably, to date, only bicyclic mechanophores have been investigated and proven successful in such mechanochemical activation reactions, in contrast to the instant single ring Diels-Alder adduct mechanophore.

In some embodiments, the polymer is selected from, for example, a group consisting of: polyacrylates, including poly(methyl acrylate) (PMA), polymethacrylates, including poly(methyl methacrylate) (PMMA), polysiloxanes, including polydimethylsiloxane (PDMS), polyethers, including poly(ethylene glycol) (PEG), polyurethanes, polyacrylamides, polyamides, polyesters, and any combination thereof. In many embodiments, the polymer is at least two single chains of an approximately same length flanking the mechanophore such that one chain is attached to the activated furan moiety of the Diels-Alder adduct, the other chain is attached to the dienophile moiety of the Diels-Alder adduct, and the overall Diels-Alder adduct is positioned in the center of the whole construct. In such embodiments, application of external force, such as provided by, for example, ultrasonication of a solution, or, as another example, tension and compression of a solid phase, produces elongational/tensile forces maximized near the overall chain's midpoint, where the Diels-Alder adduct mechanophore is situated, and, thus, promotes the mechanophore's activation and bond scission. In other words, when, for example, dilute polymer solutions are subjected to ultrasonication, cavitation-induced solvodynamic shear results in the rapid extension of the polymers and mechanical force is maximized near the center of the chain. In yet other words, the polymer chains judiciously attached to the Diels-Alder adduct according to many embodiments are responsible for transmitting the applied mechanical force to such mechanophore, making it undergo force-induced reactivity and break apart. In some embodiments, more than two polymeric chains are attached to the Diels-Alder adduct, as long as at least one chain is attached to each one—the activated furan and the dienophile moieties of the Diels-Alder adduct mechanophore of the instant disclosure. In some embodiments, the Diels-Alder adduct mechanophore is embedded into a force transmitting polymeric network. In many embodiments, the polymeric network is an elastomer. In many such embodiments, the Diels-Alder adduct mechanophore is embedded into an elastomeric film.

Figure 4:
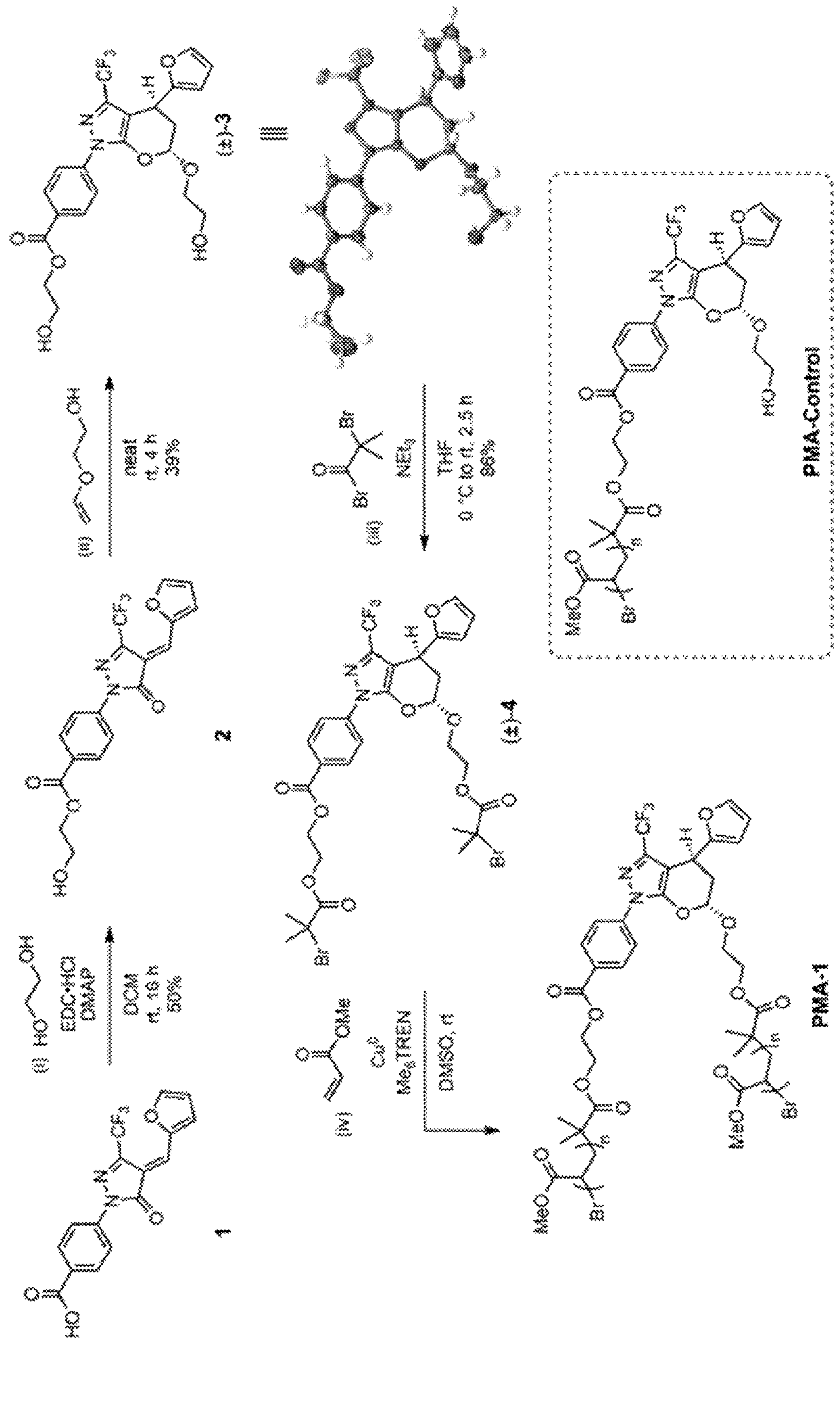
FIG. 4 schematically illustrates a synthetic approach to the assembly of the macromolecular mechanophore platform (PMA-1) containing the hetero-Diels-Alder adduct, wherein the hetero-Diels-Alder adduct further contains the masked activated furan, and wherein the hetero-Diels-Alder adduct is embedded at approximately the mid-point of a polymer chain (here, poly(methyl acrylate) (PMA) chain); and a mechanically inert analog of PMA-1—PMA-Control wherein the same hetero-Diels-Alder adduct is attached to only one end of a polymer chain; and wherein conditions of step (i) of the synthetic procedures include: ethylene glycol (9.6 equiv.), N-(3-Dimethylaminopropyl)-N'-ethylcarbodiimide hydrochloride (EDC·HCL, 1.2 equiv.), 4-dimethylaminopyridine (DMAP, 0.07 equiv.), $CH_2Cl_2$, room temperature, 16 h, affording 50% yield of 2; step (ii) conditions include: ethylene glycol vinyl ether (33 equiv.), room temperature, 4 h, affording 39% yield of (±)-3; step (iii) conditions include: α-bromoisobutyryl bromide (4.4 equiv.), triethylamine (3.9 equiv.), tetrahydrofuran, 0° C. to room temperature, 2.5 h, affording 86% yield of (±)-4, and step (iv) conditions include: methyl acrylate (2030 equiv.), copper wire, tris[2-(dimethylamino)ethyl]amine ($Me_6TREN$, 3.0 equiv.), dimethyl sulfoxide, room temperature, 1.5 h, in accordance with embodiments of the invention.
Figure 5:
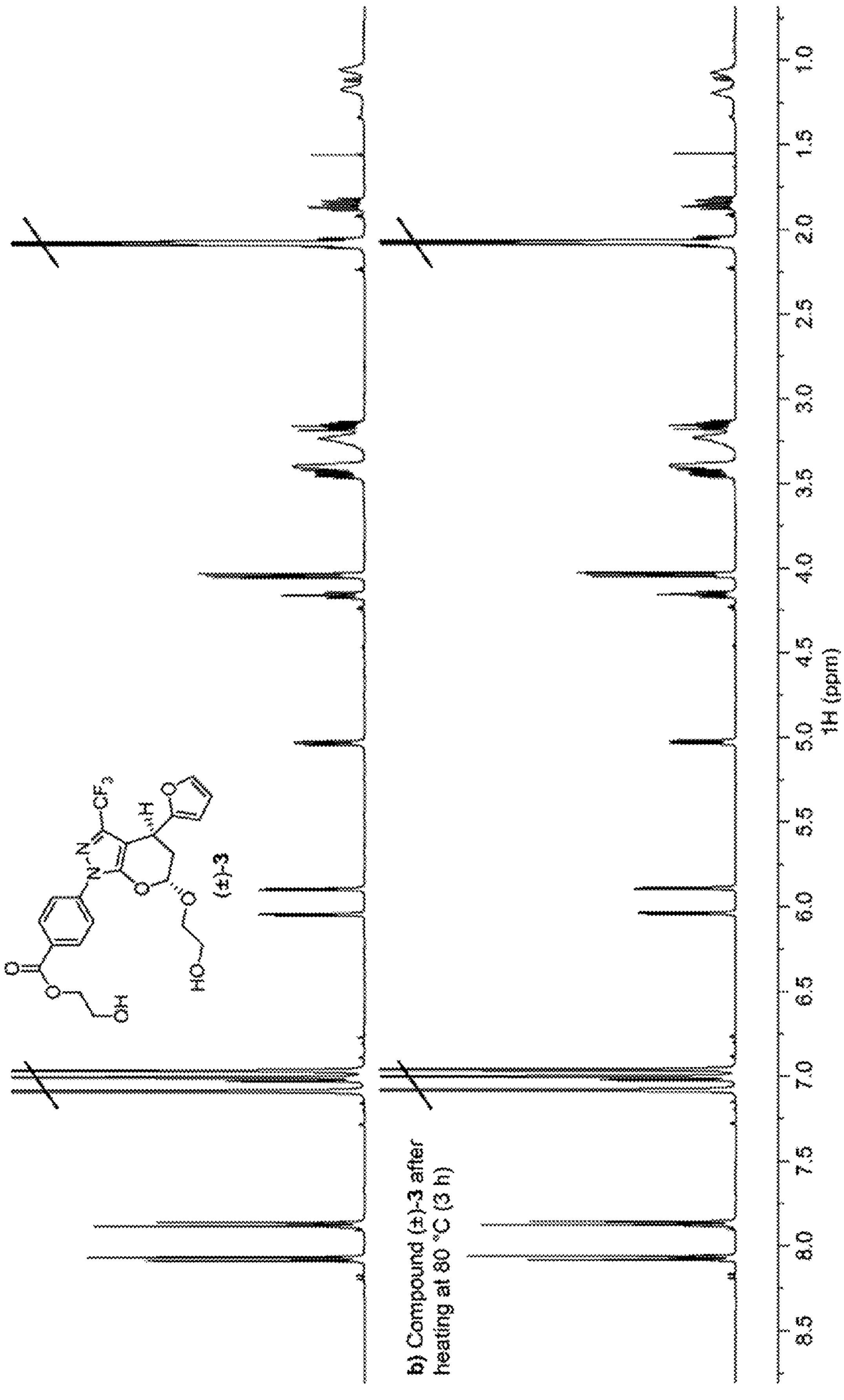
FIG. 5 provides $^1H$ NMR spectra (400 MHz, toluene-ds) of hetero-Diels-Alder adduct (±)-3 before (top) and after (bottom) heating at 80° C. for 3 h, illustrating the thermal stability of the hetero-Diels-Alder adduct, in accordance with embodiments of the invention.

FIG. 4 provides an example of the macromolecular mechanophore of many embodiments—PMA-1—comprising the hetero-Diels-Alder adduct, and schematically illustrates one straightforward approach to the synthesis thereof according to some embodiments, along with the synthesis of a mechanically inert analog thereof—control species PMA-Control. In this example, the activated furan 1 was first synthesized in two steps (not shown in FIG. 4) from commercially available materials. Next, carbodiimide coupling using EDC with ethylene glycol produced the activated furan species 2, making it equipped with the activated furan moiety attachment point for the polymer, in 50% yield. Furthermore, inverse electron demand hetero-Diels-Alder reaction of 2 with ethylene glycol vinyl ether generated the hetero-Diels-Alder adduct (±)-3 as a racemic mixture in 39% yield, wherein (±)-3 also incorporated the vinyl ether moiety attachment point for the polymer. At this point, the structure of the hetero-Diels-Alder adduct (±)-3, comprising the two terminal hydroxyl groups for further incorporation of (±)-3 into the polymer according to many embodiments, was confirmed by single crystal X-ray diffraction. In addition, the thermal stability of (±)-3 was also confirmed by heating the compound in toluene-$d_8$ at 80° C. for 3 h, which resulted in negligible change to the $^1$H NMR spectrum (FIG. 5). Next, diol (±)-3 was esterified with α-bromoisobutyryl bromide in a straightforward fashion to afford (±)-4, which was then used as a bis-initiator in the controlled radical polymerization of methyl acrylate to produce the macromolecular mechanophore platform of many embodiments—the poly(methyl acrylate) polymer chain-centered, hetero-Diels-Alder adduct PMA-1, with $M_n$=125 kDa and Đ=1.15. In addition, a mechanically inert analog of PMA-1, PMA-Control, was obtained according to the same synthetic route of many embodiments, but wherein a single α-bromoisobutyryl ester was installed and used in the polymerization reaction, affording the macromolecular species comprising the hetero-Diels-Alder adduct at the polymer chain's end, rather than middle, and, as such, expected to remain intact when the polymer was subjected to mechanical force during, for example, ultrasonication.

Figure 6:
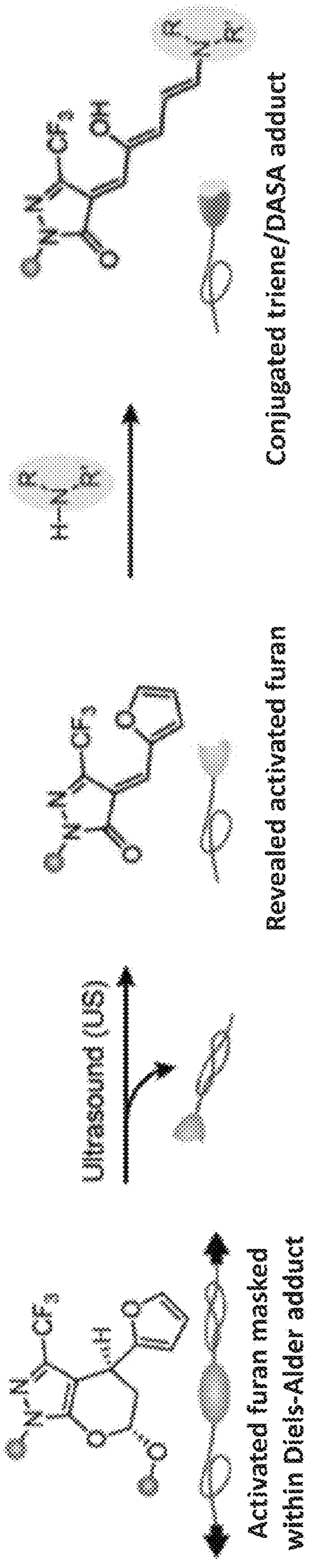
FIG. 6 schematically illustrates mechanochromic function of the macromolecular mechanophore platform, wherein, first, the activation with mechanical force (here, using ultrasonication) induces a formal retro-[4+2] cycloaddition reaction of the Diels-Alder adduct of the macromolecular mechanophore platform to generate the activated furan previously masked within the Diels-Alder adduct, followed by the color-producing derivatization of the activated furan with a secondary amine, to achieve a highly colored and stable Donor-Acceptor Stenhouse Adduct (DASA) species possessing a conjugated triene scaffold, in accordance with embodiments of the invention.
Figure 7A:
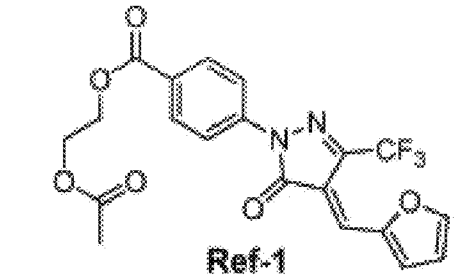
FIGS. 7A through 7I illustrate and provide data in support of mechanochromic function of the macromolecular mechanophore platform in solution, wherein FIG. 7A identifies structures of the small molecule model compounds and secondary amines used as the analytical references and developing agents, respectively, in the relevant illustrative experiments.
Figure 7A:
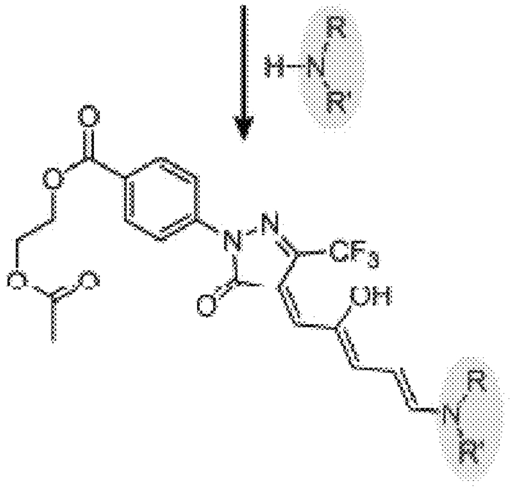
Figure 7A:
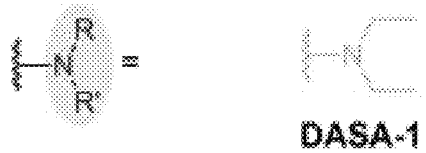
Figure 7A:
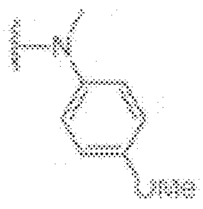
Figure 7A:
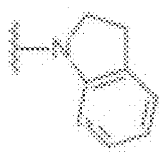

Mechanochemical Activation and Chromogenic Reactivity of the Macromolecular Mechanophore Platform in Solution Phase In many embodiments, the macromolecular mechanophore platform is used to provide a chromogenic response in solution. For example, FIG. 6 illustrates the mechanochemical activation of the macromolecular mechanophore platform of many embodiments, such as, for example, PMA-1, using, solution-phase ultrasonication to generate the mechanical force of some embodiments, and the subsequent chromogenic reactivity thereof with secondary amines in solution, according to many embodiments. In addition, FIGS. 7A through 7H provide data obtained from various experiments with PMA-1 and PMA-Control, which illustrate the chromogenic capabilities of the macromolecular mechanophore platform of many embodiments and, more specifically, the solution ultrasound activated, chromogenic processes of many embodiments shown in FIG. 6. To this end, first, FIG. 7A provides explanation of some of the nomenclature used in FIGS. 7B through 7H, including the identity of Ref-1 compound used as a small molecule (non-polymeric) analog of the activated furan of many embodiments, and the identities of the secondary amines used as the developing agent in the corresponding illustrative experiments. Next, the chromogenic reactivity of the activated furan (masked within the hetero-Diels-Alder adduct) was evaluated by subjecting a dilute solution of the macromolecular mechanophore platform (PMA-1 in these experiments) (5 mg/mL in THF, 30 mM BHT) to 60 min of pulsed ultrasonication (at 6-9° C., 1 s on/2 s off, 13.6 W $cm^{-2}$) followed by treatment with the secondary amines shown in FIG. 7A.

Figure 7B:
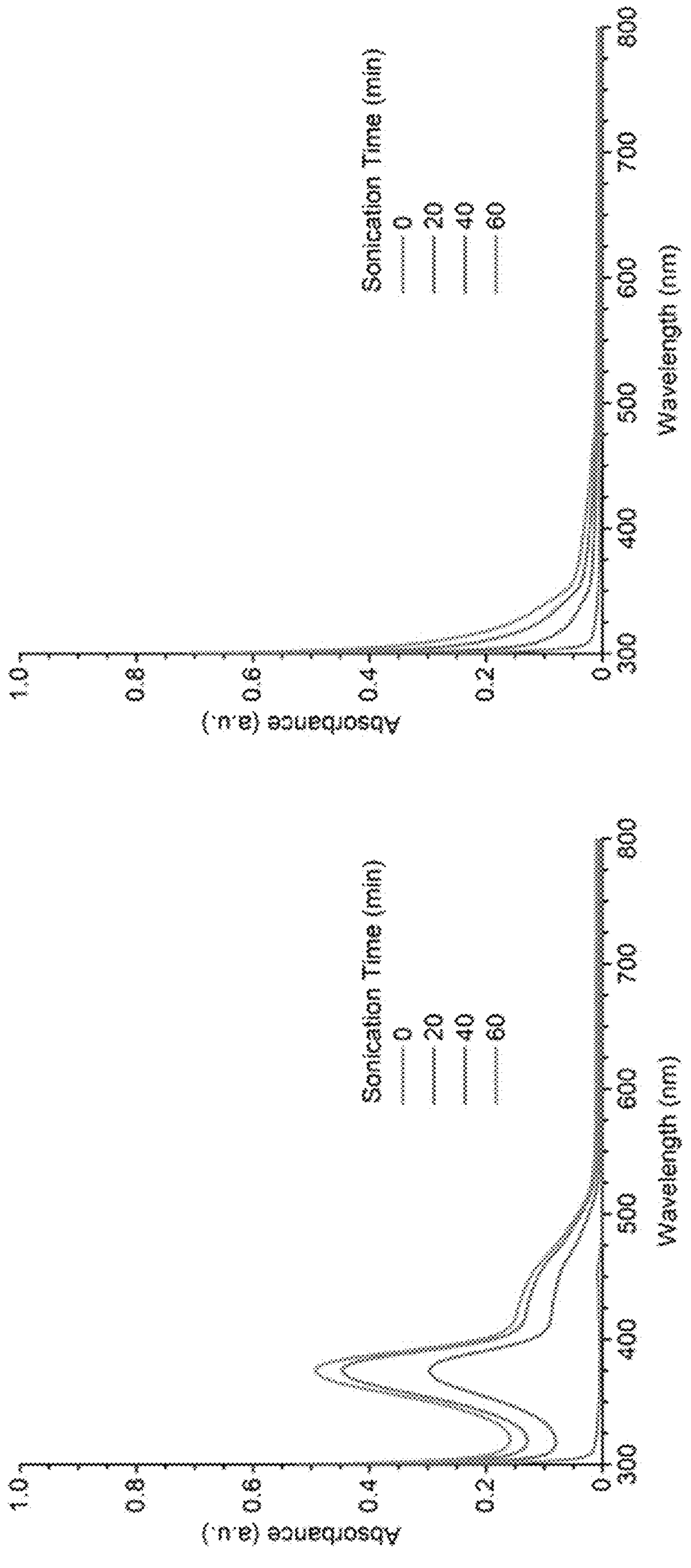
Figure 7C:
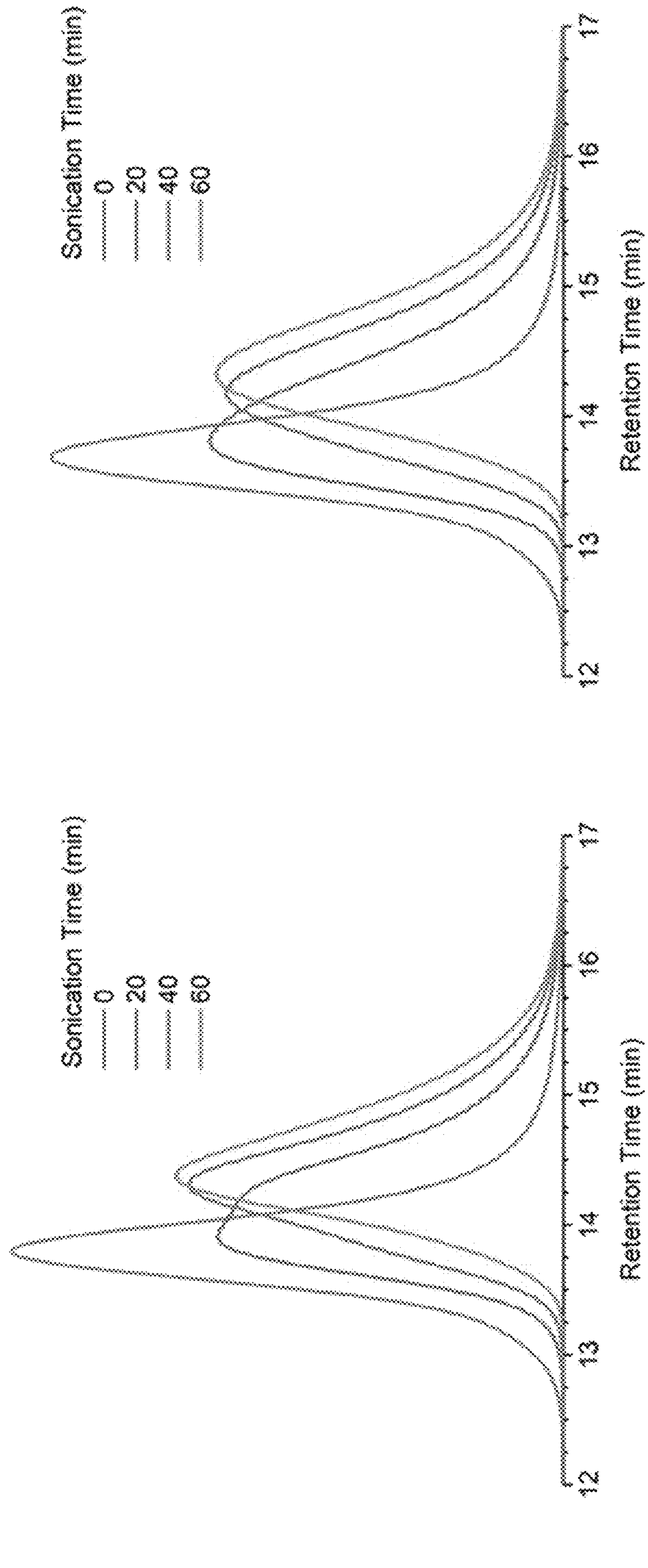
Figure 7D:
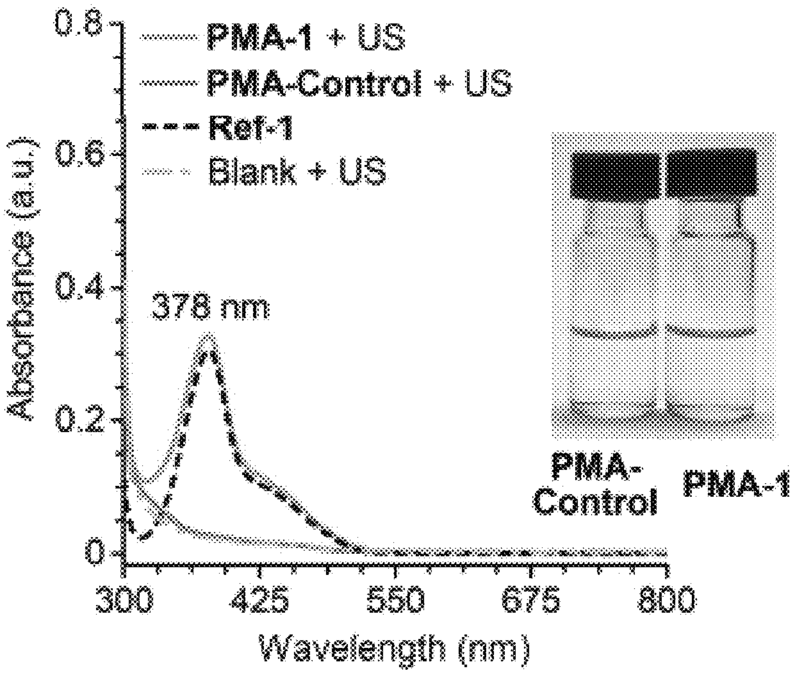
Figure 7E:
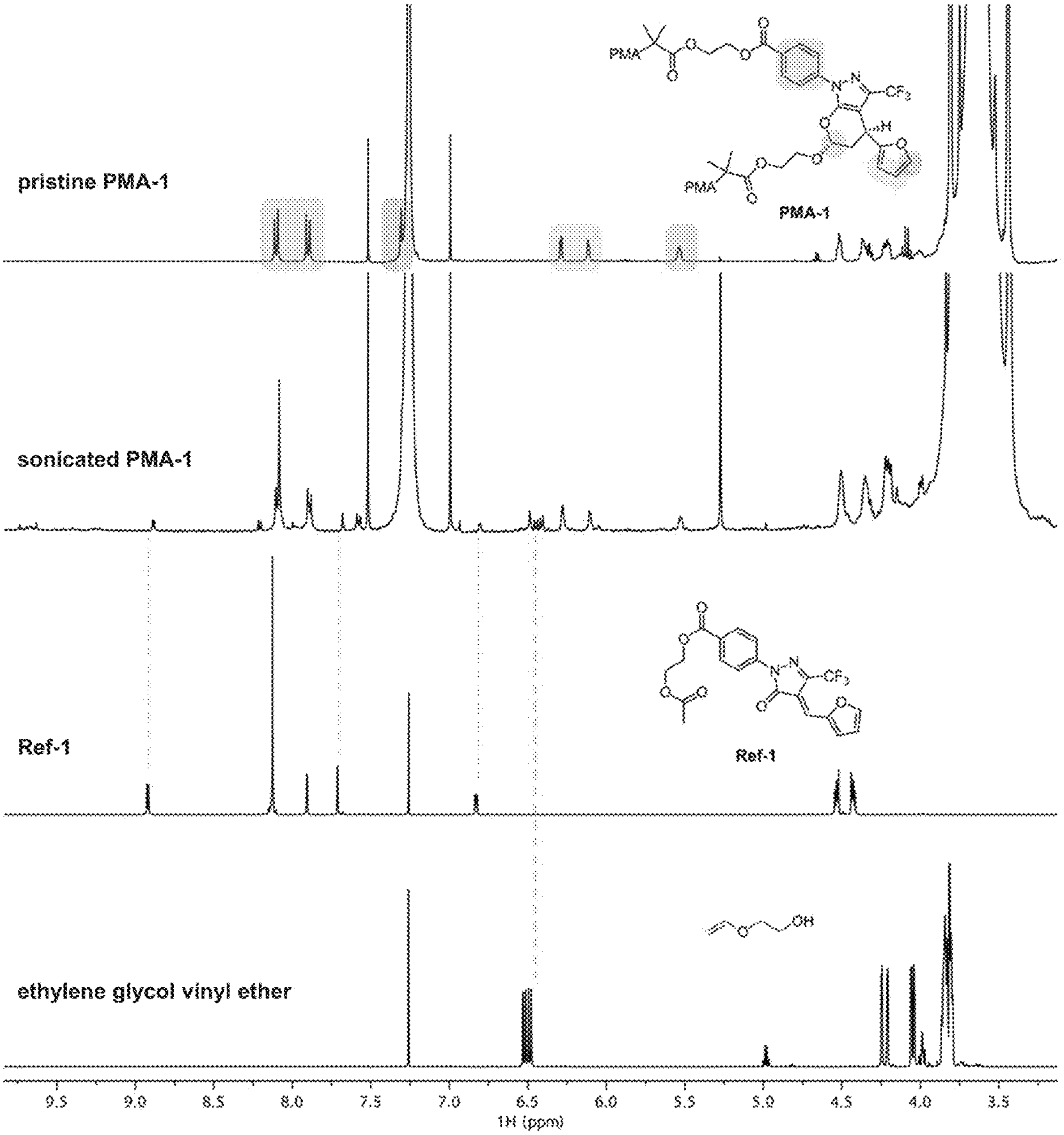
Figure 7F:
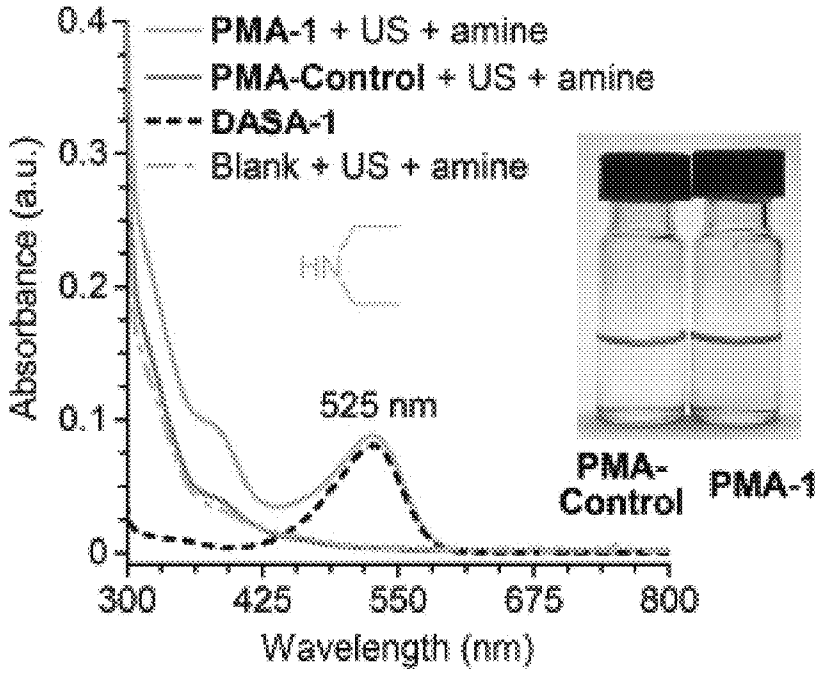

In these experiments, aliquots were removed during ultrasonication at regular intervals for analysis by gel permeation chromatography (GPC) and UV-vis spectroscopy, as shown in FIGS. 7B and 7C, respectively, to characterize the mechanochemical transformation (including the generation of the activated furan) of PMA-1 (FIGS. 7B and 7C, left), and compare it to that of mechanically inert PMA-Control (FIGS. 7B and 7C, right). As can be seen from the data provided in FIGS. 7B and 7D, ultrasound-induced mechanical activation (US) of PMA-1 results in the appearance of a new absorption peak at 378 nm, which matches the absorption spectrum of Ref-1—the independently prepared small molecule analog of the activated furan—thus, confirming the generation of the activated furan. Furthermore, $^1$H NMR spectra acquired before and after ultrasonication of PMA-1 demonstrate, as shown in FIG. 7E, the appearance of resonances corresponding to the retro-Diels-Alder products—the activated furan and the vinyl ether of many embodiments. In contrast, no reaction was observed upon ultrasonication of PMA-Control under the same conditions, confirming that the generation of the activated furan from the hetero-Diels Alder adduct of the macromolecular mechanophore platform of instant disclosure is mechanochemical in nature.

Figure 7G:
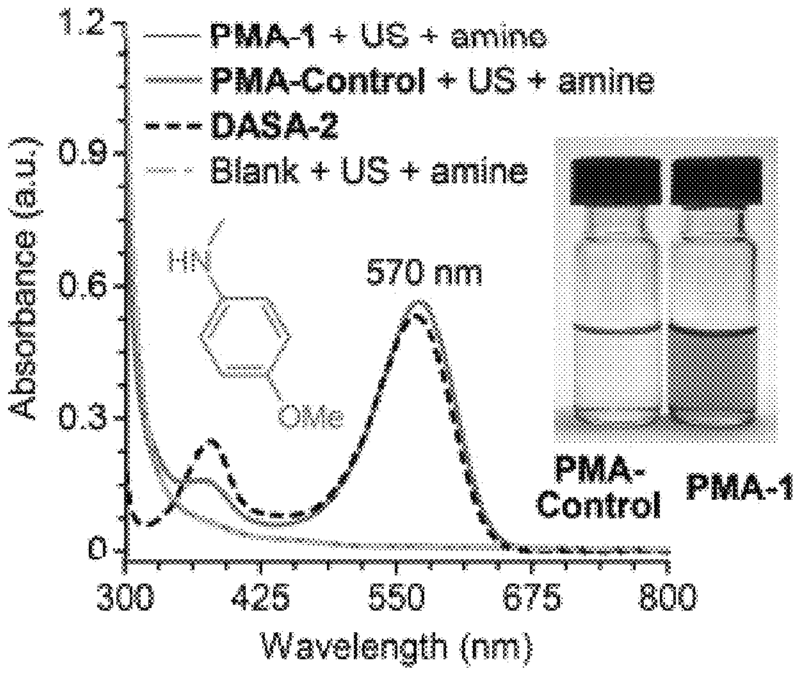
Figure 7H:
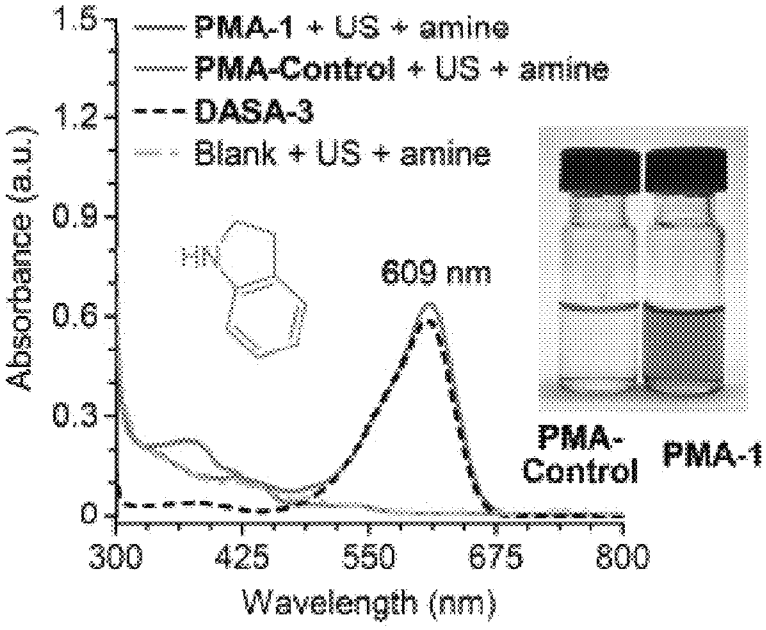

Furthermore, FIGS. 7G through 7H provide data that illustrates multi-color chromogenic response of the macromolecular mechanophore platform of the instant disclosure (PMA-1 in these particular experiments) upon treatment of the activated furan mechanochemically generated in solution with different secondary amines, according to the process of many embodiments schematically illustrated in FIG. 5. For these illustrative experiments, small molecule analogs of the colored adduct products comprising the conjugated triene molecular scaffold expected from the reactions of the activated furan of many embodiments with the secondary amines shown in FIG. 7A—DASA-1, DASA-2, and DASA-3—were prepared separately for spectral comparisons by reacting Ref-1 with diethylamine, 4-methoxy-N-methylaniline, or indoline, respectively as shown in FIG. 7A. Next, the ultrasonicated (US) solution of PMA-1 was concentrated and then redissolved in a 4:1 (v/v) mixture of dichloromethane (DCM) and 1,1,1,3,3,3-hexafluoro-2-propanol (HFIP), which promotes the reaction between the activated furan and a secondary amine, and stabilizes the conjugated triene (i.e., colored) molecular scaffold of the adduct product (see, for example, Clerc, M. et al. Promoting the Furan Ring-Opening Reaction to Access New Donor-Acceptor Stenhouse Adducts with Hexafluoroisopropanol. *Angew. Chem. Int. Ed.* 60, 10219-10227 (2021), the disclosure of which is incorporated herein by reference). Accordingly, as can be seen from FIGS. 7G through 7H, the addition of a secondary amine to the solution of the mechanically-activated macromolecular mechanophore platform results in the generation of new absorption peaks that match the UV-vis absorption spectra of the corresponding small molecule analog compounds (here, DASA-1, DASA-2, and DASA-3). Importantly, and accordingly to many embodiments, the colors of the solutions comprising the same mechanically activated macromolecular mechanophore platform vary widely from pink ($\lambda_{max}$=525 nm) to purple ($\lambda_{max}$=570 nm) to blue ($\lambda_{max}$=609 nm), depending on the identity of the secondary amine used in the "developing" step (also see FIG. 7I for further reference). On the other hand, the absorption spectra obtained for mechanically inert PMA-Control undergoing the same treatment are indistinguishable from the experiments with blank solutions in all instances, thus confirming the critical role of mechanochemical activation in obtaining the chromogenic response from the macromolecular mechanophore platforms of the instant disclosure.

Figure 8A:
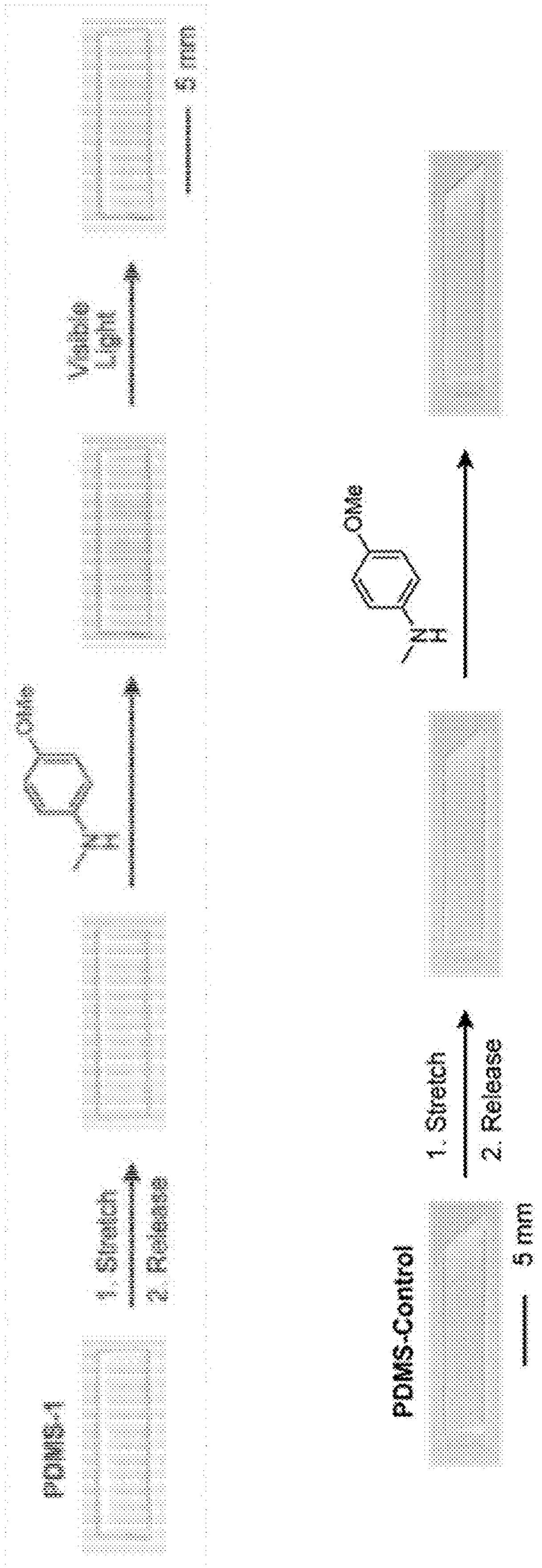
Figure 8B:
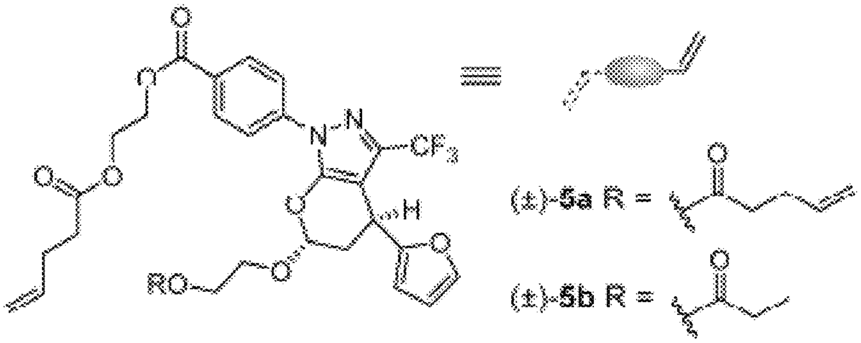
Figure 8C:
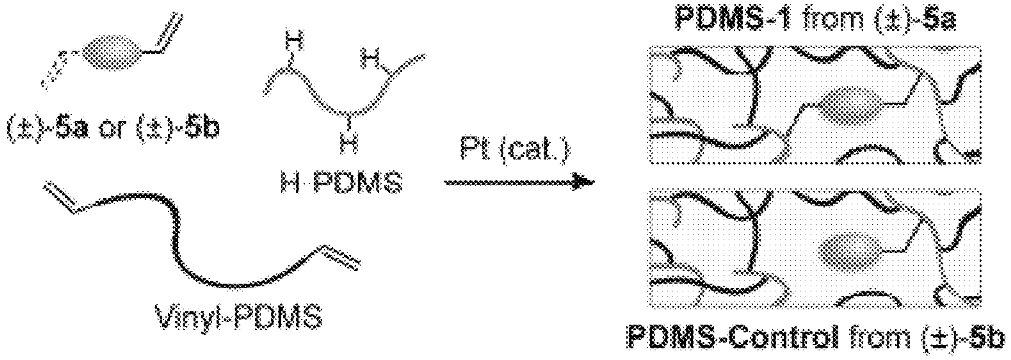

Mechanochemical Activation and Chromogenic Reactivity of the Macromolecular Mechanophore Platform in Solid Phase In many embodiments, the macromolecular mechanophore platform is used to provide a chromogenic response in solid state, as illustrated, for example, in FIGS. 8A through 8H. More specifically, FIG. 8A illustrates the mechanochemical activation and the chromogenic behavior of the macromolecular mechanophore platform of many embodiments in bulk polymeric materials, wherein, in this particular example, the macromolecular mechanophore platform (here, PDMS-1) is incorporated into a polymer/elastomer film mechanically activated via stretching, according to some embodiments, and subsequently color-"developed" with the developing agent comprising a secondary amine of choice. FIGS. 8B and 8C schematically illustrate one approach to incorporating the macromolecular mechanophore platform into a bulk polymer according to some embodiments, wherein the hetero-Diels-Alder adduct of the macromolecular mechanophore platform is equipped with two crosslinkable functional groups, such as, for example, vinyl groups, for enabling covalent crosslinking of the hetero-Diels-Alder adduct into a polymeric material of choice. In the particular example shown in FIGS. 8B and 8C, but also according to many embodiments, hetero-Diels-Alder adduct (±)-5a was incorporated into elastomeric PDMS materials (2.5 wt % loading) via platinum catalyzed hydrosilylation to obtain the macromolecular mechanophore platform PDMS-1 as a polymer film. In addition, mechanically inert PDMS-Control film was also prepared according to the same methods and procedures from monofunctional molecule (±)-5b equipped with only one terminal vinyl group to use in comparison/control studies.

Figure 7I:
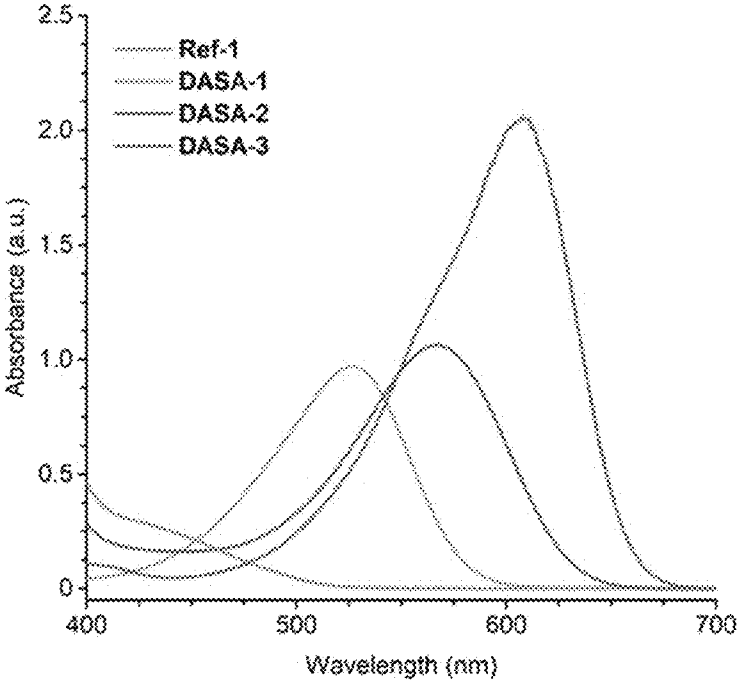

As can be seen from FIG. 8A, both PDMS-1 (FIG. 8A, top) and PDMS-Control (FIG. 8A, bottom) films are optically clear and colorless. Furthermore, application of tensile force to a strip of PDMS-1 (comprising the hetero-Diels-Alder adduct which is fully polymer-embedded via two attachment points as illustrated in FIG. 8C) produced no discernable change in color. However, immersion of this mechanically activated material into a developing solution comprising 4-methoxy-N-methylaniline as the secondary amine developing agent (7.3 mM in 9:1 DCM/HFIP) according to many embodiments, generates a blue-green color selectively in the gauge region of the film (FIG. 8A, top). Notably, coloration of the PDMS-1 film may also be imperceptible after the initial stretching prior to the chromogenic developing step with a secondary amine agent, however, this weak coloration is likely due to, although not to be bound by any theory, the relatively low absorptivity of the activated furan generated from the hetero-Diels-Alder adduct, especially as compared to absorptivity of the color-developed conjugated triene DASA species (FIG. 7I). Also notably, no change in color is produced in PDMS-Control films upon stretching and subsequent exposure to the secondary amine developing agent, as seen in FIG. 8A (bottom), which confirms the critical role of the mechanical force activation for the functioning of the macromolecular mechanophore platform of the instant disclosure, wherein the mechanical force must be properly transferred across the Diels-Alder adduct mechanophore to induce the formal retro-Diels-Alder reaction and reveal the activated furan.

Figure 8D:
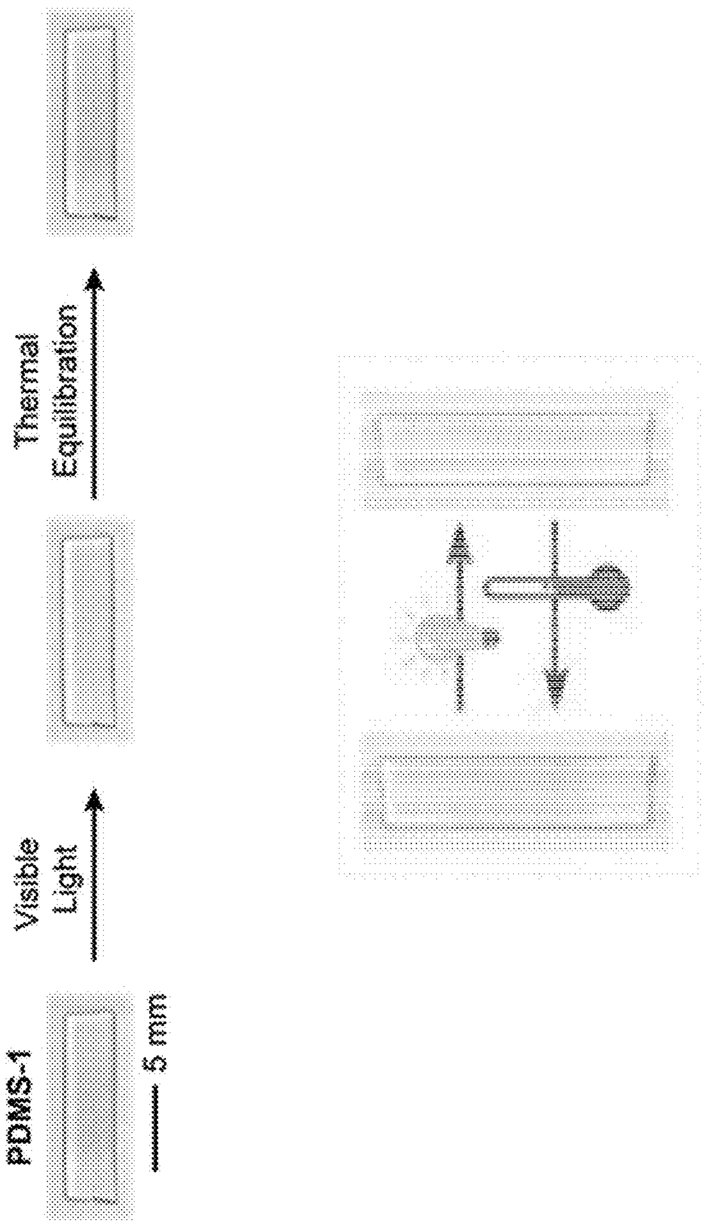

Furthermore, the blue-green coloration of the PDMS-1 film that was activated and developed with 4-methoxy-N-methylaniline (FIG. 8A, top) is, according to many embodiments, reversibly photobleachable by irradiation with visible light, wherein the colored conjugated triene species rapidly (within seconds) regenerate upon removal of the light source (here, under ambient conditions) as shown in FIG. 8D. Accordingly, in many embodiments, the mechanically activated and color-developed macromolecular mechanophore platforms possess photoswitching properties (such as described, for example, in Clerc, M. et al. Donor-Acceptor Stenhouse Adduct-Polydimethylsiloxane-Conjugates for Enhanced Photoswitching in Bulk Polymers. *Macromol. Rapid Commun.* 43, 2200120 (2022), the disclosure of which is incorporated herein by reference).

Figure 8E:
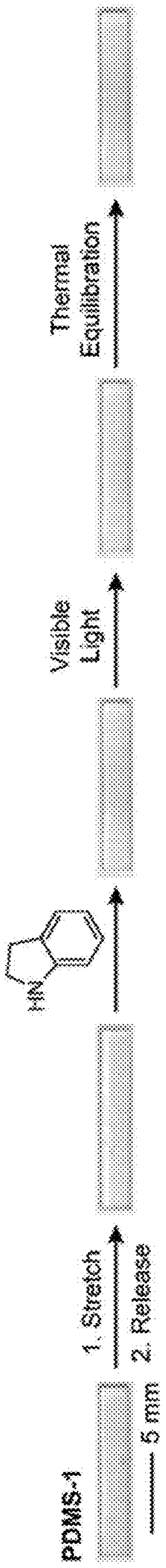
Figure 8F:
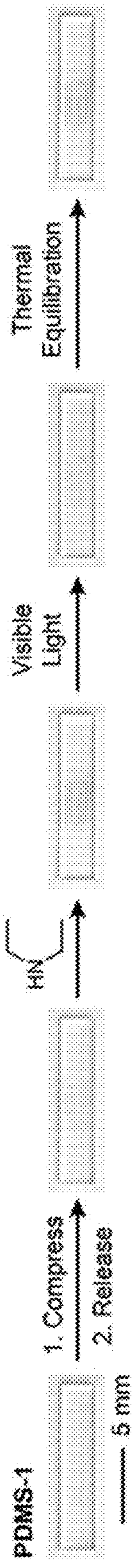
Figure 8G:
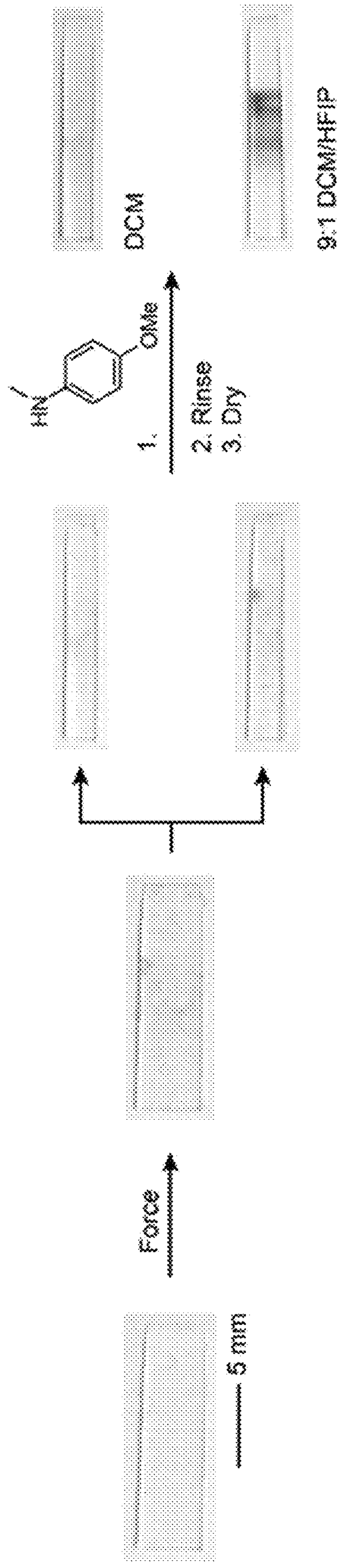
Figure 8H:
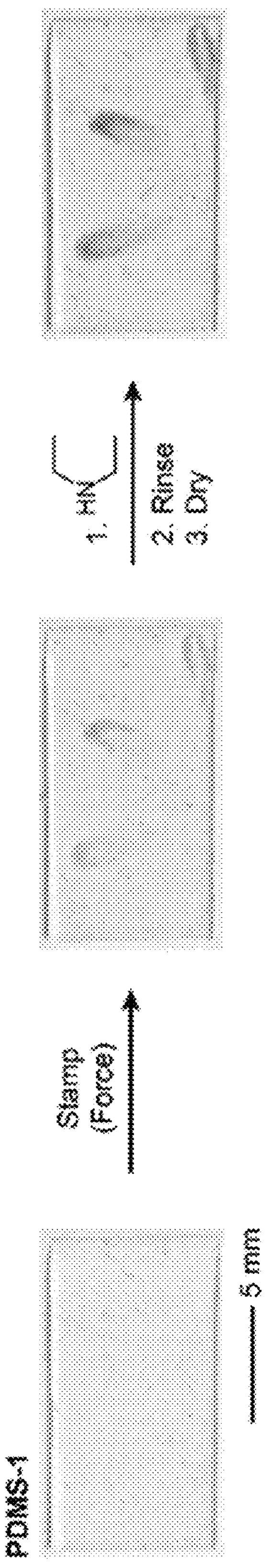

In addition, FIGS. 8E and 8F show analogous experiments performed using indoline and diethylamine, respectively, as the secondary amine developing agents. In these experiments, distinct and prominent coloration was also successfully achieved in the films comprising the macromolecular mechanophore platform of many embodiments. Notably, HFIP advantageously promotes rapid and efficient reaction between the activated furan and secondary arylamines to produce the desired colored DASA product comprising the conjugated triene scaffold of many embodiments, as illustrated by FIG. 8G. On the other hand, in many embodiments, especially wherein the developing agent comprises dialkyl amines as the secondary amine, such as, for example, diethylamine, no additional reagents or even solvents are required to achieve successful color development, wherein such secondary amines are applied neat in the gas phase to achieve corresponding coloration in the films comprising the activated macromolecular mechanophore platform of the instant disclosure, as illustrated by FIG. 8H.

Figure 9:
FIG. 9 schematically illustrates the mechanochemical multicolor soft lithography process of Spatiotemporally Templated Activation for Mechanochemical Multicolor Printing (STAMMP) wherein a multi-colored image is produced within a single material/object with iterative localized compression followed by pattern development with various secondary amines, in accordance with embodiments of the invention.
Figure 10:
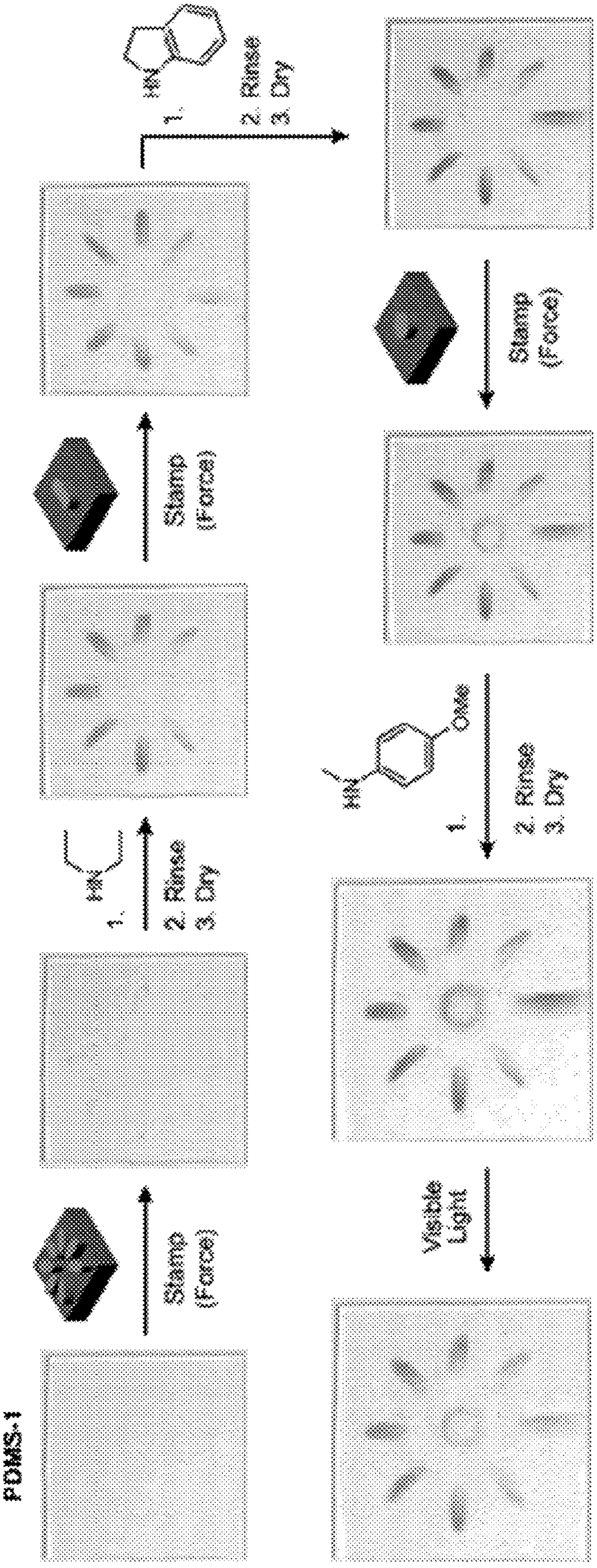
FIG. 10 illustrates the STAMMP process with schematics and photographs, wherein a STAMMP sequence was applied to PDMS-1 to obtain a complex multicolor image of a flower, and followed by partially photobleaching of the flower upon irradiation with visible light, in accordance with embodiments of the invention.
Figure 11:
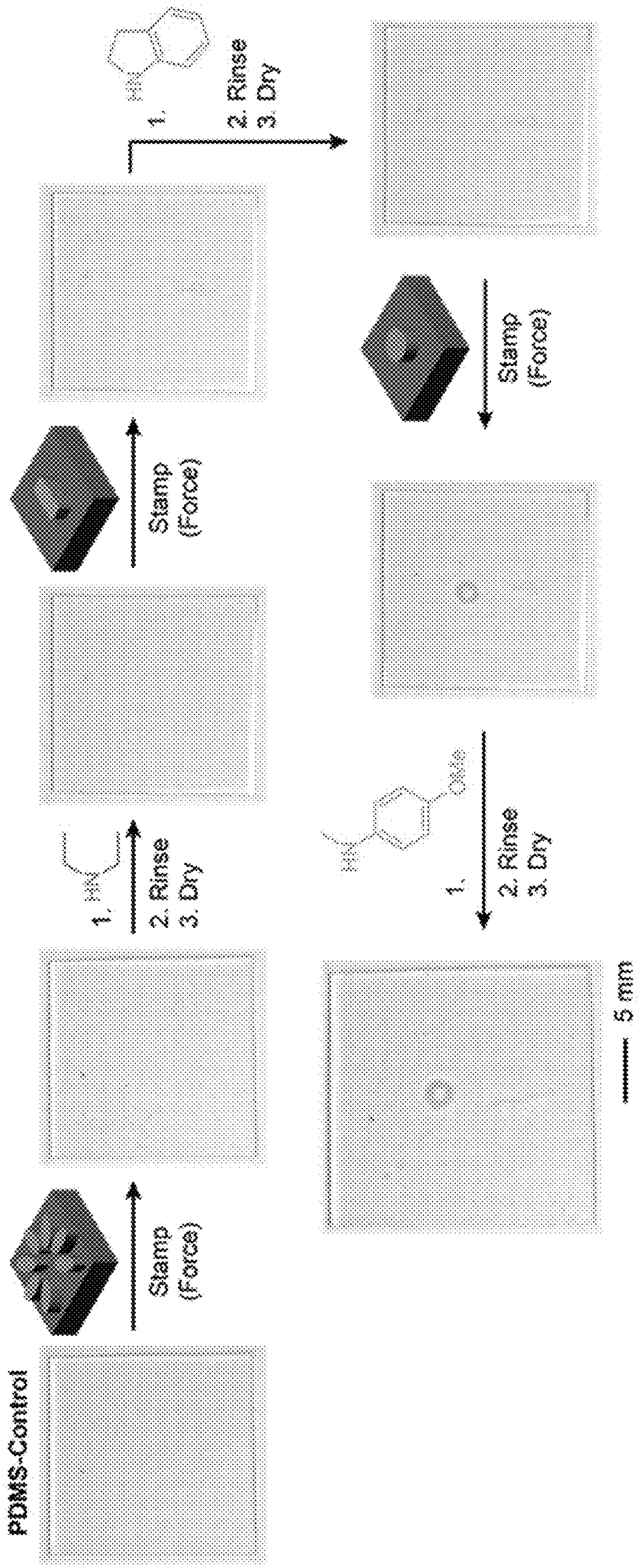
FIG. 11 provides schematics and photographs to illustrate that no coloration is obtained from a STAMMP sequence applied to a 2×2 $cm^2$ film sample of mechanically inert PDMS-Control; and also shows that some irreversible deformation of the film is apparent after the second and third stamp applications, in accordance with embodiments of the invention.

Mechanochemical Multicolor Soft Lithography with the Macromolecular Mechanophore Platform In many embodiments, the mechanically gated chromogenic reactivity of the macromolecular mechanophore platform enables patterning of soft materials. For example, in some embodiments, the patterning of a soft/elastomeric material comprising the macromolecular mechanophore platform of the instant disclosure is accomplished by an iterative process, wherein the localized application of compressive force, such as, for example, may be afforded by using a patterned stamp, to the elastomeric material generates the activated furan of the macromolecular mechanophore platform with spatiotemporal precision provided by the pattern of the stamp, wherein the pattern is next "developed" by treatment with an appropriate secondary amine to generate a colored species in the regions of mechanical activation. As a further example, FIG. 9 schematically illustrates such Spatiotemporally Templated Activation for Mechanochemical Multicolor Printing (STAMMP) process of many embodiments. In this particular example, a production of a tri-color flower image is achieved by using three different stamps and three different secondary amines as the developing agents. Furthermore, FIG. 10 illustrates an even more specific example of STAMMP of many embodiments by providing the schematics and actual images of the STAMMP sequence performed with help of a hydraulic press and various 3D-printed stamps to print a composite image of a flower into a 4 $cm^2$ film of PDMS-1. In this particular example, a first stamp embossed with a flower petal pattern was first applied with force/pressure to a square of PDMS-1 film, generating a yellow-colored pattern corresponding to the activated furan being generated within PDMS-1 in the regions of compression. Here, it should be noted, that, although not to be bound by any theory, the lack of discernable orange color in PDMS-1 film after stretching (FIG. 8A, top), as opposed to the observable orange color after stamping, is believed to be due to low activation of the Diels-Alder adduct mechanophore under simple stretching conditions, wherein simple stretching (combined with comparatively low absorptivity of the activated furan) does not release sufficient amount of the activated furan to afford discernable orange color. In contrast, highly localized and, thus, more efficient application of force by stamping affords sufficient amount of the activate furan to produce visible coloration of the material even prior to any further color-developing steps. Next, the thus obtained film was immersed in a solution of a first secondary amine-diethylamine (0.5 vol % in DCM) for 90 s, which converted the activated furan to the corresponding DASA and, consequently, transformed the color of the petal pattern from yellow to purple. Next, after rinsing the film repeatedly with DCM to remove any excess of the first secondary amine and drying the film in vacuo, the STAMMP sequence of local mechanical activation with compression (embossing) and color-developing was repeated twice more using a second and a third stamps to form the flower stem and the center of the flower, respectively, which were, respectively and in turn, developed using a second and a third secondary amines—indoline (affording blue color) and 4-methoxy-N-methylaniline (affording green color) in 4:1 DCM/HFIP (FIG. 10). Accordingly, in many embodiments, the color-producing reaction between the activated furan and secondary amines to form colored conjugated triene adduct species proceeds efficiently and with complete conversion of the mechanochemically generated activated furan under the reaction conditions described herein. Moreover, the identical procedures applied to an identical film but comprising mechanically inert PDMS-Control did not produce any image, as expected, as seen in FIG. 11, further confirming the critical role of the mechanical force activation for the functioning of the macromolecular mechanophore platform of the instant disclosure, wherein the mechanical force must be properly transferred across the Diels-Alder adduct mechanophore to induce the formal retro-Diels-Alder reaction and reveal the activated furan.

Furthermore, in many embodiments, the polymeric materials comprising the macromolecular mechanophore platform of the instant disclosure and patterned according to the methods described herein, including via STAMMP process described herein, retain the photoswitching capabilities expected of the corresponding conjugated triene DASA products obtained from the reaction between the activated furan and secondary amines. For example, as shown in FIG. 10, it was possible to at least partially photobleach the flower image obtained via the STAMMP sequence provided in FIG. 10 upon irradiation with visible light. Here, it should be noted that the observed incomplete photoisomerization (especially as compared to the more cleanly photobleached examples shown in FIGS. 8A, 8D, 8E, and 8F, wherein the mechanical activation was achieved by less specifically localized tension) likely, although not to be bound by any theory, reflects the relatively high local concentration of the conjugated triene adduct species afforded by the more localized and efficient application of activating mechanical force delivered by stamping, which ultimately affects the photoisomerization kinetics of the activated and color-developed product (as discussed in Lui, B. F. et al. Unusual concentration dependence of the photoisomerization reaction in donor-acceptor Stenhouse adducts. *Photochem. Photobiol. Sci.* 18, 1587-1595 (2019), the disclosure of which is incorporated herein by reference).

Figure 12A:
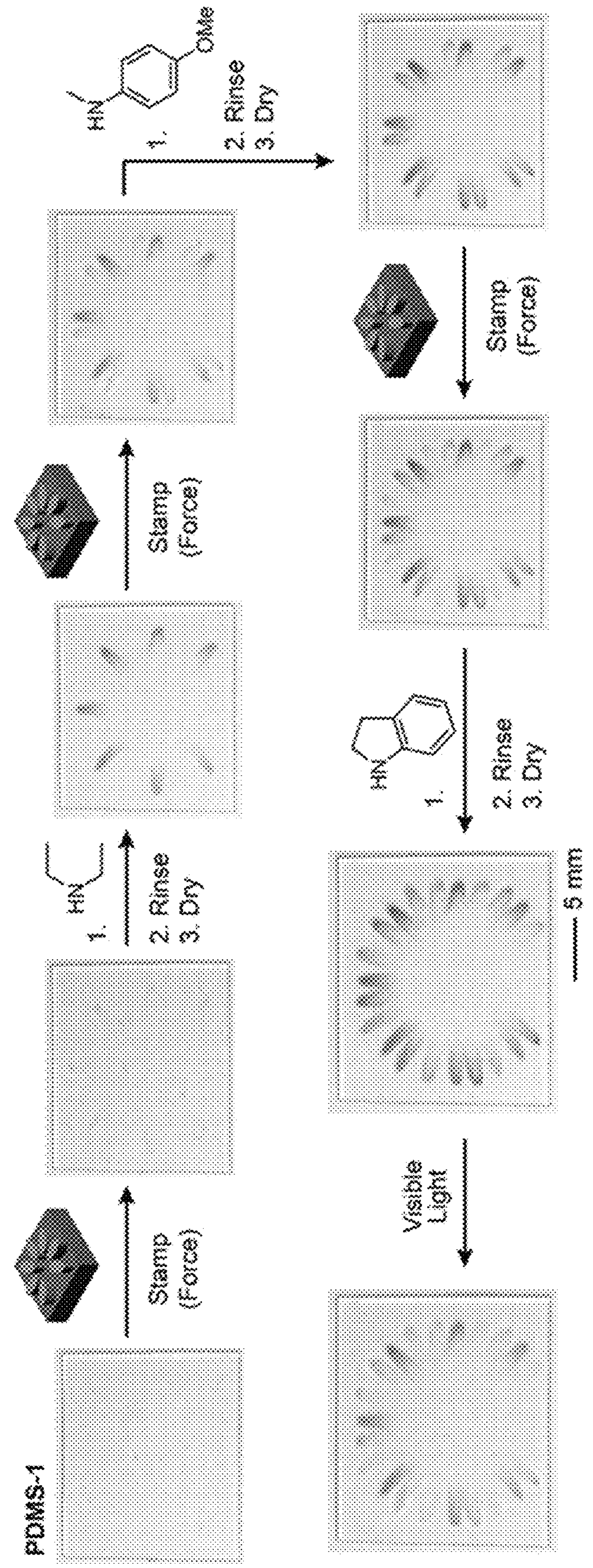
FIG. 12A illustrates, with schematics and photographs, a STAMMP sequence followed by photoswitching of the resulting image, wherein STAMMP utilizing various secondary amines was applied to a 2×2 $cm^2$ PDMS-1 film (2.5 wt % of mechanophore crosslinker (±)-5a) to obtain a complex multicolor image, and followed by irradiation/photobleaching of the obtained image with visible light for 30 s; while FIG. 12B provides photographs of this partially photobleached image taken at various times, while the image-bearing film was allowed to thermally equilibrate, wherein the photographs illustrate distinct reversion kinetics for different conjugated triene colored products obtained from using different secondary amine developing agents—the conjugated triene Donor-Acceptor Stenhouse Adduct (DASA) generated using diethylamine (a) did not fully convert to the colorless form under visible light irradiation, the conjugated triene generated from 4-methoxy-N-methylaniline (b) exhibited significant thermal reversion to the colored triene form after only 30 s, while the conjugated triene generated from indoline (c) reverted to the colored triene isomer more slowly than b, in accordance with embodiments of the invention.
Figure 12B:
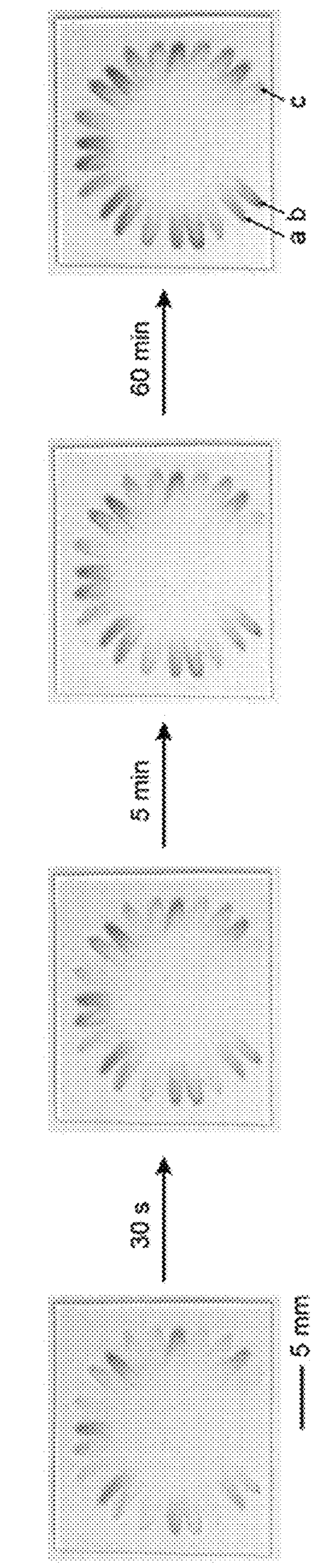

In many embodiments, the photoswitching capabilities and kinetics of the polymeric materials comprising the macromolecular mechanophore platform of the instant disclosure and patterned according to the methods described herein, including via STAMMP process described herein, depend on the identity of the conjugated triene adduct afforded by the reaction of the activated furan and the secondary amine developing agent, i.e., on the identity of the secondary amine used as the developing agent. For example, FIG. 12A illustrates a STAMMP sequence that uses three different secondary amines as developing agents and affords a complex tri-color flower image amenable to at least partial photobleaching upon exposure to visible light (here, for 30 s), while FIG. 12B highlights the different color-reversion kinetics afforded by each color component of the pattern following the photobleaching and thermal equilibration. More specifically, here, the purple colored conjugated triene adduct afforded by use of diethylamine as the developing agent (labeled a in FIG. 12B, rightmost image) does not fully convert to the colorless species under visible light irradiation; the conjugated triene adduct generated from use of 4-methoxy-N-methylaniline as the developing agent (b) is significantly photobleached under visible light irradiation and exhibits significant reversion back to the colored conjugated triene species after only 30 s; the conjugated triene adduct generated from indoline (c) is significantly photobleached under visible light irradiation and reverts to the colored conjugated triene species more slowly than b. Accordingly, in many embodiments, the macromolecular mechanophore platform enables mechanochemical multicolor soft lithography, wherein mechanical activation through localized compression reveals the activated furan that can be next chromogenically differentiated to produce a diverse range of colored dyes within the same material/object simply by treatment with different secondary amines. In many embodiments, the said dyes can also exhibit photoswitching capabilities.

Figure 13:
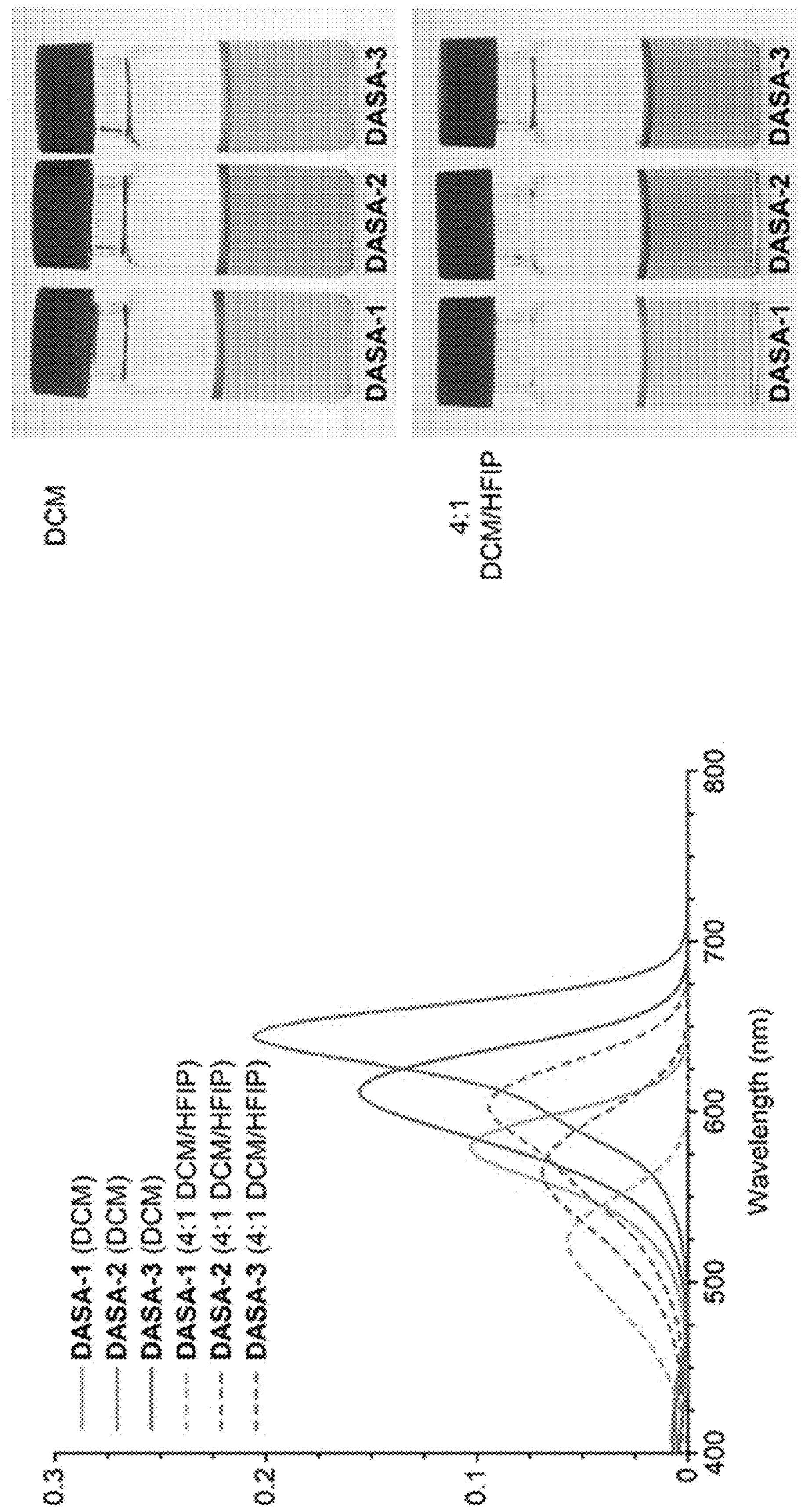
FIG. 13 illustrates environment dependence of the coloration afforded by the macromolecular mechanophore platform developed with different secondary amines by providing absorption spectra (left) and photographs (right) for various DASA dyes (products of the reaction between the activated furan and a given secondary amine) in different solvent environments (i.e., DCM and in 4:1 DCM/HFIP), wherein the corresponding dye concentrations are 10 μM in DCM; 8 μM in DCM/HFIP, in accordance with embodiments of the invention.
Figure 14:
FIG. 14 illustrates the solvatochromic properties and accompanying color changes, as well as stability under ambient conditions, of a mechanically printed and color-developed PDMS-1 film, wherein the film was wetted, dried, and re-wetted with 4:1 DCM/HFIP, in accordance with embodiments of the invention.

It should be noted here, that, according to many embodiment, the colors afforded by the instant methods are also strongly dependent on the environment surrounding the conjugated triene adduct products of the reaction between the activated furan and the various secondary amine developing agents (as discussed in, for example, Sroda, M. M., et al. Donor-Acceptor Stenhouse Adducts: Exploring the Effects of Ionic Character. *Chem. Eur. J.* 27, 4183-4190 (2021), the disclosure of which is incorporated herein by reference). For example, in many embodiments, the same macromolecular mechanophore platform, generating the same activated furan upon mechanical activation, and developed with the same secondary amine developing agent, produces different coloration in different solvent environments, as illustrated by FIG. 12. Furthermore, in many embodiments, the same macromolecular mechanophore platform, generating the same activated furan upon mechanical activation, and developed with the same secondary amine developing agent, produces different coloration, depending on whether the Diels-Alder adduct mechanophore is incorporated into and used within a solid state (e.g., polymeric material) or in solution, wherein, for example, the composition of the polymeric material might have much different polarity from that of the corresponding DCM/HFIP solvent mixture used for the solution phase-type application. Moreover, as yet another example, the polymeric material incorporating the macromolecular mechanophore platform may further contain additives and solvent, such as, for example, employed in swelling of polymeric materials (e.g., elastomeric films), which may also affect the color of the polymeric material upon developing with the secondary amine developing agent, due to such additives and solvents imparting their particular physical and or chemical characteristics to the overall environment of the mechanophore platform contained within. As a more specific example, FIG. 13 illustrates the solvatochromic properties of a mechanically printed and color-developed elastomeric film comprising PDMS-1, as well as the stability of the mechanically activated and color-developed PDMS-1 under ambient conditions. In this example, wetting of the film with 4:1 DCM/HFIP caused an observable color change, consistent with the expected solvatochromic behavior of the color-developed macromolecular mechanophore platform. However, the color change observed upon solvation of the film was reversed upon drying (FIG. 13). Notably, some discoloration was observed upon storage of the patterned film under ambient room light, temperature, and atmosphere, nevertheless, re-wetting of the same film by re-immersion in 4:1 DCM/HFIP after 20 h on the benchtop still led to a reversible color change, indicating persistence of a significant population of conjugated triene adduct species.

Accordingly, in many embodiments, the macromolecular mechanophore platform of the instant application with mechanically gated multicolor chromogenic capabilities comprises the Diels Alder adduct, which, in turn, comprises the masked activated furan, such that mechanical force supplied to the polymer embedded Diels Alder adduct promotes a formal retro-Diels-Alder reaction to reveal the activated furan, making it available to subsequent reaction (i.e., "development") with a secondary amine to produce the intensely colored dye/photoswitch of many embodiments. In some embodiments, the macromolecular mechanophore platform is used in solution. In many such embodiments, the mechanical activation is achieved by ultrasonication of a solution comprising the macromolecular mechanophore platform, and followed by solution-based developing/reacting with a secondary amine of choice. However, in some other embodiments, the macromolecular mechanophore platform is incorporated into a polymeric material and is used in solid phase. In many such embodiments, the mechanical activation is achieved by tension/compression of the polymeric material comprising the macromolecular mechanophore platform, and followed by color-developing exposure to a secondary amine of choice. In many embodiments, the chromogenic response of the macromolecular mechanophore platform is highly dependent upon the identity of the secondary amine developing agent, and, thus, a wide variety of dyes/photoswitches with diverse photophysical and photochemical properties are generated from a single macromolecular mechanophore platform, which, in turn, can be obtained from commercially available starting materials, in as few as 6 steps or less. In many embodiments, the macromolecular mechanophore platform enables mechanochemical multicolor soft lithography, whereby a complex multicolor composite image is printed into a polymer comprising the macromolecular mechanophore platform through an iterative sequence of localized compression and development with various secondary amines, such as, for example, via described herein STAMMP process. In many such embodiments, the multicolor soft lithography methods described herein, including STAMMP methods, achieve three-dimensional pattern formation in the bulk of the material being patterned, which is in stark and advantageous contrast to many other currently available soft lithography approaches that are primarily limited to surface only functionalization (such as, for example, described in: Xia, Y. & Whitesides, G. M. Soft Lithography. *Angew. Chem. Int. Ed.* 37, 550-575 (1998); and Mei, Y. et al. Mechanochemical Lithography. *J. Am. Chem. Soc.* 144, 9949-9958 (2022), the disclosures of which are incorporated herein by reference). In many embodiments, the macromolecular mechanophore platform affords unprecedented spatiotemporal control and chemical structure modularity for dye formation using mechanical force. In many embodiments, the macromolecular mechanophore platform enables a diverse range of patterning, encryption, and sensing applications. As such, in many embodiments, the macromolecular mechanophore platform of the instant application, together with the photoswitching species having unique photophysical properties it functionally affords, empower the creation of new materials with complex stimuli-responsive functionality.

Exemplary Embodiments

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is number average molecular weight, temperature is in degrees Celsius, and pressure is at or near atmospheric.

General Experimental Details

Reagents from commercial sources were used without further purification unless otherwise noted. Methyl acrylate was passed through a short plug of basic alumina to remove inhibitor immediately prior to use. Dry THE and DCM were obtained from a Pure Process Technology solvent purification system. All reactions were performed under a $N_2$ atmosphere unless specified otherwise. Column chromatography was performed on a Biotage Isolera system using SiliCycle SiliaSep HP flash cartridges.

NMR spectra were recorded using a 400 MHz Bruker Avance III HD with Prodigy Cryoprobe or a 400 MHz Bruker Avance Neo. All $^1H$ NMR spectra are reported in δ units, parts per million (ppm), and were measured relative to the signals for residual chloroform (7.26 ppm) or toluene (2.09 ppm) in deuterated solvent. All $^{13}C$ NMR spectra were measured in deuterated solvents and are reported in ppm relative to the signals for chloroform (77.16 ppm). Multiplicity and qualifier abbreviations are as follows: s=singlet, d=doublet, t=triplet, q=quartet, m=multiplet.

High resolution mass spectra (HRMS) were obtained from a JEOL JMS-T2000GC AccuTOF™ GC-Alpha spectrometer equipped with a field desorption (FD) ionization source.

Analytical gel permeation chromatography (GPC) was performed using an Agilent 1260 series pump equipped with two Agilent PLgel MIXED-B columns (7.5×300 mm), an Agilent 1200 series diode array detector, a Wyatt 18-angle DAWN HELEOS light scattering detector, and an Optilab rEX differential refractive index detector. The mobile phase was THE at a flow rate of 1 mL/min. Molecular weights and molecular weight distributions were calculated by light scattering using a dn/dc value of 0.062 mL/g (25° C.) for poly(methyl acrylate).

UV-vis absorption spectra were recorded on a Thermo Scientific Evolution 220 spectrometer.

Ultrasound experiments were performed inside a sound abating enclosure using a Vibra Cell 505 liquid processor equipped with a 0.5-inch diameter solid probe (part #630-0217), sonochemical adapter (part #830-00014), and a Suslick reaction vessel made by the Caltech glass shop (analogous to vessel #830-00014 from Sonics and Materials).

Elastomer compression experiments were performed using a Carver hydraulic press (model #3912) applying a force of ≤0.5 ton. Photographs were captured using a Canon Rebel SL3 with a 100 mm macro lens and corrected for exposure in Adobe Photoshop. Visible light irradiation was performed using the flashlight of an iPhone 8 or a Pro Tango U2 LED flashlight (1100 lumen).

Compound 1 was synthesized following the procedure reported in the literature.

Synthetic Details

Synthesis of Hetero-Diels-Alder Mechanophore Diol (±)-3

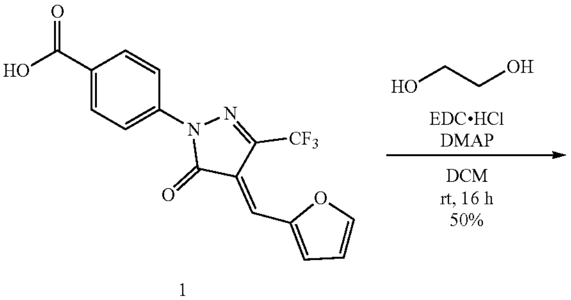

1

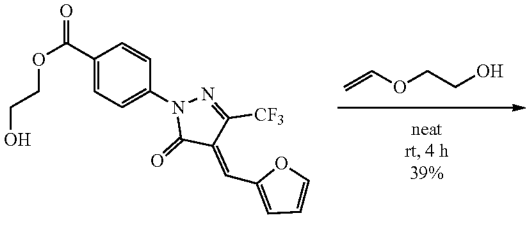

2

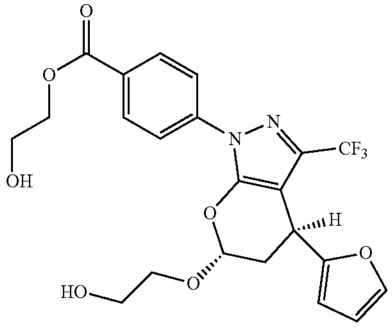

(±)-3

2-hydroxyethyl 4-(4-(furan-2-ylmethylene)-5-oxo-3-(trifluoromethyl)-4,5-dihydro-1H-pyrazol-1-yl)benzoate (2). A round bottom flask equipped with a stir bar was charged with 1 (523 mg, 1.49 mmol) and DCM (20 mL). Ethylene glycol (0.8 mL, 14.3 mmol) was added, and the reaction was cooled to 0° C. in an ice/water bath followed by the addition of EDC·HCl (345 g, 1.80 mmol) and 4-dimethylaminopyridine (12.9 mg, 0.106 mmol). The reaction was capped under an atmosphere of air and allowed to warm to room temperature slowly. After stirring for 21 h, the crude reaction mixture was eluted through a plug of silica gel with EtOAc to provide the title compound as an orange solid (294 mg, 50%). TLC (EtOAc): $R_f$=0.78. $^1H$ NMR (400 MHz, $CDCl_3$) δ: 8.92 (d, J=3.9 Hz, 1H), 8.25-8.06 (m, 4H), 7.91 (dd, J=1.7, 0.6 Hz, 1H), 7.76-7.67 (m, 1H), 6.83 (ddd, J=3.9, 1.7, 0.8 Hz, 1H), 4.57-4.40 (m, 2H), 4.06-3.89 (m, 2H). $^{13}C\{^1H\}$NMR (101 MHz, $CDCl_3$) δ: 166.5, 161.7, 151.3, 150.9, 141.8, 141.1 (q, $J_{CF}$=37.4 Hz), 132.2, 131.0, 128.7, 126.9, 119.8 (q, $J_{CF}$=287.9 Hz), 118.6, 116.0, 115.4, 66.9, 61.7. HRMS (FD, m/z): calcd for $[C_{18}H_{13}N_2O_5F_3]^+$ $(M)^+$, 394.0771; found 394.0767.

2-hydroxyethyl 4-((4S,6R)-4-(furan-2-yl)-6-(2-hydroxyethoxy)-3-(trifluoromethyl)-5,6-dihydropyrano[2,3-c]pyrazol-1(4H)-yl)benzoate ((±)-3). A round bottom flask equipped with a stir bar was charged with 2 (247 mg, 0.512 mmol) and ethylene glycol vinyl ether (1.5 mL, 16.9 mmol). The reaction was capped under an atmosphere of air and stirred at room temperature. After 2.5 h, the reaction was diluted with 150 mL of $CHCl_3$ and stirred for an additional 2 h. The reaction was concentrated under reduced pressure and the products were separated by silica gel chromatography (0-40% EtOAc/DCM with 2% MeOH) to provide the title compound as a foamy white solid (117 mg, 39% yield). The structure of (±)-3 was confirmed by single crystal X-ray diffraction. TLC (5% MeOH/DCM): $R_f$=0.25. $^1H$ NMR (400 MHz, $CDCl_3$) δ: 8.17 (d, J=8.1 Hz, 2H), 7.94 (d, J=8.0 Hz, 2H), 7.35 (s, 1H), 6.32 (d, J=2.9 Hz, 1H), 6.12 (d, J=2.9 Hz, 1H), 5.60-5.51 (m, 1H), 4.50 (t, J=4.0 Hz, 2H), 4.37 (t, J=6.2 Hz, 1H), 4.00 (dt, J=8.0, 4.5 Hz, 3H), 3.82 (d, J=8.2 Hz, 3H), 2.52-2.24 (m, 2H). $^{13}C\{^1H\}$ NMR (101 MHz, $CDCl_3$) δ: 166.2, 154.2, 149.6, 142.1, 141.5, 139.9 (q, $J_{CF}$=38.3 Hz), 131.0, 128.2, 120.9 (q, $J_{CF}$=270.7 Hz), 120.4, 110.4, 107.1, 102.6, 97.4, 71.5, 66.9, 61.5, 61.2, 33.2, 27.3. HRMS (FD, m/z): calcd for $[C_{22}H_{21}N_2O_7F_3]^+$ $(M)^+$, 482.1295; found 482.1306.

Synthesis of Mechanophore Chain-Centered and Chain-End Control Polymers

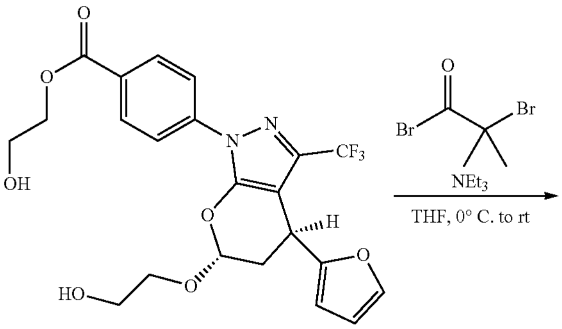

(±)-3

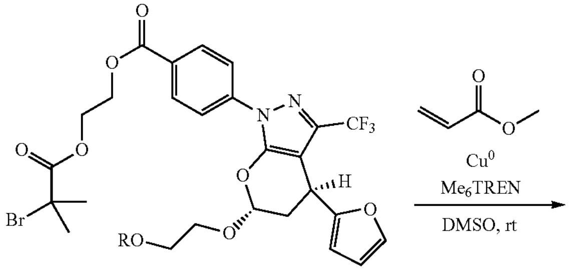

(±)-4 R =

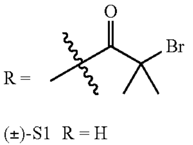

(±)-S1 R = H

-continued

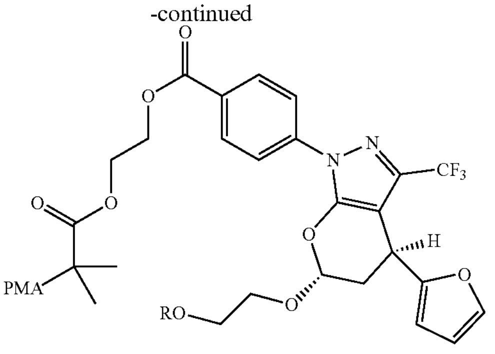

PMA-1 R =

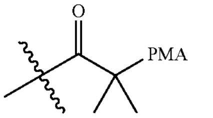

PMA-Control R = H

General Procedure A for the Esterification of Alcohols. A flame-dried two-neck flask was charged with the appropriate diol followed by dry THF, triethylamine, and 4-diaminopyridine (if applicable). The solution was cooled to 0° C. in an ice/water bath followed by addition of either α-bromoisobutyryl bromide, 4-pentenoic anhydride, or propionic anhydride. The reaction was left in the ice/water bath to warm to room temperature slowly and stirred for the indicated amount of time. The reaction mixture was then diluted with EtOAc and washed with saturated $NH_4Cl$, saturated $NaHCO_3$, and brine, dried over $Na_2SO_4$, filtered, and concentrated under reduced pressure.

2-((2-bromo-2-methylpropanoyl)oxy)ethyl 4-((4S,6R)-6-(2-((2-bromo-2-methylpropanoyl)oxy)ethoxy)-4-(furan-2-yl)-3-(trifluoromethyl)-5,6-dihydropyrano[2,3-c]pyrazol-1(4H)-yl)benzoate ((±)-4). Synthesized according to general procedure A with (±)-3 (26.9 mg, 0.0558 mmol), THF (2 mL), triethylamine (30 μL, 0.215 mmol), and α-bromoisobutyryl bromide (30 μL, 0.243 mmol). The reaction was stirred for 2.5 h and following workup, purified by eluting the crude material through a plug of basic alumina with DCM. The title compound was obtained as a clear oil (37.6 mg, 86%). TLC (50% EtOAc/hexanes): $R_f$=0.87. $^1H$ NMR (400 MHz, $CDCl_3$) δ: 8.22-8.07 (m, 2H), 7.96-7.88 (m, 2H), 7.33 (dd, J=1.8, 0.8 Hz, 1H), 6.32 (dd, J=3.2, 1.9 Hz, 1H), 6.18-6.08 (m, 1H), 5.57 (dd, J=5.1, 2.3 Hz, 1H), 4.69-4.48 (m, 4H), 4.44-4.28 (m, 3H), 4.09 (ddd, J=11.5, 5.6, 3.1 Hz, 1H), 3.94 (ddd, J=11.5, 6.7, 3.3 Hz, 1H), 2.43-2.25 (m, 2H), 1.94 (s, 6H), 1.86 (s, 3H), 1.85 (s, 3H). $^{13}C\{^1H\}$ NMR (101 MHz, $CDCl_3$) δ: 171.7, 171.6, 165.6, 154.0, 149.3, 142.1, 141.6, 139.9 (q, $J_{CF}$=38.4 Hz), 131.1, 128.1, 120.9 (q, $J_{CF}$=271.7 Hz), 120.6, 110.4, 107.2, 102.1, 97.8, 67.3, 64.3, 63.6, 62.6, 55.5, 55.4, 33.3, 30.8, 30.7, 27.2. HRMS (FD, m/z): calcd for $[C_{30}H_{31}N_2O_9F_3Br_2]^+$ $(M)^+$, 778.0343; found 778.0334.

2-((2-bromo-2-methylpropanoyl)oxy)ethyl 4-((4S,6R)-4-(furan-2-yl)-6-(2-hydroxyethoxy)-3-(trifluoromethyl)-5,6-dihydropyrano[2,3-c]pyrazol-1(4H)-yl)benzoate ((±)-S1). Synthesized according to general procedure A with (±)-3 (62.8 mg, 0.130 mmol), THE (6 mL), triethylamine (20 μL, 0.143 mmol), and α-bromoisobutyryl bromide (16.3 μL, 0.131 mmol). The reaction was stirred for 17 h. Following workup, the crude material was purified by silica gel chromatography (30-80% EtOAc/hexanes) to provide the title compound as a clear oil (9.3 mg, 11%). TLC (50% EtOAc/ hexanes): $R_f$=0.46. $^1$H NMR (400 MHz, $CDCl_3$) δ: 8.19-8.11 (m, 2H), 7.98-7.89 (m, 2H), 7.35 (dd, J=1.9, 0.8 Hz, 1H), 6.32 (dd, J=3.2, 1.9 Hz, 1H), 6.14-6.10 (m, 1H), 5.54 (dd, J=6.0, 2.2 Hz, 1H), 4.63-4.51 (m, 4H), 4.36 (t, J=6.2 Hz, 1H), 4.06-3.97 (m, 1H), 3.86-3.76 (m, 3H), 2.46-2.27 (m, 2H), 1.94 (s, 6H). $^{13}C\{^1H\}$ NMR (101 MHz, $CDCl_3$) δ: 171.7, 165.6, 154.2, 149.5, 142.1, 141.6, 140.0 (q, $J_{CF}$=38.4 Hz), 131.1, 128.1, 121.0 (q, $J_{CF}$=271.7 Hz), 120.5, 110.5, 107.2, 102.6, 97.5, 71.6, 63.6, 62.6, 61.7, 55.5, 33.3, 30.8, 27.4. HRMS (FD, m/z): calcd for $[C_{26}H_{26}N_2O_8F_3Br]^+$ $(M)^+$, 630.0819; found 630.0841.

General Procedure B for the Synthesis of Poly(Methyl Acrylate) (PMA) Polymer Containing a Chain-Centered Mechanophore. PMA polymers were synthesized by controlled radical polymerization following the procedure by Nguyen, et al. in Surface-Dependent Kinetics of Cu(0)-Wire-Catalyzed Single-Electron Transfer Living Radical Polymerization of Methyl Acrylate in DMSO at 25° C. *Macromolecules* 42, 2379-2386 (2009), the disclosure of which is incorporated herein by reference. A 25 mL Schlenk flask equipped with a stir bar was charged with initiator (±)-4 (12.8 mg, 0.0164 mmol), DMSO (3 mL), methyl acrylate (3 mL), and freshly cut copper wire (2.0 cm length, 20 gauge). The flask was sealed, the solution was deoxygenated with three freeze-pump-thaw cycles, and then allowed to warm to rt and backfilled with nitrogen. $Me_6$TREN (13 μL, 0.0486 mmol) was added via microsyringe. After stirring at rt for 1.5 h, the flask was opened to air and the solution was diluted with DCM. The polymer solution was precipitated into cold methanol (3×) and the isolated material was dried under vacuum to yield 1.77 g of PMA-1 (62%). $M_n$=125 kDa, Đ=1.15.

Synthesis of PMA-Control. Chain-end control polymer PMA-Control was synthesized using general procedure B with initiator (±)-S1 (9.3 mg, 0.0147 mmol), DMSO (3 mL), methyl acrylate (3 mL), and $Me_6$TREN (10 μL, 0.0374 mmol). Polymerization for 100 min provided the title polymer (1.59 g, 55%). $M_n$=154 kDa, Đ=1.07.

Synthesis of Mechanophore Crosslinker (±)-5a and Monofunctional Control (1)-5b

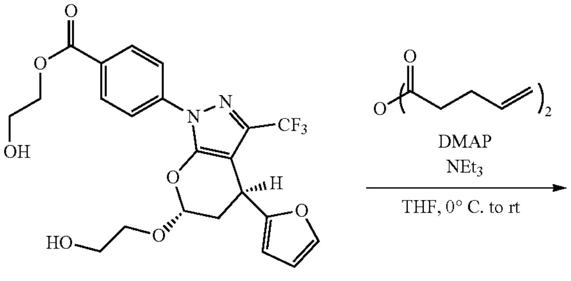

(±)-3

-continued

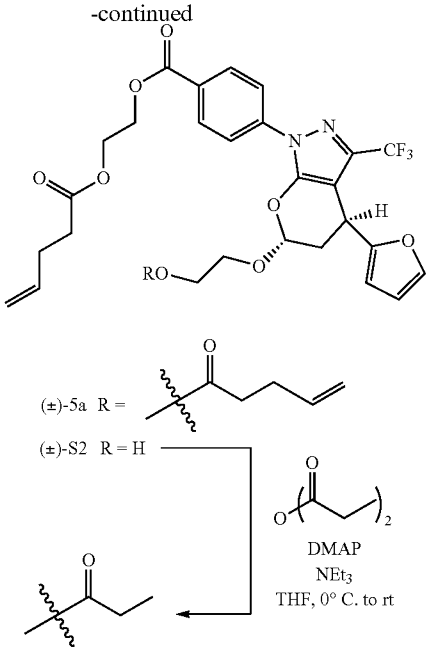

(±)-5a R =

(±)-S2 R = H (±)-5b R =

2-(pent-4-enoyloxy)ethyl 4-((4S,6R)-4-(furan-2-yl)-6-(2-(pent-4-enoyloxy)ethoxy)-3-(trifluoromethyl)-5,6-dihydropyrano[2,3-c]pyrazol-1(4H)-yl)benzoate ((±)-5a). Synthesized according to general procedure A with (±)-3 (41.4 mg, 0.0858 mmol), THF (2 mL), triethylamine (40 μL, 0.287 mmol), 4-dimethylaminopyridine (2.4 mg, 0.0196 mmol), and 4-pentenoic anhydride (50 μL, 0.274 mmol). The reaction was stirred for 17 h. After workup, the crude material was purified by silica gel chromatography (10-40% EtOAc/hexanes) to provide the title compound as a clear oil (47.9 mg, 86%). TLC (50% EtOAc/hexanes): $R_f$=0.77. $^1$H NMR (400 MHz, $CDCl_3$) δ: 8.20-8.08 (m, 2H), 7.99-7.87 (m, 2H), 7.34 (dd, J=1.9, 0.9 Hz, 1H), 6.32 (dd, J=3.2, 1.9 Hz, 1H), 6.16-6.09 (m, 1H), 5.88-5.70 (m, 2H), 5.53 (dd, J=5.5, 2.3 Hz, 1H), 5.10-4.93 (m, 4H), 4.58-4.42 (m, 4H), 4.35 (t, J=6.5 Hz, 1H), 4.31 (ddd, J=12.2, 5.9, 3.3 Hz, 1H), 4.21 (ddd, J=12.2, 6.7, 3.2 Hz, 1H), 4.06 (ddd, J=11.3, 5.9, 3.2 Hz, 1H), 3.88 (ddd, J=11.4, 6.7, 3.2 Hz, 1H), 2.50-2.43 (m, 2H), 2.43-2.26 (m, 8H). $^{13}C\{^1H\}$ NMR (101 MHz, $CDCl_3$) δ: 173.0, 172.9, 165.6, 154.1, 149.4, 142.1, 141.6, 139.9 (q, $J_{CF}$=38.4 Hz), 136.6, 136.5, 131.0, 128.2, 120.9 (q, $J_{CF}$=27.7 Hz), 120.5, 115.8, 115.7, 110.4, 107.2, 102.1, 97.7, 67.7, 63.1, 62.8, 62.1, 33.5, 33.3, 33.2, 28.9, 28.8, 27.3. HRMS (FD, m/z): calcd for $[C_{32}H_{33}N_2O_9F_3]^+$ $(M)^+$, 646.2133; found 646.2124.

2-(pent-4-enoyloxy)ethyl 4-((4S,6R)-4-(furan-2-yl)-6-(2-hydroxyethoxy)-3-(trifluoromethyl)-5,6-dihydropyrano[2,3-c]pyrazol-1(4H)-yl)benzoate ((±)-S2). Synthesized according to general procedure A with (±)-3 (45.1 mg, 0.0935 mmol), THE (3 mL), triethylamine (40 μL, 0.287 mmol), 4-dimethylaminopyridine (2.5 mg, 0.0205 mmol), and 4-pentenoic anhydride (30 μL, 0.164 mmol). The reaction was stirred for 14 h. After workup, the crude material was purified by silica gel chromatography (30-100% EtOAc/hexanes) to provide the title compound as a clear oil (13.0 mg, 17%). TLC (50% EtOAC/hexanes): $R_f$=0.37. $^1$H NMR (400 MHz, $CDCl_3$) δ: 8.20-8.10 (m, 2H), 7.97-7.90 (m, 2H), 7.35 (dd, J=1.9, 0.9 Hz, 1H), 6.32 (dd, J=3.3, 1.9 Hz, 1H), 6.15-6.08 (m, 1H), 5.89-5.74 (m, 1H), 5.54 (dd, J=6.0, 2.3 Hz, 1H), 5.11-4.93 (m, 2H), 4.57-4.51 (m, 2H), 4.47-4.43

(m, 2H), 4.36 (t, J=6.2 Hz, 1H), 4.07-3.96 (m, 1H), 3.88-3.74 (m, 3H), 2.51-2.28 (m, 6H). $^{13}C\{^1H\}$ NMR (101 MHz, $CDCl_3$) δ: 173.0, 165.7, 154.2, 149.5, 141.6, 140.0 (q, $J_{CF}$=38.4 Hz), 136.6, 131.1, 128.2, 121.0 (q, $J_{CF}$=271.7 Hz), 120.5, 115.9, 110.4, 107.2, 102.6, 97.5, 71.5, 63.1, 62.2, 61.7, 33.5, 33.3, 28.9, 27.4. HRMS (FD, m/z): calcd for $[C_{27}H_{27}N_2O_8F_3]^+$ $(M)^+$, 564.1714; found 564.1732.

2-(pent-4-enoyloxy)ethyl 4-((4S,6R)-4-(furan-2-yl)-6-(2-(propionyloxy)ethoxy)-3-(trifluoromethyl)-5,6-dihydropyrano[2,3-c]pyrazol-1(4H)-yl)benzoate ((±)-5b). Synthesized according to general procedure A with (±)-S2 (35.2 mg, 0.0624 mmol), THE (6 mL), triethylamine (20 μL, 0.143 mmol), 4-dimethylaminopyridine (1.5 mg, 0.0123 mmol), and propionic anhydride (16 μL, 0.124 mmol). The reaction was stirred for 3 h. After workup, the crude reaction mixture was purified by silica gel chromatography (10-30% EtOAc/hexanes) to provide the title compound as a colorless oil (32.7 mg, 84%). TLC (25% EtOAC/hexanes): $R_f$=0.32. $^1H$ NMR (400 MHz, $CDCl_3$) δ: 8.18-8.10 (m, 2H), 7.99-7.89 (m, 2H), 7.34 (dd, J=1.8, 0.9 Hz, 1H), 6.32 (dd, J=3.2, 1.8 Hz, 1H), 6.16-6.10 (m, 1H), 5.89-5.74 (m, 1H), 5.54 (dd, J=5.5, 2.3 Hz, 1H), 5.09-4.95 (m, 2H), 4.58-4.49 (m, 2H), 4.49-4.41 (m, 2H), 4.39-4.34 (m, 1H), 4.30 (ddd, J=12.2, 6.0, 3.3 Hz, 1H), 4.21 (ddd, J=12.2, 6.7, 3.2 Hz, 1H), 4.06 (ddd, J=11.3, 6.0, 3.2 Hz, 1H), 3.89 (ddd, J=11.3, 6.7, 3.3 Hz, 1H), 2.51-2.43 (m, 2H), 2.43-2.30 (m, 4H), 2.26 (q, J=7.5 Hz, 2H), 1.08 (t, J=7.6 Hz, 3H). $^{13}C\{^1H\}$ NMR (101 MHz, $CDCl_3$) δ: 174.4, 173.0, 165.7, 154.2, 149.4, 142.1, 141.6, 140.0 (q, $J_{CF}$=38.1 Hz), 136.6, 131.1, 128.2, 121.0 (q, $J_{CF}$=269.8 Hz), 120.5, 115.8, 110.4, 107.2, 102.2, 97.7, 67.7, 63.1, 62.7, 62.2, 33.5, 33.2, 28.9, 27.5, 27.3, 9.1. HRMS (FD, m/z): calcd for $[C_{30}H_{31}N_2O_9F_3]^+$ $(M)^+$, 620.1976; found 620.1966.

Synthesis of Reference Small Molecules

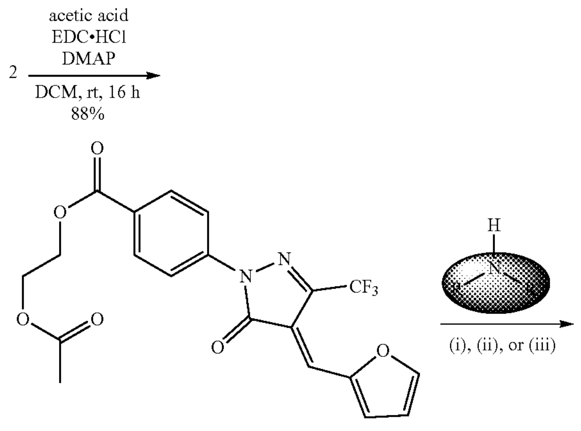

Ref-1

-continued

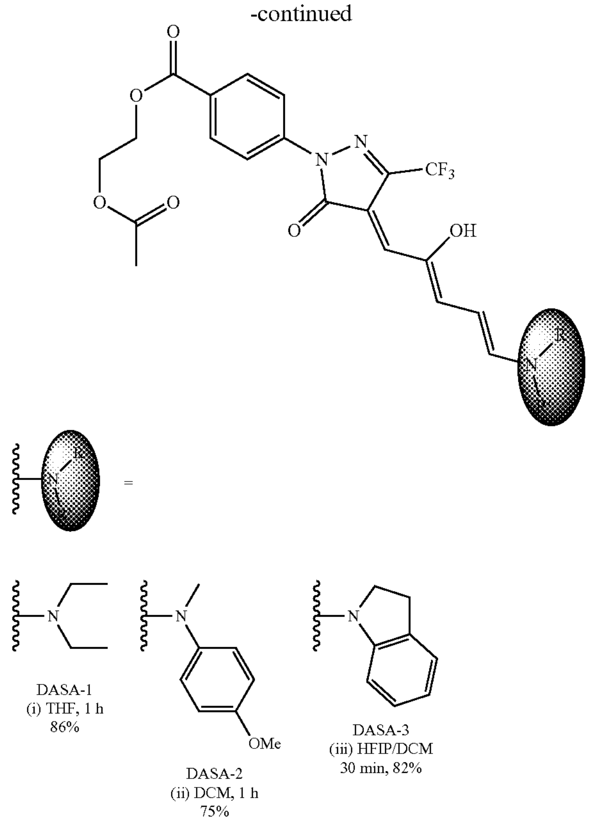

2-acetoxyethyl 4-(4-(furan-2-ylmethylene)-5-oxo-3-(trifluoromethyl)-4,5-dihydro-1H-pyrazol-1-yl)benzoate (Ref-1). A round bottom flask was charged with 2 (41.3 mg, 0.105 mmol), glacial acetic acid (8 μL, 0.140 mmol), EDC·HCl (23.6 mg, 0.123 mmol), 4-dimethylaminopyridine (1.0 mg, 0.0082 mmol), and dry DCM (4 mL). The reaction was stirred at room temperature for 16.5 h, then diluted with DCM and washed with 1 M HCl (3×), and then brine. The organic fraction was dried over $Na_2SO_4$, filtered, and concentrated under reduced pressure. The crude product was eluted through a plug of silica gel with 50:50 EtOAc/hexanes to provide the title compound as an orange solid (40.1 mg, 88%). TLC (50% EtOAC/hexanes): $R_f$=0.73. $^1H$ NMR (400 MHz, $CD·Cl_3$) δ: 8.92 (d, J=3.8 Hz, 1H), 8.13 (s, 4H), 7.91 (dd, J=1.6, 0.6 Hz, 1H), 7.71 (s, 1H), 6.83 (ddd, J=3.9, 1.7, 0.8 Hz, 1H), 4.57-4.49 (m, 2H), 4.46-4.39 (m, 2H), 2.11 (s, 3H). $^{13}C\{^1H\}$ NMR (101 MHz, $CDCl_3$) δ: 171.1, 165.9, 161.6, 151.3, 150.8, 141.8, 141.0 (q, $J_{CF}$=38.4 Hz) 132.1, 130.9, 128.6, 126.8, 119.8 (q, $J_{CF}$=272.7 Hz) 118.6, 116.0, 115.4, 62.9, 62.3, 21.0. HRMS (FD, m/z): calcd for $[C_{20}H_{15}N_2O_6F_3]^+$ $(M)^+$, 436.0877; found 436.0883.

2-acetoxyethyl 4-((E)-4-((2Z,4E)-5-(diethylamino)-2-hydroxypenta-2,4-dien-1-ylidene)-5-oxo-3-(trifluoromethyl)-4,5-dihydro-1H-pyrazol-1-yl)benzoate (DASA-1). A round bottom flask was charged with Ref-1 (50.3 mg, 0.115 mmol), diethylamine (12.5 μL, 0.121 mmol), and THF (0.4 mL). The reaction was capped under an atmosphere of air and stirred at room temperature. After 1 h, the reaction mixture was concentrated under reduced pressure and eluted through a short plug of silica gel first with 50% EtOAc/hexanes (10 mL), followed by acetone (7 mL). The acetone fraction was collected and concentrated under reduced pressure to provide the title compound as a dark purple solid (54.4 mg, 93%). Spectral characterization is consistent with similar previously reported DASA photoswitches. $^1$H NMR (400 MHz, $CDCl_3$) δ: 12.94 (s, 1H), 8.20-8.11 (m, 2H), 8.12-8.01 (m, 2H), 7.34 (d, J=12.1 Hz, 1H), 6.76 (d, J=12.6 Hz, 1H), 6.34 (s, 1H), 6.24 (t, J=12.3 Hz, 1H), 4.58-4.47 (m, 2H), 4.47-4.36 (m, 3H), 3.56 (q, J=7.6 Hz, 2H), 3.50 (q, J=7.3 Hz, 2H), 2.10 (s, 3H), 1.34 (t, J=7.3 Hz, 3H), 1.33 (t, J=7.3 Hz, 3H). HRMS (FD, m/z): calcd for $[C_{24}H_{26}N_3O_6F_3]^+$ $(M)^+$, 509.1768; found 509.1778.

2-acetoxyethyl 4-((E)-4-((2Z,4E)-2-hydroxy-5-((4-methoxyphenyl)(methyl)amino)penta-2,4-dien-1-ylidene)-5-oxo-3-(trifluoromethyl)-4,5-dihydro-1H-pyrazol-1-yl) benzoate (DASA-2). A round bottom flask was charged with Ref-1 (32.9 mg, 0.0754 mmol), 4-methoxy-N-methylaniline (11.9 mg, 0.0867 mmol), and DCM (1 mL). The reaction was capped under an atmosphere of air and stirred at room temperature. After 1 h, $Et_2O$ (3 mL) was added to precipitate the product, which was collected by filtration to provide the title compound as a dark blue solid (32.6 mg, 75%). Spectral characterization is consistent with similar DASA photoswitches reported by Hemmer, J. R. et al. in Tunable Visible and Near Infrared Photoswitches. J. Am. Chem. Soc. 138, 13960-13966 (2016), the disclosure of which are incorporated herein by reference. $^1$H NMR (400 MHz, $CDCl_3$) δ: 12.90 (s, 1H), 8.17-8.05 (m, 4H), 7.57-7.49 (m, 1H), 7.16 (d, J=8.5 Hz, 2H), 6.96 (d, J=8.5 Hz, 2H), 6.75 (d, J=12.2 Hz, 1H), 6.55 (s, 1H), 6.36 (t, J=12.3 Hz, 1H), 4.55-4.48 (m, 2H), 4.45-4.38 (m, 2H), 3.85 (s, 3H), 3.57 (s, 3H), 2.10 (s, 3H). HRMS (FD, m/z): calcd for $[C_{28}H_{26}N_3O_7F_3]^+$ $(M)^+$, 573.1717; found 573.1719.

2-acetoxyethyl 4-((E)-4-((2Z,4E)-2-hydroxy-5-(indolin-1-yl)penta-2,4-dien-1-ylidene)-5-oxo-3-(trifluoromethyl)-4,5-dihydro-1H-pyrazol-1-yl)benzoate (DASA-3). A round bottom flask was charged with Ref-1 (28.1 mg, 0.0644 mmol), indoline (8 μL, 0.0678 mmol), HFIP (0.16 mL) and DCM (0.64 mL). The reaction was capped under an atmosphere of air and stirred at room temperature. After 30 min, $Et_2O$ (8 mL) was added to precipitate the product, which was collected by filtration to provide the title compound as a black solid (29.2 mg, 82%). $^1$H NMR (400 MHz, $CDCl_3$) δ: 8.20-8.04 (m, 4H), 7.78 (d, J=12.4 Hz, 1H), 7.45 (s, 1H), 7.29 (d, J=8.0 Hz, 1H), 7.14 (t, J=7.5 Hz, 1H), 7.08 (d, J=8.1 Hz, 1H), 6.77 (d, J=12.3 Hz, 1H), 6.56 (s, 1H), 6.34 (t, J=12.3 Hz, 1H), 4.56-4.49 (m, 2H), 4.46-4.39 (m, 2H), 4.20 (t, J=8.0 Hz, 2H), 3.34 (t, J=7.9 Hz, 2H), 2.11 (s, 3H). HRMS (FD, m/z): calcd for $[C_{28}H_{24}N_3O_6F_3]^+$ $(M)^+$, 555.1612; found 555.1620.

Preparation of Polydimethylsiloxane (PDMS) Materials. PDMS materials covalently incorporating the hetero-Diels-Alder adducts (2.5 wt %) were prepared following previously reported procedures using the two-part Sylgard® 184 elastomer kit (Dow Corning) (see, for example, Robb, M. J. et al. Regioisomer-Specific Mechanochromism of Naphthopyran in Polymeric Materials. J. Am. Chem. Soc. 138, 12328-12331 (2016), the disclosures of which is incorporated herein by reference).

Procedure for preparation of PDMS-1 films. A 20 mL scintillation vial was charged with (±)-5a (53.0 mg) and 0.2 mL xylene. Sylgard® 184 prepolymer base (2.01 g) was added, and the contents were thoroughly mixed in a vortex mixer to form a homogeneous, colorless dispersion. Sylgard® 184 curing agent (0.206 g) was added and the contents were mixed thoroughly using a vortex mixer. The mixture was pipetted onto a clean 5 cm×5 cm delrin plate, which was placed inside a vacuum chamber and evacuated under high vacuum (~30 mTorr) for 3 h. The delrin plate was then transferred to an oven and the film was cured at 80° C. for 3 h. After curing, the plate was removed from the oven and the PDMS film was peeled off and cut into squares and strips with a razor blade.

Procedure for preparation of PDMS-1 films. A 20 mL scintillation vial was charged with (±)-5a (53.0 mg) and 0.2 mL xylene. Sylgard® 184 prepolymer base (2.01 g) was added and the contents were thoroughly mixed in a vortex mixer to form a homogeneous, colorless dispersion. Sylgard® 184 curing agent (0.206 g) was added and the contents were mixed thoroughly using a vortex mixer. The mixture was pipetted onto a clean 5 cm×5 cm delrin plate, which was placed inside a vacuum chamber and evacuated under high vacuum (~30 mTorr) for 3 h. The delrin plate was then transferred to an oven and the film was cured at 80° C. for 3 h. After curing, the plate was removed from the oven and the PDMS film was peeled off and cut into squares and strips with a razor blade.

Ultrasonication Experiments

General Procedure for Ultrasonication Experiments. An oven-dried sonication vessel was fitted with rubber septa, placed onto the sonication probe, and allowed to cool under a stream of dry argon. The probe tip was situated 1 cm above the bottom of the sonication vessel. The vessel was charged with a solution of the polymer in anhydrous THE (5.0 mg/mL, 20 mL, 30 mM BHT) and submerged in an ice bath. The solution was sparged continuously with argon beginning 10 min prior to sonication and for the duration of the sonication experiment. Pulsed ultrasound (1 s on/2 s off, 30% amplitude, 20 kHz, 13.6 $W/cm^2$) was then applied to the system. Aliquots (1.0 mL) were removed at specified time points (sonication "on" time) and filtered through a 0.45 μm PTFE syringe filter prior to analysis by GPC and UV-vis absorption spectroscopy. In order to remove BHT for analysis by NMR spectroscopy, the sonicated solution was concentrated, the polymer was redissolved in DCM and then precipitated into stirring hexanes (4×), and the isolated material was dried under vacuum. Ultrasonic intensity was calibrated using the previously described method.

DASA Formation from PMA-1 via Ultrasound-Induced Mechanochemical Activation. For the experiments shown in FIG. 3, solutions were subjected to ultrasonication for 60 min as described above. Aliquots of the sonicated solution were concentrated under reduced pressure and the residual polymer was redissolved in an equal volume of DCM to provide a 5 mg/mL solution of polymer (40 μM). For DASA formation using diethylamine, 0.8 mL of the DCM solution was combined with 0.2 mL of HFIP and ~4 μL (40 μmol) of diethylamine to provide a final solution containing ~32 μM polymer (~12 μM activated furan, see Section VI below) and 40 mM diethylamine (3,300 equiv). For DASA formation using 4-methoxy-N-methylaniline and indoline, 0.8 mL of the DCM solution was combined with 0.2 mL of HFIP and 0.05 mL of a 6.4 mM amine solution (in DCM) to provide a final solution containing ~30 μM polymer (~12 μM activated furan, see section VI below) and ~300 μM amine (25 equiv). Reactions were allowed to proceed for approximately 10 min prior to analysis by UV-vis spectroscopy.

TABLE 1

Determined $M_n$ (kDa) and absorbance ($\lambda_{max}$ = 375 nm) values upon ultrasonication of PMA-1 and PMA-Control in THF.

| | PMA-1 | | PMA-Control | |
|---|---|---|---|---|
| Sonication Time (min) | $M_{n,t}$ (kDa) | Abs at 375 nm (a.u.) | $M_{n,t}$ (kDa) | Abs at 375 nm (a.u.) |
| 0 | 125 | 0.00509 | 154 | 0.00534 |
| 20 | 79.3 | 0.297 | 86.6 | 0.0172 |
| 40 | 61.7 | 0.447 | 64.3 | 0.0284 |
| 60 | 55.6 | 0.493 | 53.5 | 0.0403 |
| 70 | 52.4 | 0.487 | — | — |
| 80 | 48.6 | 0.463 | 46.0 | 0.0571 |

Determination of Mechanophore Activation and DASA Formation Efficiency with Ultrasonication Characterization of Activation Efficiency for the Hetero-Diels-Alder Mechanophore. Samples of Ref-1 in THE at various concentrations were prepared and UV-vis spectra were acquired to construct the calibration curve of measured Absorbances at 375 nm at various concentrations. The concentration of the activated furan species produced upon ultrasonication of PMA-1 was determined from UV-vis absorption measurements using this calibration curve. The absorbance at 375 nm corresponding to the $\lambda_{max}$ of the activated furan reached a maximum after 60 min of ultrasonication, indicating the generation of activated furan species with a concentration of ~15.4 μM. Dividing this value by the concentration of initial mechanophore (40 μM, 5 mg/mL polymer), provides a mechanophore activation efficiency of 39%. Notably, extended sonication times may cause some degradation of the activated furan, as was evidenced in these experiments by a decrease in the absorbance at 375 nm. Thus, the measured mechanophore activation efficiency was likely underestimated.

Characterization of DASA Formation Efficiency Under Dilute Ultrasonication Conditions. Samples of small molecules DASA-1, DASA-2, and DASA-3 in 4:1 DCM/HFIP at various concentrations in the general range achieved during the sonication experiments were prepared and UV-vis spectra were acquired to construct the calibration curves for the extinction coefficients calculations. Thus obtained extinction coefficients (provided in Table 2) are estimates due to the equilibrium that exists between the open, colored conjugated triene species and closed colorless isomers of the DASAs. Nevertheless, the ratio of open and closed isomers is expected to be the same as that for the samples produced in the ultrasonication experiments. Thus, the calculated extinction coefficients should report on the concentration of DASAs in the sonicated samples. The concentration of mechanically generated activated furan as calculated above for each solution was approximately 12 μM, representing the theoretical maximum concentration of each DASA. The experimentally measured absorbance values at the $\lambda_{max}$ associated with each DASA product formed after treatment of the sonicated polymer solution was then converted to DASA concentration using the extinction coefficients determined under similar conditions, and these values were divided by the theoretical maximum concentration to estimate the yield of each DASA (Table 2). Under these dilute conditions, yields were determined to be 13%, 69%, and 57% for reaction of the mechanically generated activated furan with diethylamine, 4-methoxy-N-methylaniline, and indoline, respectively. However, it should be noted here, that the lower DASA formation efficiencies determined by these experiments are likely due to the low concentration. The large excess of diethylamine in that particular case may also result in degradation, although no difference in the calibration curve was observed upon the addition of 36 mM diethylamine. In addition, these results were in contrast to those obtained for $^1$H NMR studies of the same reactions, wherein the quantitative conversion of the activated furan was demonstrated in more concentrated solutions using 5 equiv of amine.

TABLE 2

Determination of DASA concentrations in dilute conditions after 60 min ultrasonication of PMA-1 and treatment with various amines in 4:1 DCM/HFIP (concentration of activated furan ~12 μM)

| | Diethylamine (DASA-1) | 4-methoxy-N-methylaniline (DASA-2) | Indoline (DASA-3) |
|---|---|---|---|
| $\lambda_{max}$ | 525 nm | 570 nm | 609 nm |
| Abs | 0.0885 | 0.565 | 0.637 |
| ε (L mol$^{-1}$ cm$^{-1}$) | 56,100 | 68,300 | 94,100 |
| [DASA] | 1.6 μM | 8.3 μM | 6.8 μM |
| DASA Yield | 13% | 69% | 57% |

Details of the STAMMP Procedure Applied to PDMS Films

Figure 15:
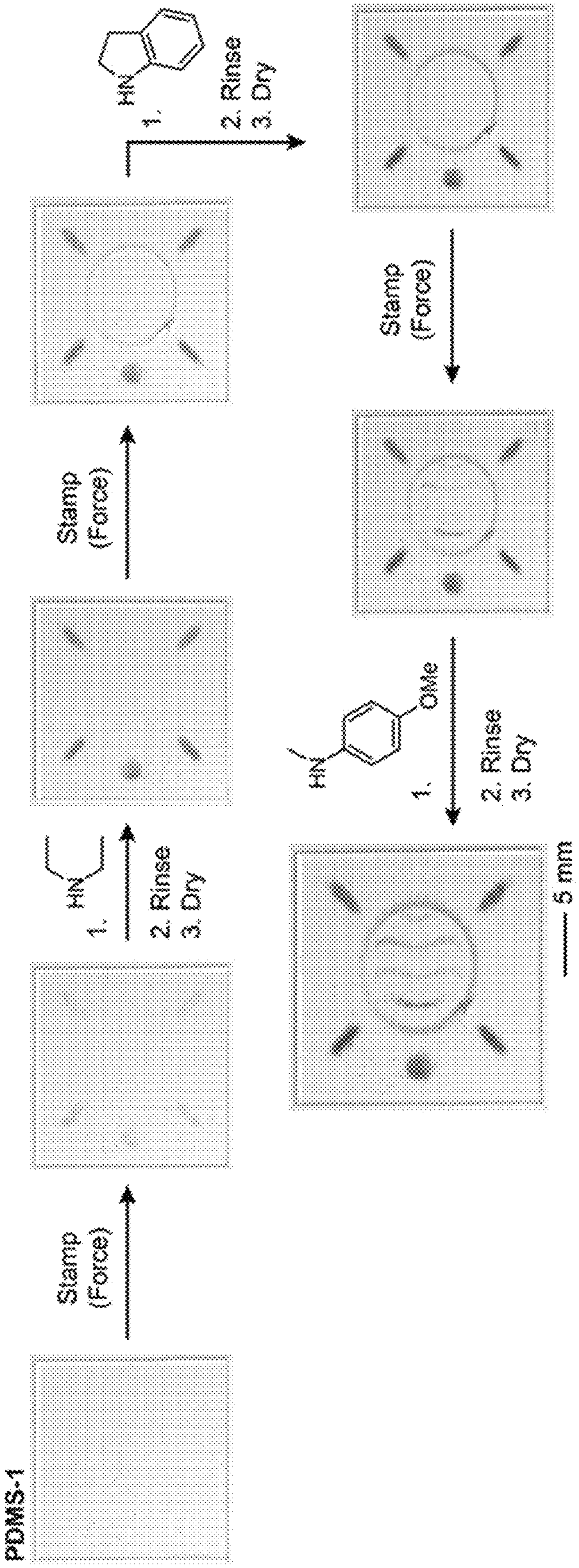
FIG. 15 illustrates, with schematics and photographs, the STAMMP process, wherein a STAMMP sequence utilizing various secondary amines (diethylamine, indoline, and 4-methoxy-N-methylaniline) was applied to a 2×2 $cm^2$ film of PDMS-1 (2.5 wt % of mechanophore crosslinker (±)-5a) to obtain a turtle image, in accordance with embodiments of the invention.

Procedure for Patterning Using Localized Compressive Force. STAMMP experiments were conducted using 2×2 cm squares, or smaller strips, of PDMS-1 and PDMS-Control. The stamps used to apply localized compression were 3D printed from poly(lactic acid) (PLA) with embossed regions in the shape of the desired patterns. A minimum amount of force was applied to visually activate the material without causing irreversible deformation or tearing of the PDMS. After compression, the films were immersed in a solution of the appropriate secondary amine for 90 s: 0.5 vol % $HNEt_2$ in DCM; 0.5 vol % indoline in DCM/HFIP; or 7 mM 4-methoxy-N-methylaniline in DCM/HFIP. HFIP was not used with diethylamine due to fuming that was observed at these higher concentrations (cf. ultrasonication experiments). For the mixtures of DCM/HFIP, solvent ratios of 4:1 and 9:1 (v/v) were used for various experiments, with no noticeable difference in performance. After reaction with the amine, the films were washed by immersing in DCM to remove residual amine and HFIP, replacing the solvent with fresh DCM several times over the course of at least 10 min. The films were then dried under high vacuum for 30 min to remove excess DCM before the next stamping step. All steps were conducted under ambient room light and atmosphere on the benchtop (stamping) or in a fume hood (washing/drying). An image of a turtle was prepared using the STAMMP process, as illustrated in FIG. 15.

Figure 16:
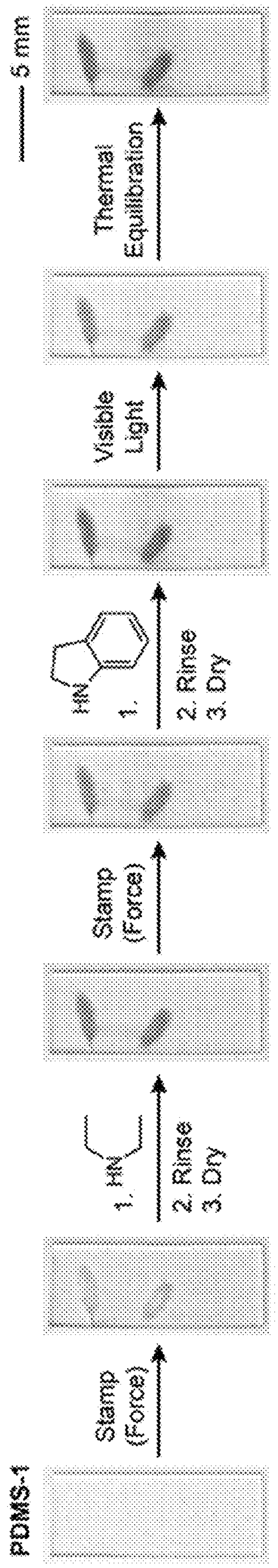
FIG. 16 illustrates, with schematics and photographs, the STAMMP process with overlapping patterns, wherein a STAMMP sequence utilizing various secondary amines (here, diethylamine and indoline) was applied to a PDMS-1 film (2.5 wt % of mechanophore crosslinker (±)-5a), in accordance with embodiments of the invention.

STAMMP Procedure with Regions of Overlapping Patterns. To investigate whether the patterns produced in the STAMMP process were stable to further application of compressive force, the STAMMP process was applied to a film with overlapping patterns as shown in FIG. 16. A first set of conjugated triene species was produced via compression using the flower petal stamp and a hydraulic press, followed by treatment of the film with diethylamine and then the standard washing/drying procedure as detailed above. Subsequently, a second set of conjugated triene species was produced with multiple manual compression cycles using the flower stem stamp, followed by treatment with indoline, ensuring partial overlap between the two conjugated triene species. Here, the second conjugated triene species pattern was intentionally made fainter so as to not completely obscure the pattern produced by the first conjugated triene species and to permit efficient photobleaching. No difference in color was observed between the portion of the first pattern that experienced further compressive force compared to the region of the pattern that was not exposed to additional compression in the second printing step. This is most clearly visible upon photoirradiation of the film with white light, which primarily causes photobleaching of the conjugated triene species derived from indoline produced in the second printing step.

Stability of the Conjugated Trienes in the Presence of Different Amines: Influence on the Order of Color Developing Steps To investigate the influence of the order of the secondary amine developing agent addition to the mechanically revealed activated furan, samples of small molecules DASA-1, DASA-2, and DASA-3 were dissolved in $CD_2Cl_2$ or 4:1 $CD_2Cl_2$/IJP at a concentration of 5 mM, the secondary amine of interest was added (5 equiv), and then $^1$H NMR spectra were acquired at various intervals starting 5 min after amine addition to determine stability of the resulting conjugated trienes. Similar to the conditions used in the STAMMP demonstrations, experiments with $HNEt_2$ were conducted in $CD_2Cl_2$, while all others were conducted in 4:1 $CD_2Cl_2$/HFIP.

Accordingly, it was found that DASA-1 is stable in the presence of 4-methoxy-N-methylanline and indoline for at least 20 min. Furthermore, DASA-2 displays limited stability in the presence of indoline, with partial degradation observed after 20 min. However, notably, secondary amine treatment is significantly more transient in the STAMMP process, which would preclude much of the undesired degradation. Next, DASA-3 is stable for more than 20 min in the presence of 4-methoxy-N-methylaniline. On the other hand, addition of $HNEt_2$ to solutions of DASA-2 and DASA-3 leads to complete conversion of the substrate, generating products with spectra consistent with the closed isomers of the conjugated trienes. Nevertheless, upon drying the mixture with DASA-3 and redissolving it in a solution of 4:1 $CD_2Cl_2$/HFIP, the open conjugated triene form was recovered, albeit with some degradation. The different reactivity of the dialkyl amine is likely due to its increased basicity, which has been observed in similar systems, as shown, for example, by Chen, T.-Y. et al. in Light- and Chemical-Stimuli-Induced Isomerization of Donor-Acceptor Stenhouse Adducts. *ChemPhotoChem* 5, 559-564 (2021), the disclosure of which is incorporated herein by reference. Based on these results, color developing using diethylamine was selected as the first step in all of the STAMMP demonstrations.

DFT Calculations (CoGEF). CoGEF calculations were performed using Spartan '18 Parallel Suite according to previously reported methods. A truncated model of the mechanophore with terminal acetoxy groups was used. Ground state energies were calculated using DFT at the B3LYP/6-31G* level of theory. Starting from the equilibrium geometry of the unconstrained molecule (energy=0 kJ/mol), the distance between the terminal methyl groups of the structure was increased by 0.05 Å increments and the energy was minimized at each step. The maximum force associated with the mechanochemical retro-[4+2] reaction was calculated from the slope of the curve immediately prior to bond cleavage.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A macromolecular mechanophore platform comprising:

a Diels-Alder adduct of a dienophile and a furan, wherein the furan comprises a furfurylidene scaffold further comprising an activating group A according to:

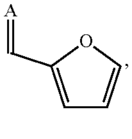

, wherein the activating group A is an electron withdrawing acceptor moiety, such that the furan is characterized by an ability to react with a secondary amine to form an adduct comprising a conjugated triene scaffold according to:

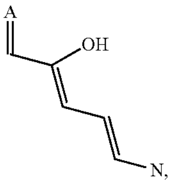

, wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile.

2. The macromolecular mechanophore platform of claim 1, wherein the dienophile is an electron-rich alkene.

3. The macromolecular mechanophore platform of claim 2, wherein the dienophile is a vinyl ether.

4. The macromolecular mechanophore platform of claim 1, wherein the activating group A comprises a moiety selected from the group consisting of: barbituric acid, Meldrum's acid, isoxazolone, pyrazolidinedione, indanedione, pyrazolone, hydroxypyridone, and any derivative thereof.

5. The macromolecular mechanophore platform of claim 4, wherein the activating group A comprises $CF_3$-pyrazolone.

6. The macromolecular mechanophore platform of claim 1, wherein the polymer comprises a polymeric network of chains.

7. The macromolecular mechanophore platform of claim 1, wherein the polymer is selected from the group consisting of: polyacrylate, including poly(methyl acrylate); polymethacrylate, including poly(methyl methacrylate); polysiloxane, including polydimethylsiloxane; polyether, including poly(ethylene glycol); polyurethane; polyacrylamide; polyamide; polyester; and any combination thereof.

8. A method for mechanochemically gating a solution coloration comprising:

providing a first solution comprising a macromolecular mechanophore platform comprising:

a Diels-Alder adduct of a dienophile and a furan, wherein the furan comprises a furfurylidene scaffold further comprising an activating group A according to:

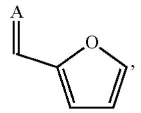

wherein the activating group A is an electron withdrawing acceptor moiety, such that the furan is characterized by an ability to react with a secondary amine to form an adduct comprising a conjugated triene scaffold according to:

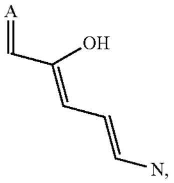

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile;

providing a developing solution comprising a secondary amine;

applying the mechanical force to the macromolecular mechanophore platform for a duration of time; and adding the developing solution to the first solution to produce a second solution characterized by a color, wherein the color is determined by the secondary amine's identity.

9. The method of claim 8, wherein applying the mechanical force is using ultrasound.

10. The method of claim 8, wherein the developing solution further comprises HFIP.

11. The method of claim 8, wherein the dienophile is an electron-rich alkene.

12. The method of claim 11, wherein the dienophile is a vinyl ether.

13. The method of claim 8, wherein the activating group A comprises a moiety selected from the group consisting of: barbituric acid, Meldrum's acid, isoxazolone, pyrazolidinedione, indanedione, pyrazolone, hydroxypyridone, and any derivative thereof.

14. The method of claim 13, wherein the activating group A comprises $CF_3$-pyrazolone.

15. A method for mechanochemical multicolor soft lithography comprising:

providing an object to be enhanced with a pattern characterized by a color, the object comprising a polymer, wherein the polymer further comprises a macromolecular mechanophore platform comprising:

a Diels-Alder adduct of a dienophile and a furan, wherein the furan comprises a furfurylidene scaffold further comprising an activating group A according to:

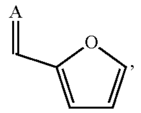

wherein the activating group A is an electron withdrawing acceptor moiety, such that the furan is characterized by an ability to react with a secondary amine to form an adduct comprising a conjugated triene scaffold according to:

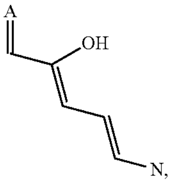

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile providing a developing solution comprising a secondary amine;

applying the mechanical force to the object in a spatially specific manner according to the pattern for a duration of time; and exposing the object to the developing solution to produce the pattern of the color throughout the object, wherein the color is determined by the secondary amine's identity.

16. The method of claim 15, wherein the pattern comprises a plurality of sub-patterns, each sub-pattern characterized by a different sub-pattern color, and wherein steps of applying the mechanical force to the object and exposing the object to the developing solution are sequentially repeated for each sub-pattern of the plurality of sub-patterns until the pattern is complete.

17. The method of claim 15, wherein the object is an elastomeric film.

18. The method of claim 15, wherein applying the mechanical force comprises deforming the polymer.

19. The method of claim 15, wherein the mechanical force is a force selected from the group consisting of: tension, compression, shearing, stretching, grinding, and any combination thereof.

20. The method of claim 15, wherein applying the mechanical force to the object in the spatially specific manner comprises utilizing a stamp comprising the pattern.

21. The method of claim 11, wherein the polymer comprises a polymeric network of chains.

22. The method of claim 17, wherein the polymer is selected from the group consisting of: polyacrylate, including poly(methyl acrylate); polymethacrylate, including poly (methyl methacrylate); polysiloxane, including polydimethylsiloxane; polyether, including poly(ethylene glycol); polyurethane; polyacrylamide; polyamide; polyester; and any combination thereof.

23. The method of claim 22, wherein the polymer is a crosslinked polydimethylsiloxane.

24. A kit for mechanochemical multicolor soft lithography comprising:

an object to be enhanced with a pattern characterized by a color, the object comprising a polymer, wherein the polymer further comprises a macromolecular mechanophore platform comprising:

a Diels-Alder adduct of a dienophile and a furan, wherein the furan comprises a furfurylidene scaffold further comprising an activating group A according to:

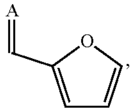

wherein the activating group A is an electron withdrawing acceptor moiety, such that the furan is characterized by an ability to react with a secondary amine to form an adduct comprising a conjugated triene scaffold according to:

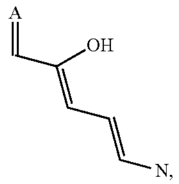

wherein the Diels-Alder adduct undergoes a formal retro-Diels-Alder reaction upon application of mechanical force to re-produce the dienophile and the furan; and wherein the Diels-Alder adduct is covalently embedded into a polymer, such that at least one chain of the polymer is covalently attached to the furan, and at least one additional chain of the polymer is covalently attached to the dienophile; and a developing solution comprising a secondary amine;

such that applying the mechanical force to the object in a spatially specific manner according to the pattern for a duration of time; and exposing the object to the developing solution affords the pattern of the color throughout the object, wherein the color is determined by the secondary amine's identity.

* * * * *